United States Patent
Shiba et al.

(10) Patent No.: US 9,263,688 B2
(45) Date of Patent: *Feb. 16, 2016

(54) PHOTOELECTRIC CONVERSION MATERIAL, METHOD FOR PRODUCING THE SAME, AND ORGANIC PHOTOVOLTAIC CELL CONTAINING THE SAME

(71) Applicant: HONDA MOTOR CO., LTD., Minato-Ku, Tokyo (JP)

(72) Inventors: Tadahiro Shiba, Wako (JP); Kazuhiro Miura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/473,125

(22) Filed: Aug. 29, 2014

(65) Prior Publication Data

US 2015/0059854 A1    Mar. 5, 2015

(30) Foreign Application Priority Data

Sep. 4, 2013 (JP) .................................. 2013-183519

(51) Int. Cl.
| H01L 31/00 | (2006.01) |
| H01L 51/42 | (2006.01) |
| C08G 61/10 | (2006.01) |
| H01L 51/00 | (2006.01) |

(52) U.S. Cl.
CPC ............ *H01L 51/4253* (2013.01); *C08G 61/10* (2013.01); *H01L 51/0035* (2013.01); *C08G 2261/312* (2013.01); *C08G 2261/46* (2013.01); *C08G 2261/91* (2013.01)

(58) Field of Classification Search
CPC ............. C08G 61/10; C08G 2261/312; H01L 51/0047; H01L 51/4253
USPC .......................................... 528/125, 373, 370
See application file for complete search history.

(56) References Cited

U.S. PATENT DOCUMENTS

| 2009/0151787 A1 | 6/2009 | Yoshikawa et al. |
| 2010/0038629 A1 | 2/2010 | Lazarev |

FOREIGN PATENT DOCUMENTS

| JP | 2007-019086 A | 1/2007 |
| JP | 2007-273939 A | 10/2007 |

(Continued)

OTHER PUBLICATIONS

Harvey et al. J. of Chem. and Eng. Data, vol. 22, No. 1, 1977, 110-113.*

*Primary Examiner* — Shane Fang

(74) *Attorney, Agent, or Firm* — Carrier Blackman & Associates, P.C.; Joseph P. Carrier; Anne G. Sabourin

(57) ABSTRACT

In a BHJ solar cell, a photoelectric conversion layer contains a condensed carbocyclic ring polymer (photoelectric conversion material). The condensed carbocyclic ring polymer is obtained by polymerizing monomers represented by the following general formulae (1) and (2) to prepare a polyphenylene and then reacting the polyphenylene. R1 to R6 in the general formula (1) independently represent a hydrogen atom or a solubilizing group, and the monomer represented by the general formula (1) exhibits a higher solubility in an organic solvent with the solubilizing group than without the solubilizing group. Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

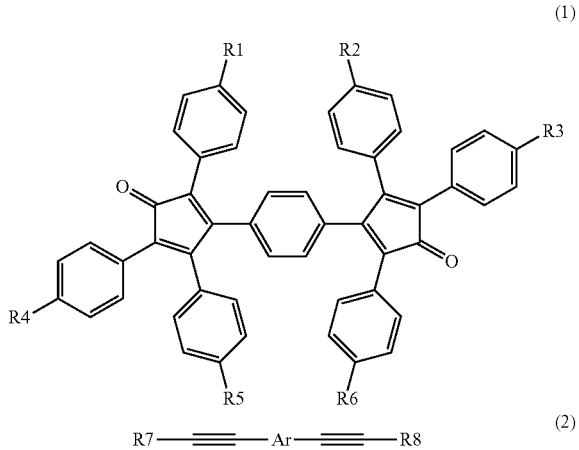

21 Claims, 14 Drawing Sheets

(56) References Cited

FOREIGN PATENT DOCUMENTS

| JP | 4005571 | B2 | 11/2007 |
| JP | 2010-056492 | A | 3/2010 |
| JP | 2010-508677 | A | 3/2010 |

* cited by examiner

FIG. 3
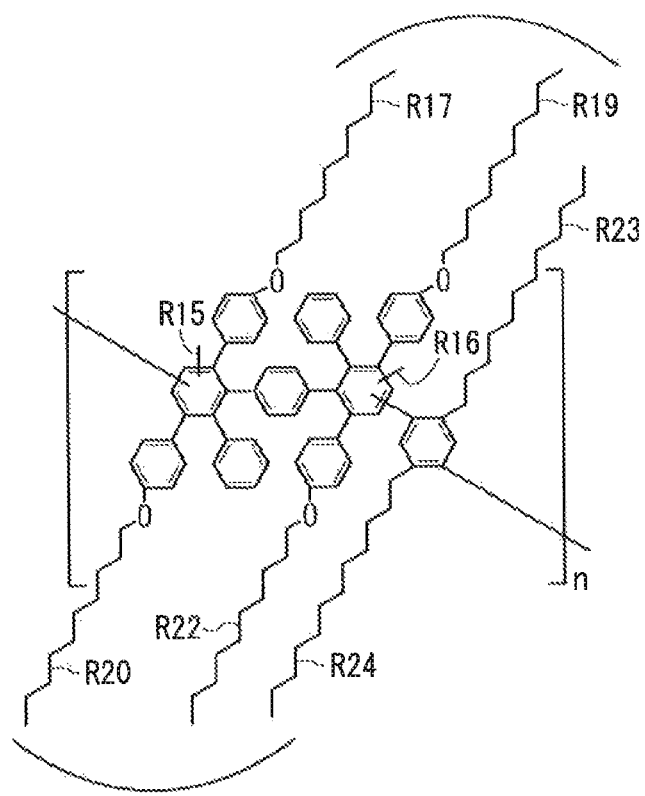
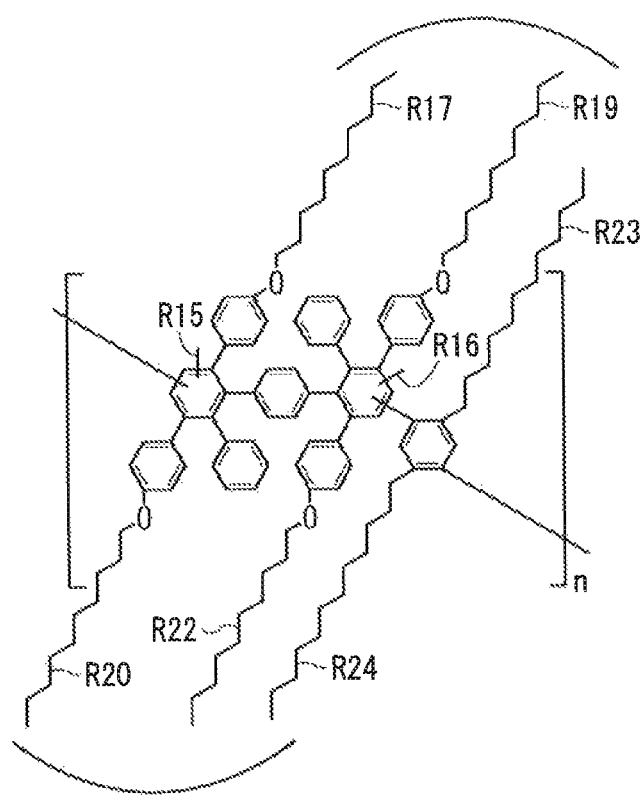

FIG. 10

| DONOR/ACCEPTOR | PHOTOELECTRIC POWER CONVERSION EFFICIENCY [%] | SHORT-CIRCUIT CURRENT DENSITY Isc [mA/cm$^2$] | OPEN CIRCUIT VOLTAGE Voc [V] | FILL FACTOR FF |
|---|---|---|---|---|
| NANOGRAPHENE POLYMER (a) /PCBM | 1.3 | 3.27 | 0.80 | 0.5 |

FIG. 14
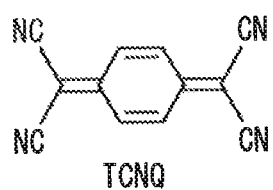
TCNQ
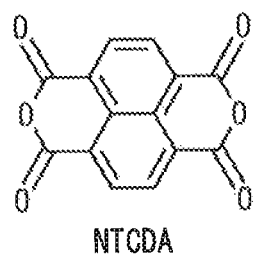
NTCDA
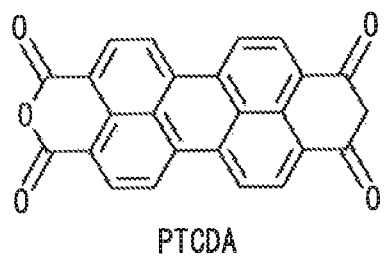
PTCDA

PHOTOELECTRIC CONVERSION MATERIAL, METHOD FOR PRODUCING THE SAME, AND ORGANIC PHOTOVOLTAIC CELL CONTAINING THE SAME

CROSS-REFERENCE TO RELATED APPLICATION

This application is based upon and claims the benefit of priority from Japanese Patent Application No. 2013-183519 filed on Sep. 4, 2013, the contents of which are incorporated herein by reference.

BACKGROUND OF THE INVENTION

1. Field of the Invention

The present invention relates to a photoelectric conversion material containing a polymer having a condensed carbocyclic ring structural unit, a method for producing the photoelectric conversion material, and an organic photovoltaic cell using the photoelectric conversion material.

2. Description of the Related Art

Organic photovoltaic cells using organic materials, which can be easily produced by a low-cost process such as a roll-to-roll process, have attracted much attention. Such organic photovoltaic cells include bulk heterojunction-type organic photovoltaic cells (hereinafter referred to also as BHJ solar cells).

The BHJ solar cell has a photoelectric conversion layer for converting a light into electricity, and the photoelectric conversion layer contains a mixture of a donor domain and an acceptor domain. The donor domain contains a photoelectric conversion material that acts as an electron donor, and the acceptor domain contains a photoelectric conversion material that acts as an electron acceptor. Specifically, the photoelectric conversion layer is interposed between positive and negative electrodes. When sunlight is introduced through the positive electrode into the photoelectric conversion layer, an exciton is generated in the layer.

The exciton reaches an interface between the donor and acceptor domains, and then is divided into an electron and a hole. The electron is transferred through the acceptor domain to the negative electrode, while the hole is transferred through the donor domain to the positive electrode. The hole and the electron are utilized to generate an electrical energy for energizing an external circuit electrically connected to the negative and positive electrodes.

Typical examples of the photoelectric conversion materials (i.e. the donor and the acceptor) used in the photoelectric conversion layer having the above function include those described in Japanese Laid-Open Patent Publication No. 2007-273939. Specifically, a donor of poly(3-hexylthiophene) (P3HT, see FIG. 11) and an acceptor of phenyl-$C_{61}$-butyric acid methyl ester (PCBM, see FIG. 12) are described as the photoelectric conversion materials in Japanese Laid-Open Patent Publication No. 2007-273939.

P3HT and PCBM have energy levels of highest occupied molecular orbital (HOMO) and lowest unoccupied molecular orbital (LUMO) shown in FIG. 13. When the light is introduced into the photoelectric conversion layer as described above, an electron is transited from the HOMO to the LUMO in the P3HT functioning as a donor. Thus, the energy level difference between the HOMO and the LUMO of P3HT corresponds to the bandgap (Eg).

Then, the electron transited to the LUMO of P3HT is transferred to the LUMO of the PCBM functioning as an acceptor, whereby the electron and the hole are generated. Thus, the energy level difference between the LUMO of P3HT and the LUMO of PCBM results in the energy loss, and the energy level difference between the HOMO of P3HT and the LUMO of PCBM corresponds to the open circuit voltage (Voc).

By increasing the photoelectric power conversion efficiency of the solar cell, the area required for achieving a desired power generation capacity can be reduced. Therefore, advantageously, the weight and the installation area of the solar cell can be reduced, so that the layout of the solar cell can be designed more freely. For the reasons, there is a demand for increasing the photoelectric power conversion efficiency of the solar cell.

The photoelectric power conversion efficiency of the organic photovoltaic cell such as the BHJ solar cell can be increased by (a) improving the absorption of a light to accelerate the exciton generation, (b) improving the absorption of a long-wavelength (near-infrared) light to increase the sunlight utilization efficiency, (c) increasing the open circuit voltage Voc, etc. As is clear from FIG. 13, in order to achieve the above (a) to (c), for example, a material having (A) a high absorbance coefficient, (B) a small energy level difference between the HOMO and LUMO (a narrow bandgap), and (C) a LUMO energy level close to that of the acceptor may be selected as the donor.

Condensed carbocyclic ring compounds (i.e. π-electron conjugated compounds) described in Japanese Patent No. 4005571 and Japanese Laid-Open Patent Publication Nos. 2010-056492, 2007-019086, and 2010-508677 (PCT) may have the above properties of (A) to (C). Such condensed carbocyclic ring compounds are sometimes referred to as graphenes (see Japanese Laid-Open Patent Publication No. 2007-019086).

SUMMARY OF THE INVENTION

In a technology described in Japanese Patent No. 4005571, a functional group is bonded to hexabenzocoronene (HBC), and the resultant molecules are self-assembled utilizing the functional groups to obtain a so-called nanotube-like aggregate. Thus, a large number of processes are required to obtain the final semiconductor product. In addition, it is unclear whether the obtained aggregate is a p-type (donor) or an n-type (acceptor).

In Japanese Laid-Open Patent Publication No. 2010-056492, it is suggested that a nanotube composed of an HBC aggregate has both of a hole-conducting path and an electron-conducting path. In a technology described in Japanese Laid-Open Patent Publication No. 2010-056492, the inner and outer surfaces of the nanotube are covered with a fullerene, and the coverage is selected to thereby control the hole mobility in HBC. It is clear from the above that the electron-donating property of HBC per se cannot be improved in the technologies of Japanese Patent No. 4005571 and Japanese Laid-Open Patent Publication No. 2010-056492.

In a technology described in Japanese Laid-Open Patent Publication No. 2007-019086, a functional group having a fluorine atom is bonded to a graphene derivative to obtain an n-type semiconductor. Thus, in this technology, a donor cannot be produced though the acceptor is obtained.

Known photoelectric conversion materials usable as the acceptor further include various low-molecular organic semiconductor materials such as quinoid- or perylene-based materials, in addition to the above PCBM. Examples of such materials include 7,7,8,8-tetracyanoquinodimethane (TCNQ), 1,4,5,8-naphthalenetetracarboxylic dianhydride (NTCDA), and perylene-3,4,9,10-tetracarboxylic dianhydride (PTCDA) shown in FIG. 14.

As described above, in order to increase the photoelectric power conversion efficiency of the photoelectric conversion material, the material having the properties of (A) to (C) has to be selected as the donor depending on the HOMO and LUMO energy levels of the acceptor. However, it is not easy to select a donor having optimum HOMO and LUMO energy levels suitable for each of various materials usable as an acceptor. Thus, even in the case of using one of the condensed carbocyclic ring compounds described in Japanese Patent No. 4005571 and Japanese Laid-Open Patent Publication Nos. 2010-056492, 2007-019086, and 2010-508677 (PCT) as the donor, it is difficult to select the combination of the donor and the acceptor having the optimum energy levels in the photoelectric conversion layer. Consequently, the photoelectric power conversion efficiency cannot be sufficiently increased in some cases.

All of Japanese Patent No. 4005571 and Japanese Laid-Open Patent Publication Nos. 2010-056492, 2007-019086, and 2010-508677 (PCT) disclose only organic low-molecular compounds. As is well known, such organic low-molecular compounds are poorly soluble in an organic solvent. Therefore, disadvantageously, it is difficult to use the roll-to-roll process or the like in order to form the photoelectric conversion layer containing the compound. Furthermore, in the case of using the organic low-molecular compound poorly soluble in the organic solvent, there is a fear that the acceptor and donor domains cannot be well mixed with each other in a process of forming the photoelectric conversion layer for the BHJ solar cell. Consequently, the electron and hole transfer cannot be accelerated in the resultant photoelectric conversion layer, and the photoelectric power conversion efficiency cannot be sufficiently increased.

A principal object of the present invention is to provide a photoelectric conversion material having an excellent property as a donor or an acceptor.

Another object of the present invention is to provide a photoelectric conversion material that can be used for forming a photoelectric conversion layer simply and accurately.

A further object of the present invention is to provide a method for producing the above-mentioned photoelectric conversion material.

A still further object of the present invention is to provide an organic photovoltaic cell having the photoelectric conversion layer containing the above-mentioned photoelectric conversion material.

According to an aspect of the present invention, there is provided a photoelectric conversion material that acts as an electron donor for donating an electron or an electron acceptor for accepting an electron. The photoelectric conversion material contains a condensed carbocyclic ring polymer obtained by a polyphenylene prepared by polymerizing monomers represented by the following general formulae (1) and (2).

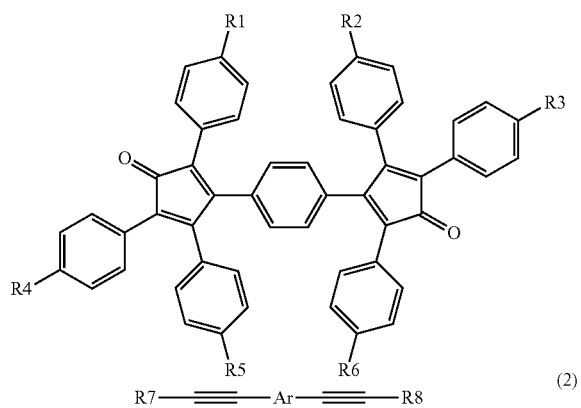

R1 to R6 in the general formula (1) independently represent a hydrogen atom or a solubilizing group, and the monomer represented by the general formula (1) exhibits a higher solubility in an organic solvent with the solubilizing group than without the solubilizing group. Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

The monomers represented by the general formulae (1) and (2) are polymerized to obtain the polyphenylene, and the obtained polyphenylene is further reacted, to generate the polymer having a condensed carbocyclic ring structure with an expanded π-conjugated system (i.e. an expanded π-electron delocalization region). The condensed carbocyclic ring polymer is hereinafter referred to also as "nanographene polymer". The "polymer" may be a low- or high-molecular compound having a repeating unit derived from the monomers, and may be an oligomer.

As described above, the nanographene polymer has the π-conjugated system in which a π-electron cloud spreads along the main chain. Therefore, the nanographene polymer can have a high absorbance coefficient and can actively generate an exciton. Furthermore, the nanographene polymer can exhibit a small energy level difference between the HOMO and the LUMO, and thus can have a narrow bandgap. In addition, the nanographene polymer can have a maximum absorption wavelength shifted to the long-wavelength side, and thereby can excellently absorb a long-wavelength (near-infrared) light. Consequently, the nanographene polymer can exhibit an improved sunlight utilization efficiency.

For the above reasons, an organic photovoltaic cell containing the nanographene polymer as the photoelectric conversion material can have an improved photoelectric power conversion efficiency.

The nanographene polymer can have a LUMO energy level lower (deeper) than those of P3HT and the like. Therefore, for example, a photoelectric conversion layer using the nanographene polymer as a donor and the PCBM as an acceptor can exhibit an energy loss lower than that of a layer using the P3HT as a donor. Consequently, the organic photovoltaic cell using the nanographene polymer as the donor in the photoelectric conversion layer can exhibit a high open circuit voltage Voc.

As described above, the monomers represented by the general formulae (1) and (2) are polymerized to thereby prepare the polyphenylene. In this step, the composition and structure of the polyphenylene can be controlled, for example, by changing the molar ratio, composition, and/or structure of the monomers to be polymerized. Thus, since the nanographene polymer is produced by further reacting the polyphenylene, the composition and structure (such as the number of the condensed carbocyclic rings in the main chain skeleton) of the nanographene polymer can be easily controlled.

In general, the number of π-electrons in the main chain skeleton of the nanographene polymer (hereinafter referred to also simply as the π-electrons) can be calculated by multiplying the number of double bonds in the condensed carbocyclic ring structure of the main chain skeleton by 2. The number of the π-electrons can be desirably controlled by controlling the composition and structure of the nanographene polymer in the above manner.

The bandgap of the nanographene polymer depends on the number of the π-electrons. Therefore, the bandgap can be desirably controlled by controlling the number of the π-electrons in the above manner. In addition, the HOMO and LUMO energy levels vary with the bandgap. Therefore, the bandgap and thus the HOMO and LUMO energy levels can be desirably controlled by controlling the number of the π-electrons.

The number of the π-electrons can be controlled, such that the nanographene polymer can have optimum HOMO and LUMO energy levels suitable for various acceptors. Thus, the nanographene polymer can be used as the donor in combination with various acceptors including the PCBM acceptor to achieve an excellent photoelectric power conversion efficiency. Meanwhile, in a case where the nanographene polymer is used as the acceptor, the nanographene polymer can have optimum HOMO and LUMO energy levels suitable for various donors. Thus, a photoelectric conversion layer having an excellent photoelectric power conversion efficiency can be easily formed by using the nanographene polymer.

It is preferred that the monomer represented by the general formula (2) should be at least one of monomers represented by the following general formulae (3) to (5).

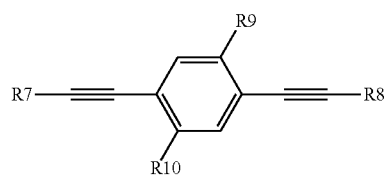

(3)

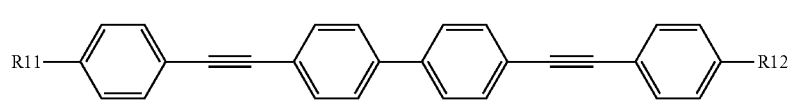

(4)

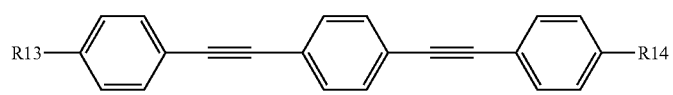

(5)

R9 to R14 in the general formulae (3) to (5) independently represent a hydrogen atom or a solubilizing group, and the monomer represented by one of the general formulae (3) to (5) exhibits a higher solubility in an organic solvent with the solubilizing group than without the solubilizing group.

In this case, the number of the condensed carbocyclic rings can be effectively increased in the graphene structure in the main chain skeleton of the resultant nanographene polymer. Consequently, the π-conjugated system can be further expanded, and the π-electron cloud can be sufficiently spread over the main chain skeleton of the nanographene polymer. The organic photovoltaic cell using the nanographene polymer as the photoelectric conversion material can exhibit a further improved photoelectric power conversion efficiency.

It is preferred that the monomer represented by the general formula (1) should have at least one solubilizing group as a side chain in R1 to R6, and the monomer represented by the general formula (2) has at least one solubilizing group as a side chain in R9 to R14. In this case, the polyphenylene prepared by polymerizing the monomers has the solubilizing groups. In the reaction of the polyphenylene for preparing the nanographene polymer, the side chains act as steric hindrances for preventing a plurality of the structural units in the polyphenylene from coming close to each other. Therefore, the reaction (formation of the condensed carbocyclic rings) in each structural unit in the polyphenylene can sufficiently proceed while the cross-linking of the structural units is prevented. Consequently, the nanographene polymer, which has the π-electron cloud sufficiently spread over the main chain skeleton, can be easily produced by the reaction.

Thus-produced nanographene polymer has the solubilizing groups. Therefore, the nanographene polymer has a higher solubility in the organic solvent. Even in a case where the molecular weight of the condensed aromatic ring structure is increased to improve the sunlight utilization efficiency, the nanographene polymer can be readily dissolved in the organic solvent. Thus, the photoelectric conversion layer can be formed simply and accurately by using a spin coating process, a roll-to-roll process, etc.

It is preferred that the number of the π-electrons in the main chain skeleton of the structural unit of the nanographene polymer should be 60 to 250. As described above, the bandgap (the HOMO and LUMO energy levels) can be desirably controlled by controlling the number of the π-electrons and the π-conjugated system area. When the number of the π-electrons is 60 or more, the π-conjugated system can be sufficiently expanded, and the nanographene polymer can have an excellent photoelectric power conversion efficiency.

As the number of the π-electrons is increased, the molecular weight of the condensed carbocyclic ring structure is increased. When the number of the π-electrons is 250 or less, the nanographene polymer can be readily dissolved in the organic solvent or the like. Thus, when the number of the π-electrons is within the above range in the nanographene polymer, the photoelectric conversion layer can be formed simply and accurately with an excellent photoelectric power conversion efficiency.

Preferred examples of the polyphenylenes include those having at least one structural unit selected from moieties represented by the following general formulae (6) to (11).

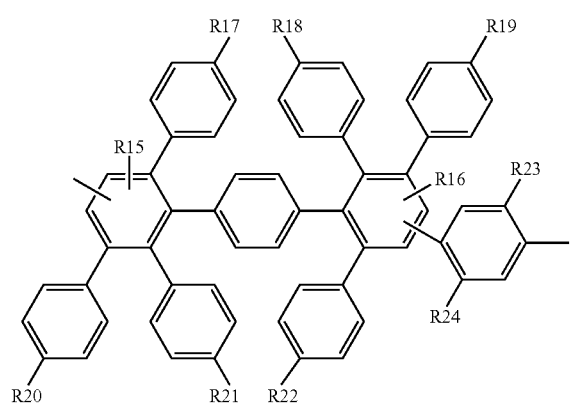
(6)
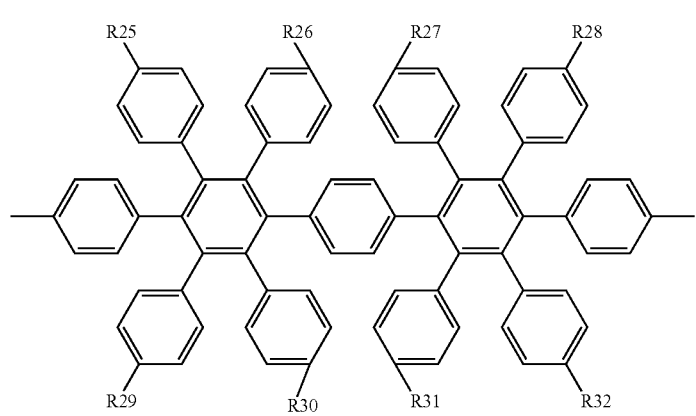
(7)
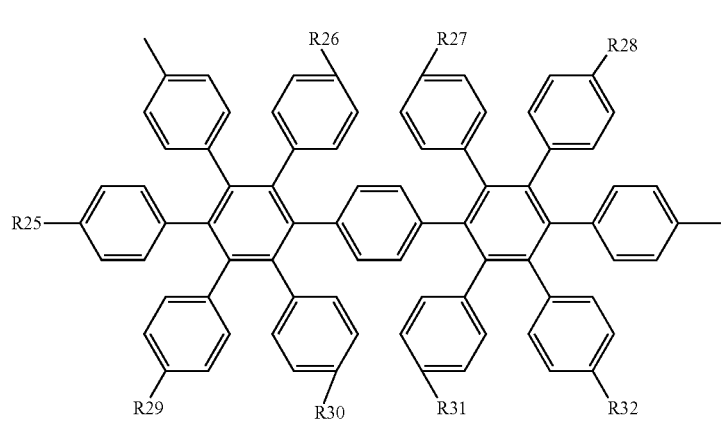
(8)
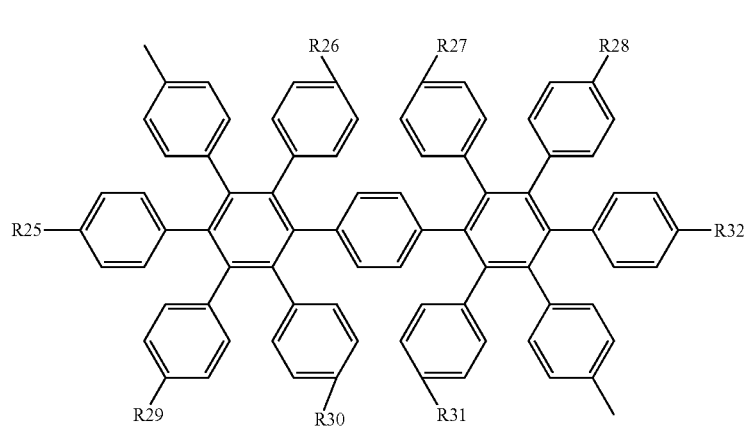
(9)

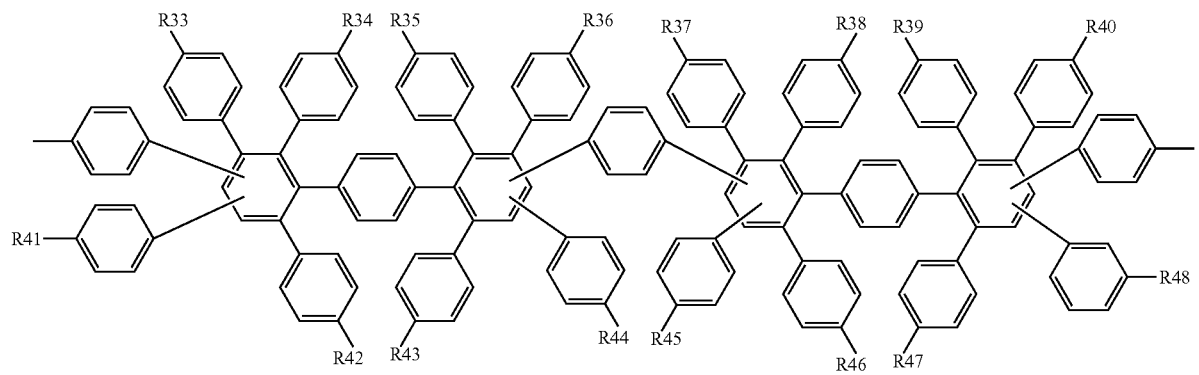

(10)

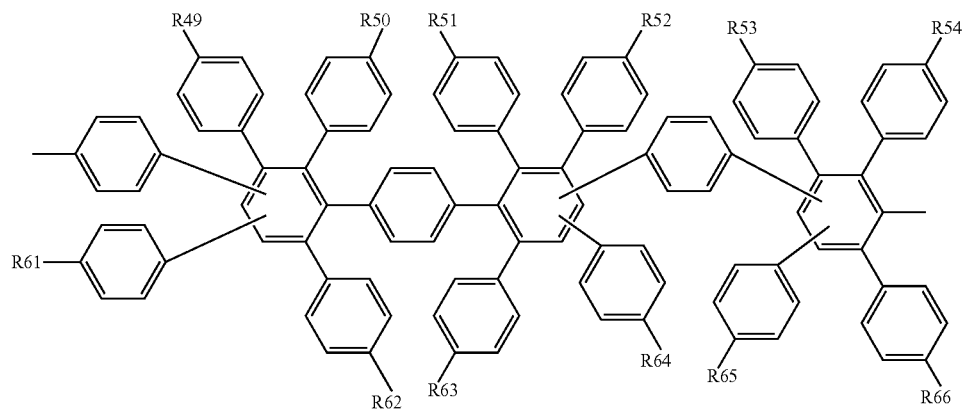

(11)

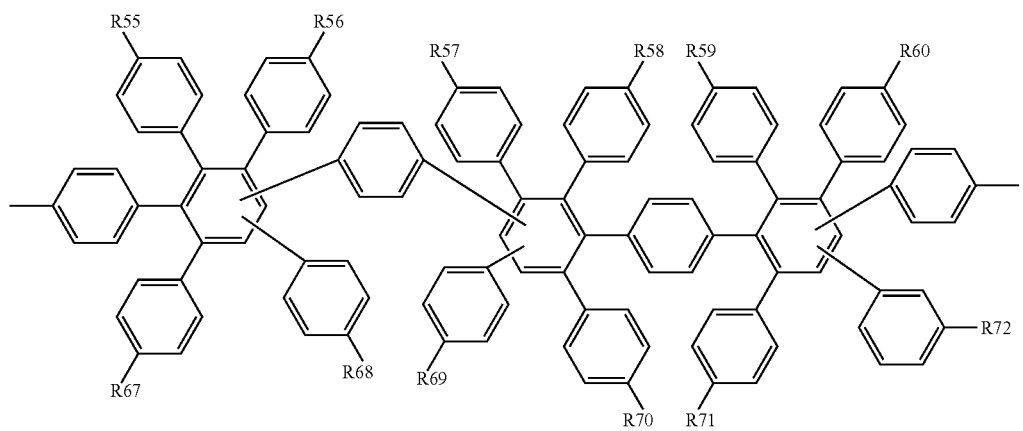

R15 to R72 in the general formulae (6) to (11) independently represent a hydrogen atom or a solubilizing group, and the moiety represented by the general formulae (6) to (11) exhibits a higher solubility in an organic solvent with the solubilizing group than without the solubilizing group.

The moiety represented by the general formula (10) includes various isomers. Examples of the isomers include moieties represented by the following general formulae (12) to (14).

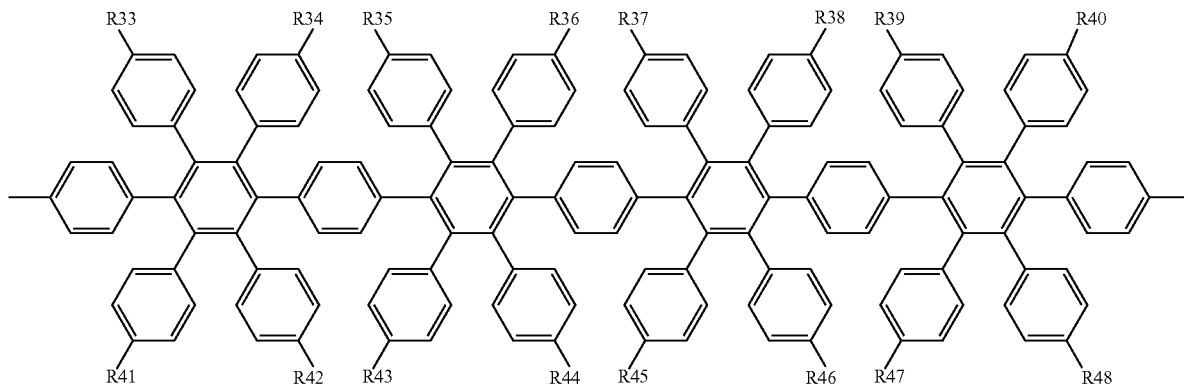

(12)

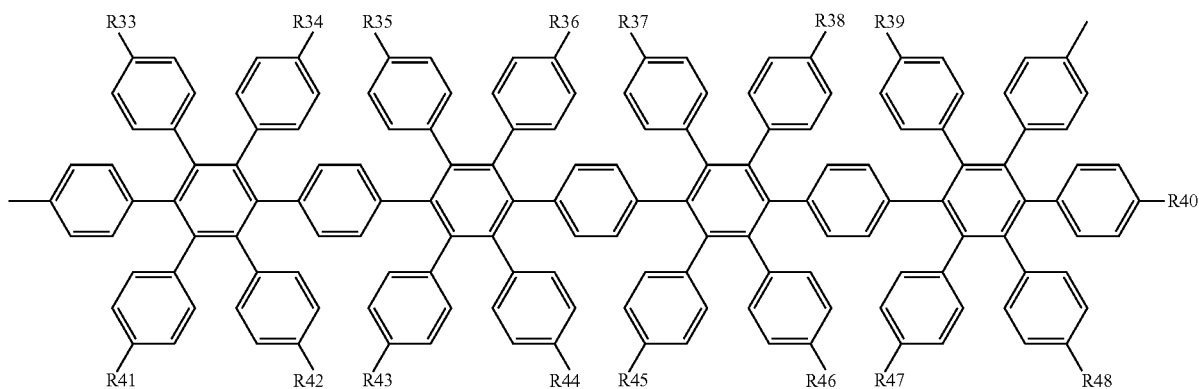

(13)

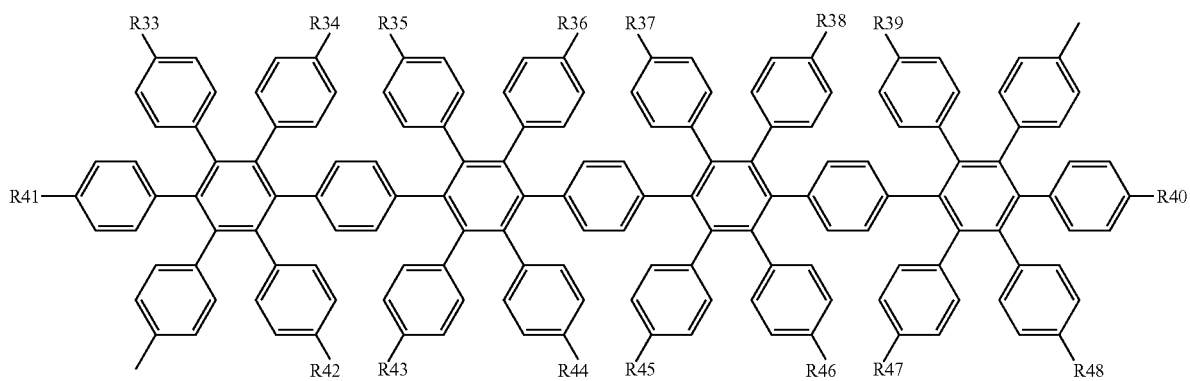

(14)

R33 to R48 in the general formulae (12) to (14) independently represent a hydrogen atom or a solubilizing group, and the moiety represented by the general formulae (12) to (14) exhibits a higher solubility in an organic solvent with the solubilizing group than without the solubilizing group.

Similarly, the moiety represented by the general formula (11) includes various isomers. Examples of the isomers include moieties represented by the following general formulae (15) to (17).

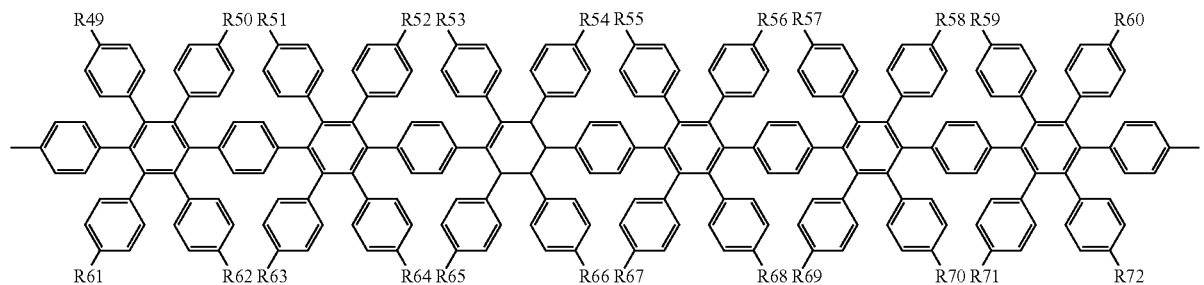

(15)

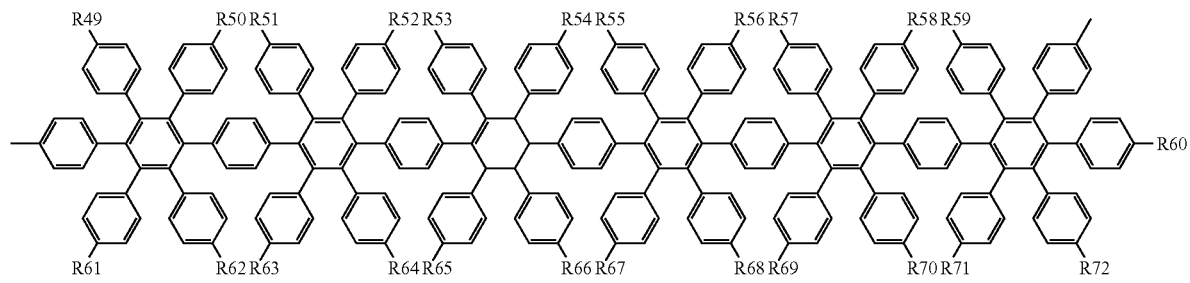

(16)

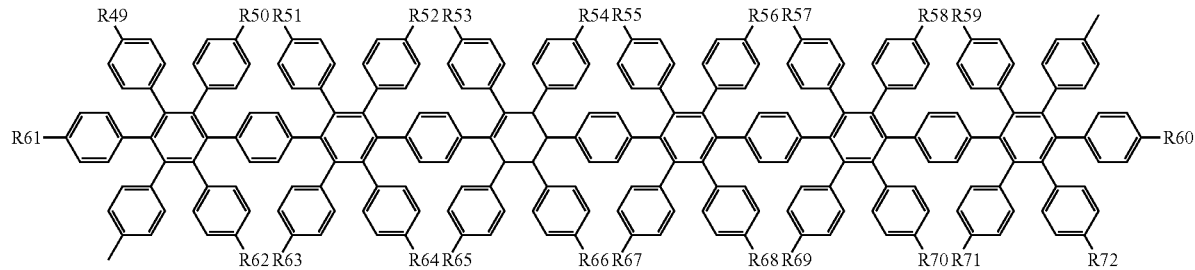

(17)

R49 to R72 in the general formulae (15) to (17) independently represent a hydrogen atom or a solubilizing group, and the moiety represented by one of the general formulae (15) to (17) exhibits a higher solubility in an organic solvent with the solubilizing group than without the solubilizing group.

The polyphenylene having such a structural unit can be easily prepared by controlling the molar ratio, composition, structure, or the like of each monomer.

The nanographene polymer prepared by the reaction of the polyphenylene may have at least one structural unit selected from graphenes represented by the following general formulae (18) to (31).

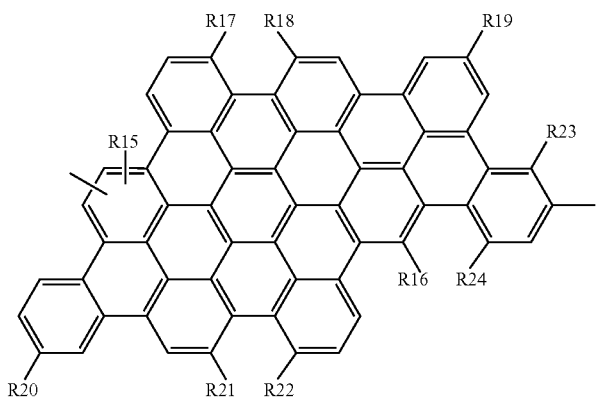

(18)

-continued
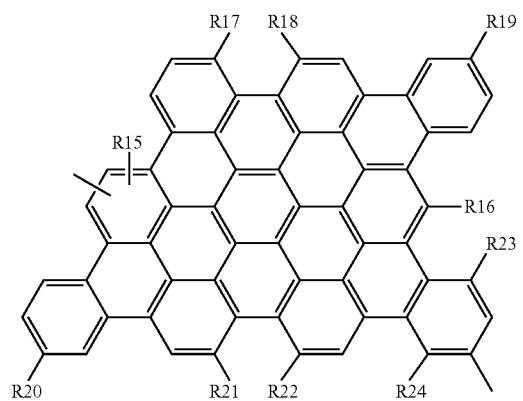
(19)
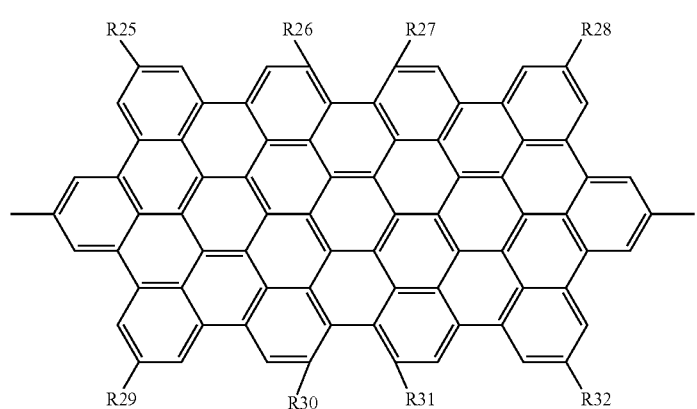
(20)
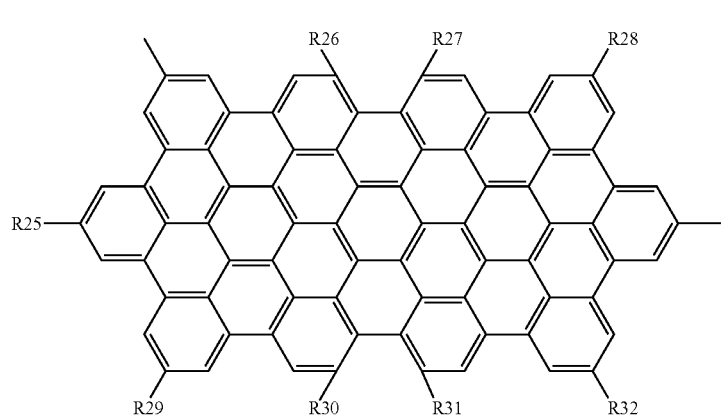
(21)
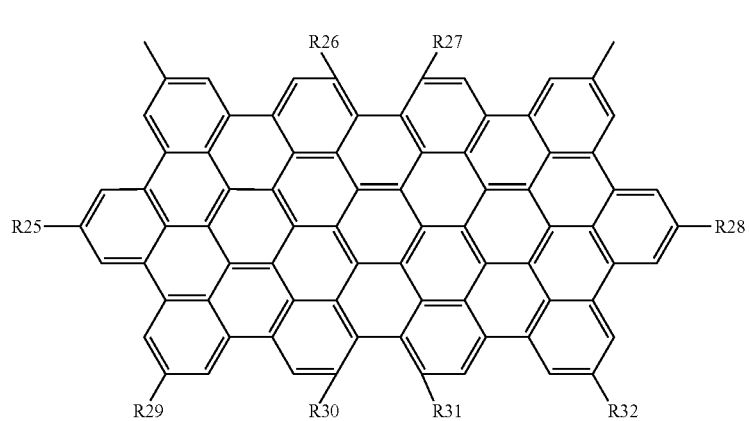
(22)

(23)
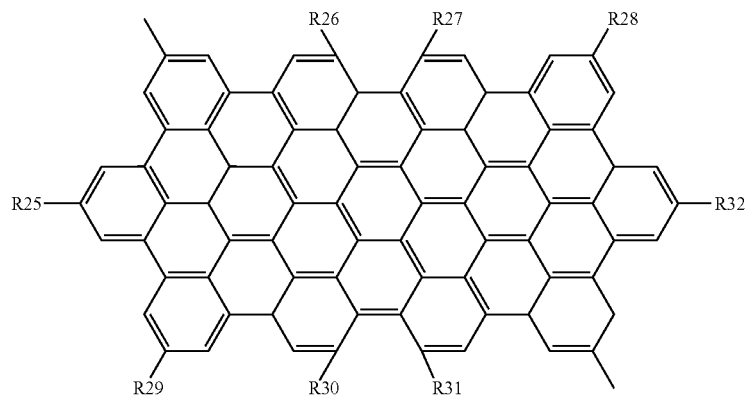
(24)
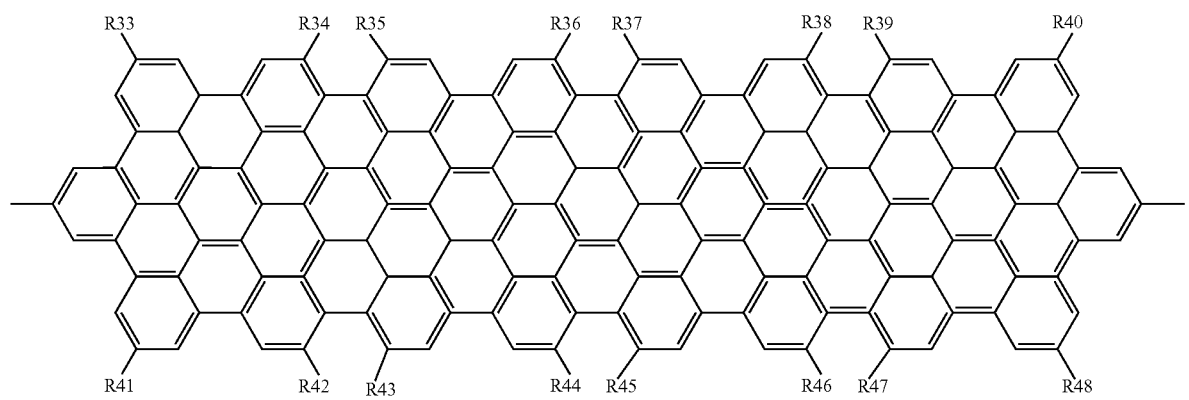
(25)
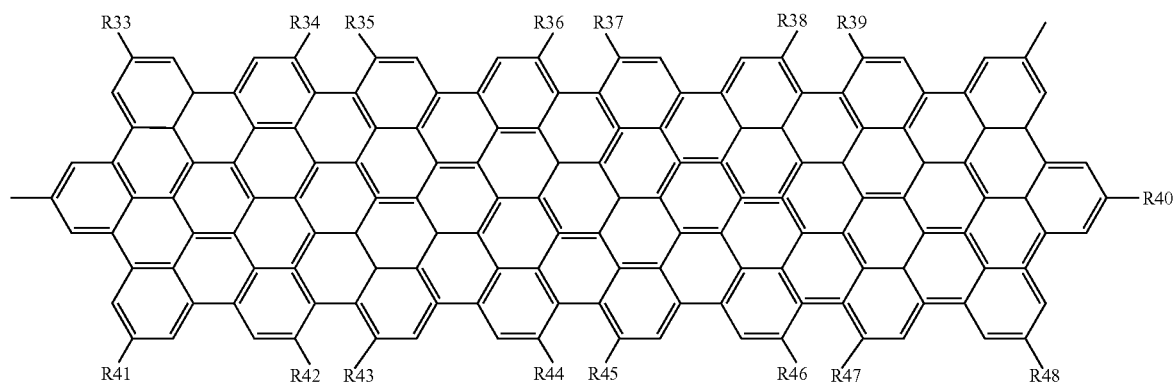
(26)
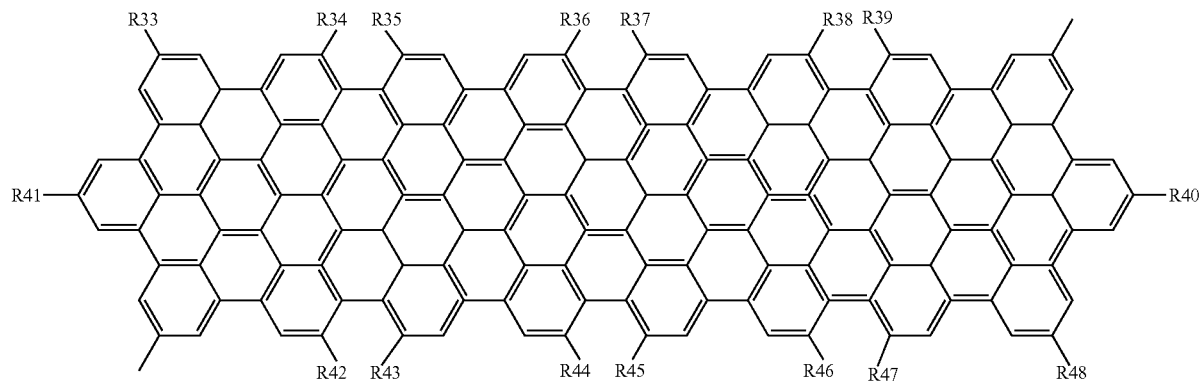

(27)
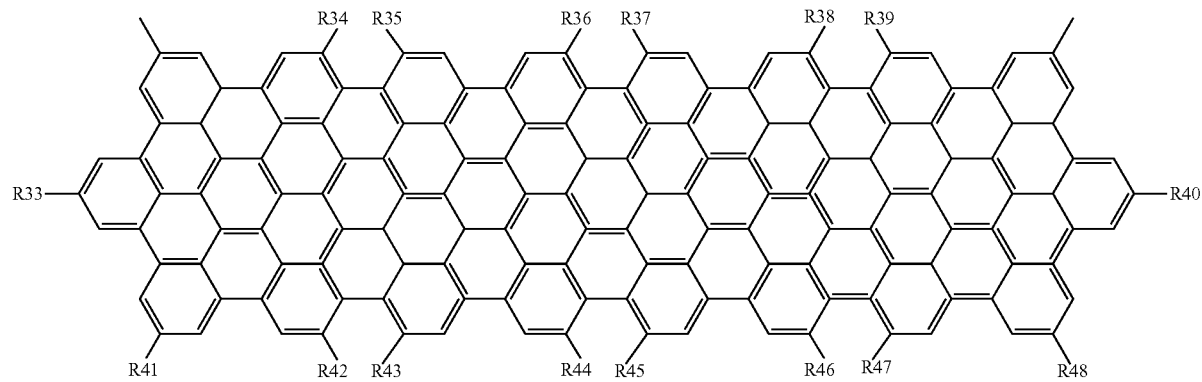
(28)
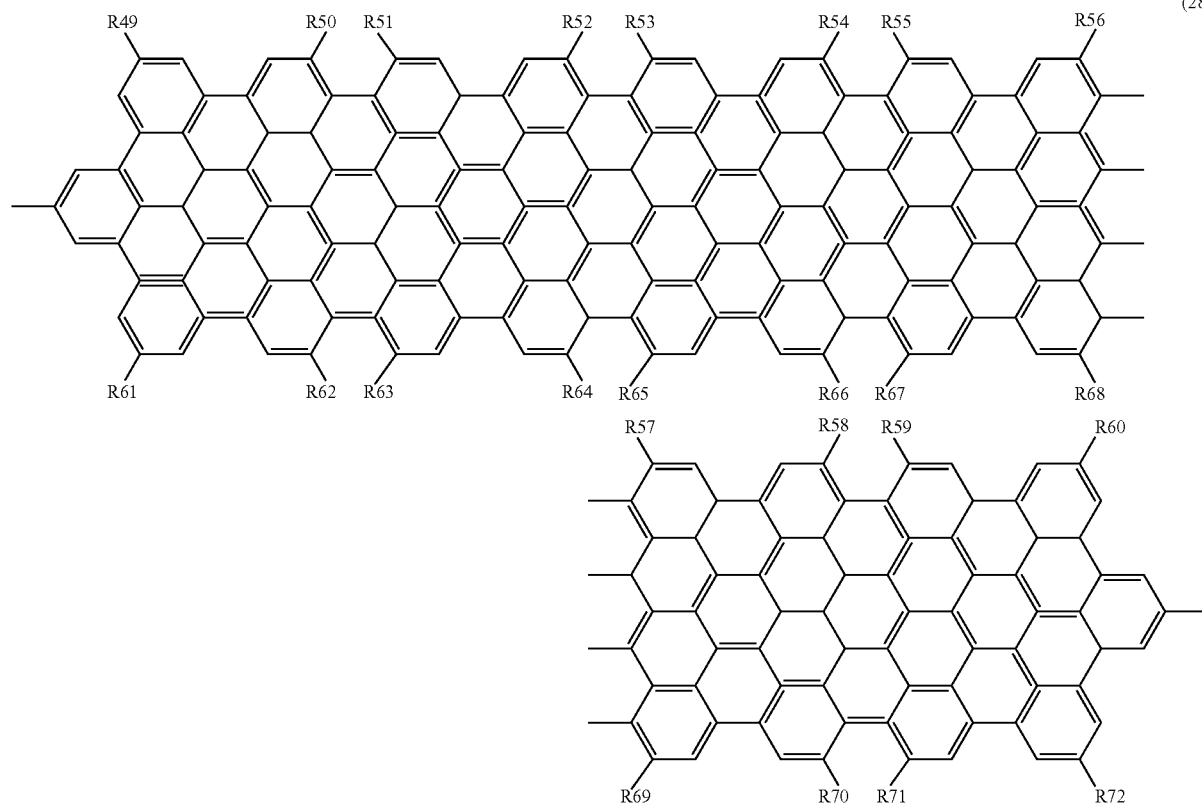
(29)
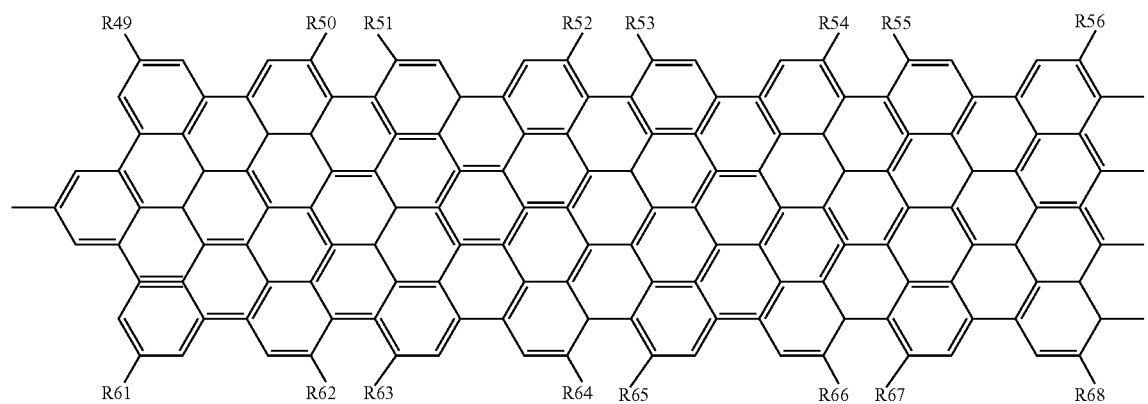

-continued
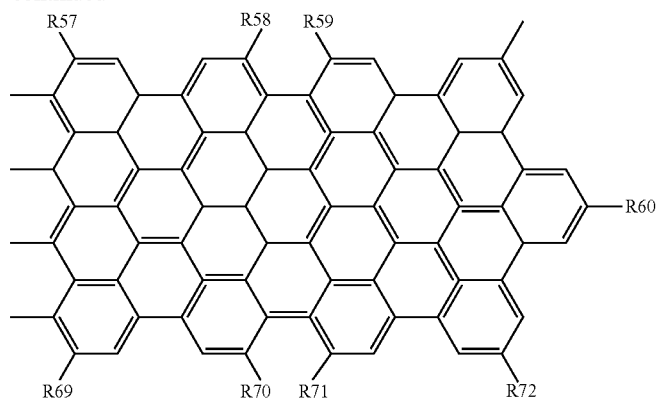
(30)
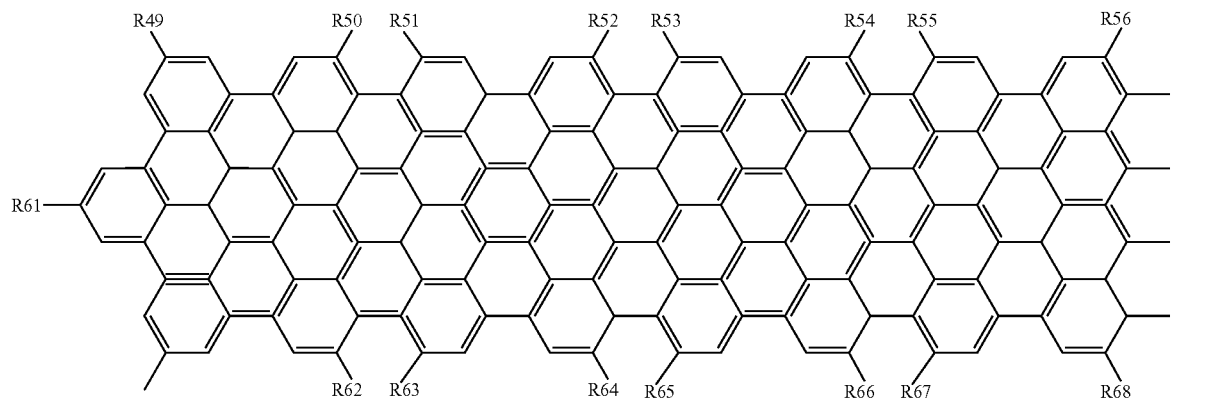
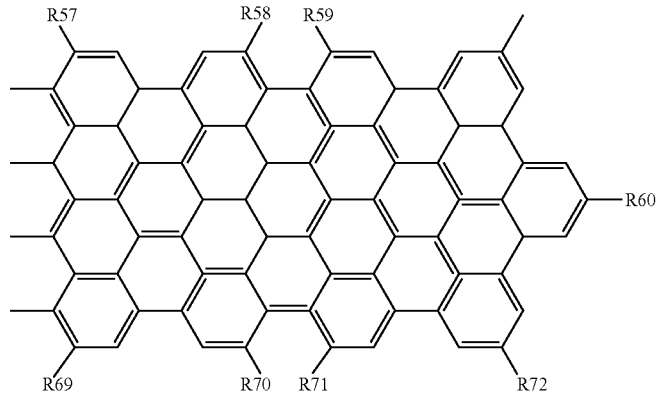
(31)
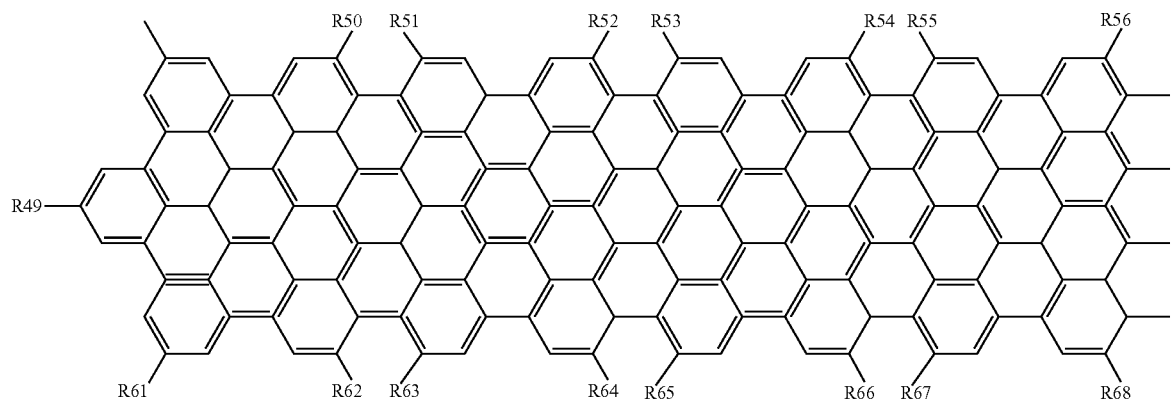

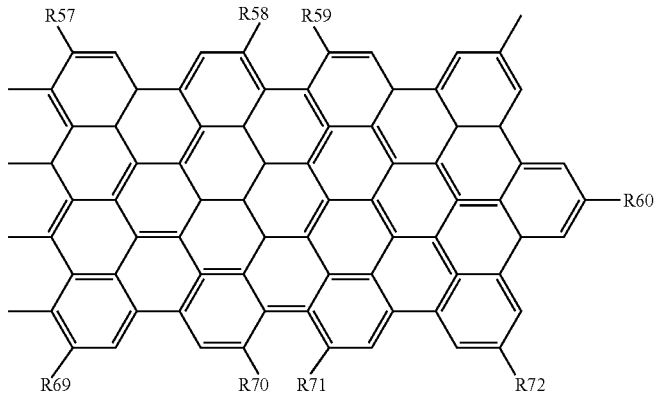

R15 to R72 in the general formulae (18) to (31) independently represent a hydrogen atom or a solubilizing group, and the graphene represented by the general formulae (18) to (31) exhibits a higher solubility in an organic solvent with the solubilizing group than without the solubilizing group.

In the nanographene polymer, the graphene structure in the main chain skeleton is effectively increased, and the π-conjugated system is desirably expanded. Thus, the π-electron cloud is sufficiently spread over the entire main chain skeleton. The photoelectric power conversion efficiency of the organic photovoltaic cell can be more effectively improved by using the nanographene polymer as the photoelectric conversion material.

In the present invention, nanometer-scale graphenes such as the structural units represented by the general formulae (18) to (31) are referred to also as "nanographene".

It is preferred that each of the monomers, the polyphenylene, and the nanographene polymer should have at least one of straight chain alkyl groups, branched alkyl groups, straight chain alkoxy groups, and branched alkoxy groups as the solubilizing group in the side chain. Thus, the monomer represented by the general formula (1) preferably has the solubilizing group in at least one of R1 to R6, and the monomers represented by the general formulae (3) to (5) preferably have the solubilizing group respectively in at least one of R9 to R14.

The polyphenylene prepared by polymerizing such monomers has also the solubilizing group. More specifically, the moieties represented by the general formulae (6) to (17) have the solubilizing group respectively in at least one of R15 to R72. Also the nanographene polymer prepared by reacting the polyphenylene having the moiety in the structural unit has the solubilizing group. More specifically, the nanographenes represented by the general formulae (18) to (31) have the solubilizing group respectively in at least one of R15 to R72.

By polymerizing the monomers that have no solubilizing groups as the side chains, an unsubstituted polyphenylene may be prepared. Thereafter, the solubilizing group can be introduced to the unsubstituted polyphenylene.

In a case where the polyphenylene has the solubilizing group as the side chain, the solubilizing group acts as the steric hindrance as described above. Consequently, the nanographene polymer, which has the π-electron cloud sufficiently spread over the main chain skeleton, can be easily produced.

The thus-produced nanographene polymer has the solubilizing group as the side chain. Therefore, the nanographene polymer can exhibit an increased solubility in the organic solvent. Particularly, in a case where the nanographene polymer has an alkoxy group, further preferably a branched alkoxy group, as the solubilizing group in the side chain, the solubility of the nanographene polymer can be further increased.

When the solubilizing group is one of the straight chain alkyl groups, branched alkyl groups, straight chain alkoxy groups, and branched alkoxy groups, it is preferred that the solubilizing group should have 3 to 20 carbon atoms. In this case, the nanographene polymer can be efficiently produced, which can exhibit an excellent power conversion efficiency as the photoelectric conversion material. Furthermore, the nanographene polymer can be readily dissolved in the organic solvent, and therefore can be easily formed into a film.

It is preferred that the nanographene polymer should have a polymerization degree (the number of the structural units) of 2 to 150. When the polymerization degree is 2 or more, the absorbance coefficient can be sufficiently increased, and the bandgap can be sufficiently narrowed. On the other hand, when the polymerization degree is 150 or less, the time required for the polymerization can be shortened, and the production efficiency of the nanographene polymer can be improved. Thus, when the polymerization degree is within the above range, the nanographene polymer can be efficiently produced with an excellent photoelectric conversion material property.

According to another aspect of the present invention, there is provided a method for producing a photoelectric conversion material that acts as an electron donor for donating an electron or an electron acceptor for accepting an electron. The method contains the steps of polymerizing monomers represented by the following general formulae (1) and (2) to prepare a polyphenylene and reacting the polyphenylene to prepare a condensed carbocyclic ring polymer as the photoelectric conversion material.

(1)

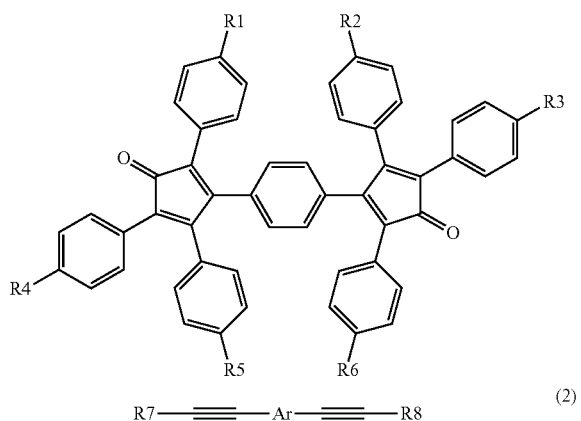

(2)

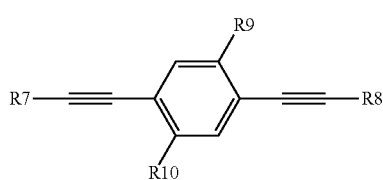

R1 to R6 in the general formula (1) independently represent a hydrogen atom or a solubilizing group, and the monomer represented by the general formula (1) exhibits a higher solubility in an organic solvent with the solubilizing group than without the solubilizing group. Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

The method is capable of easily and accurately producing the nanographene polymer with a sufficiently expanded π-conjugated system and an excellent function as the photoelectric conversion material (the donor or the acceptor). An organic photovoltaic cell using the nanographene polymer as the photoelectric conversion material can have an effectively improved photoelectric power conversion efficiency.

In the preparation of the polyphenylene, it is preferred that the monomer represented by the general formula (2) should be at least one of monomers represented by the following general formulae (3) to (5).

R9 to R14 in the general formulae (3) to (5) independently represent a hydrogen atom or a solubilizing group, and the monomer represented by the general formulae (3) to (5) exhibits a higher solubility in an organic solvent with the solubilizing group than without the solubilizing group.

In the case of using the monomer in the preparation of the polyphenylene, the graphene structure can be effectively increased in the main chain skeleton of the resultant nanographene polymer. Thus, the π-conjugated system can be desirably expanded, and the π-electron cloud can be sufficiently spread over the entire main chain skeleton of the nanographene polymer.

In the preparation of the nanographene polymer, it is preferred that the number of π-electrons in the main chain skeleton of the structural unit of the nanographene polymer should be controlled at 60 to 250. The number of the π-electrons can be controlled, for example, by changing the molar ratio, composition, or structure of the monomers to be polymerized. When the number of the π-electrons is 60 or more, the π-conjugated system can be sufficiently expanded, so that the nanographene polymer can be obtained as the photoelectric conversion material with excellent absorbance coefficient, bandgap, and maximum absorption wavelength. On the other hand, when the number of the π-electrons is 250 or less, the nanographene polymer can have such a molecular weight that the nanographene polymer can be readily dissolved in the organic solvent or the like.

It is preferred that the polyphenylene prepared by polymerizing the above monomers should have at least one structural unit selected from moieties represented by the following general formulae (6) to (11).

(3)

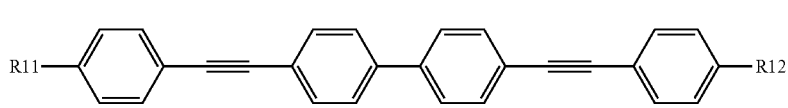

(4)

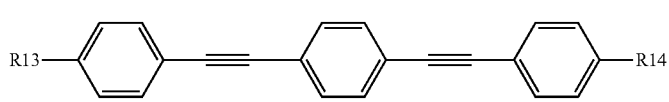

(5)

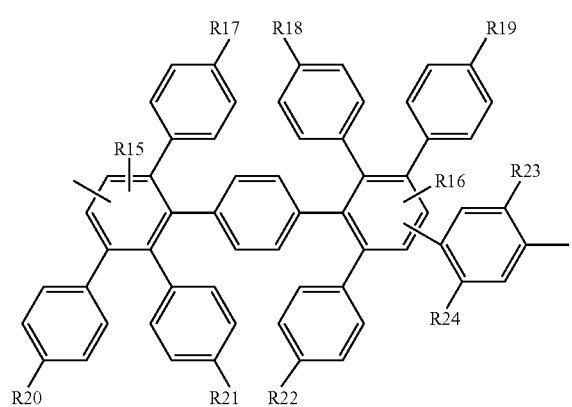
(6)
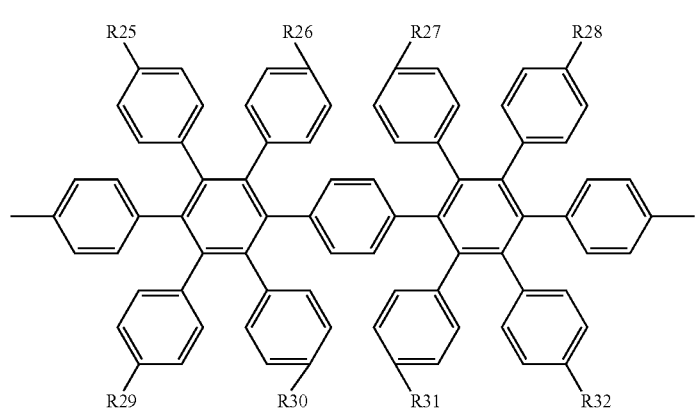
(7)
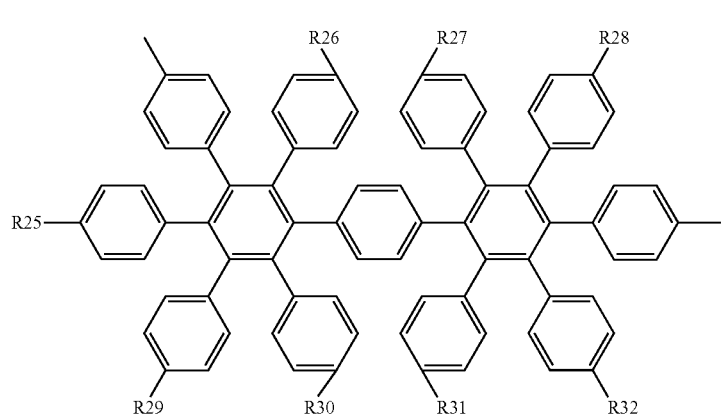
(8)
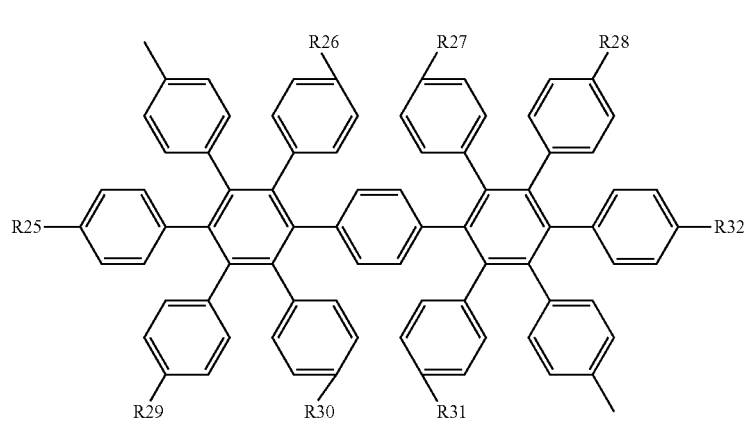
(9)

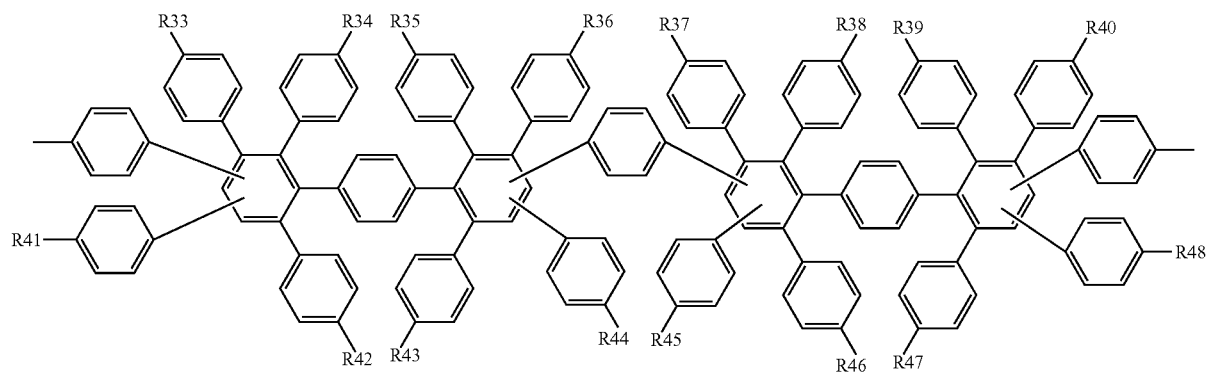

(10)

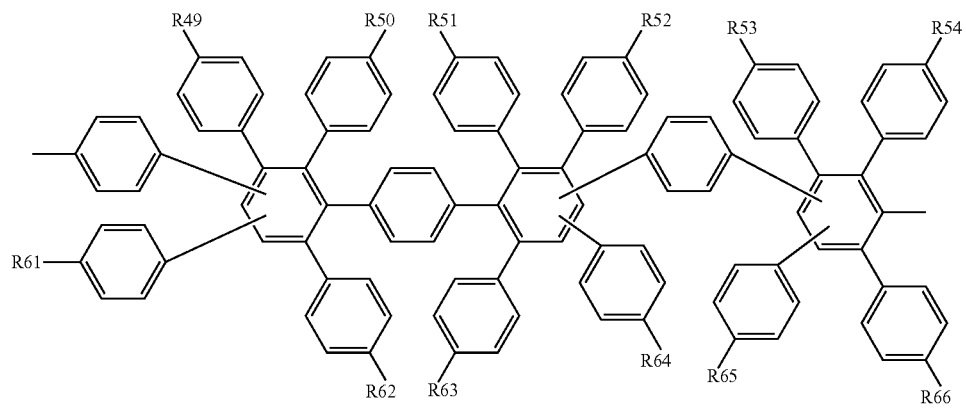

(11)

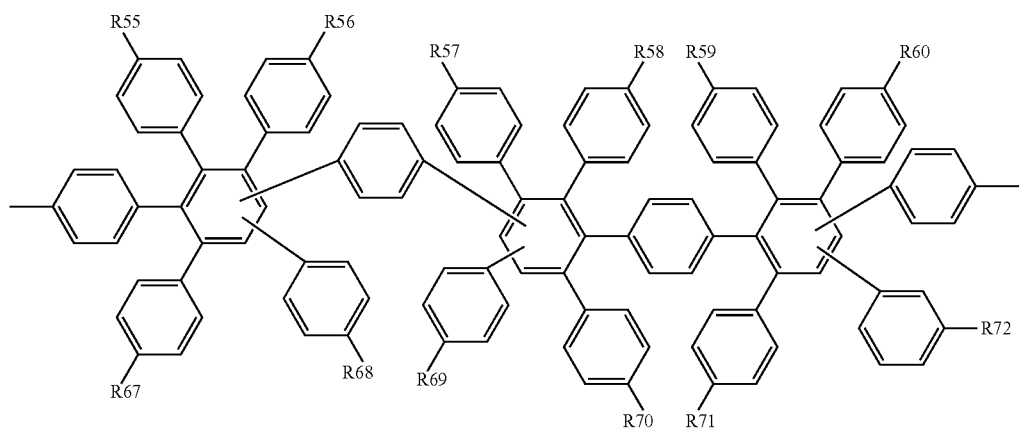

R15 to R72 in the general formulae (6) to (11) independently represent a hydrogen atom or a solubilizing group, and the moiety represented by the general formulae (6) to (11) exhibits a higher solubility in an organic solvent with the solubilizing group than without the solubilizing group.

Examples of the moieties represented by the general formula (10) include those represented by the following general formulae (12) to (14). The moieties of the general formulae (12) to (14) are isomers.

(12)

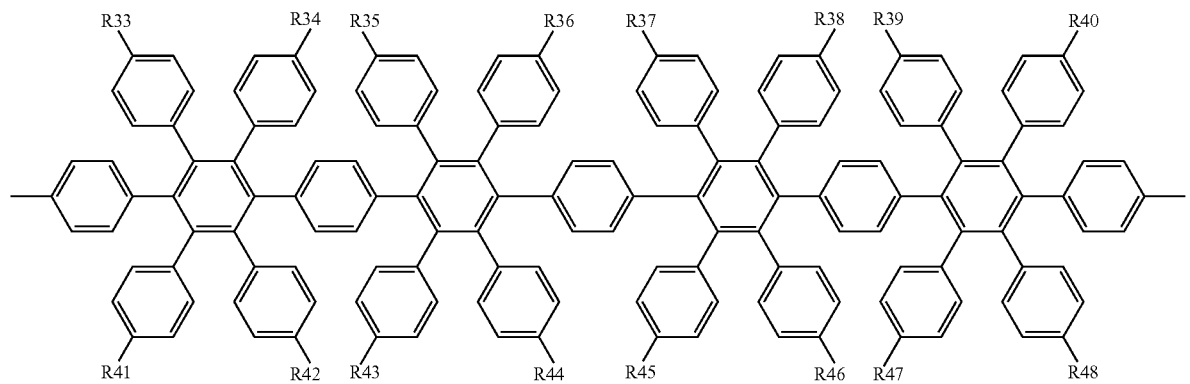

(13)

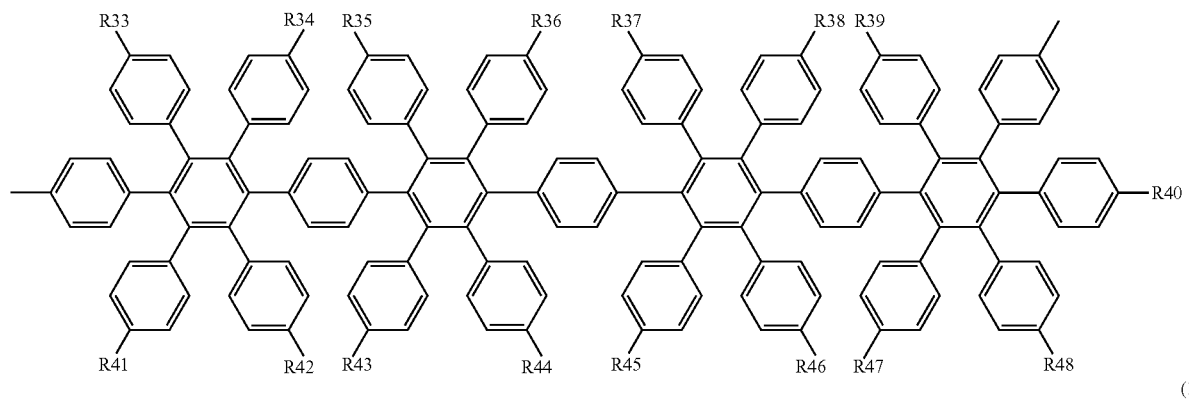

(14)

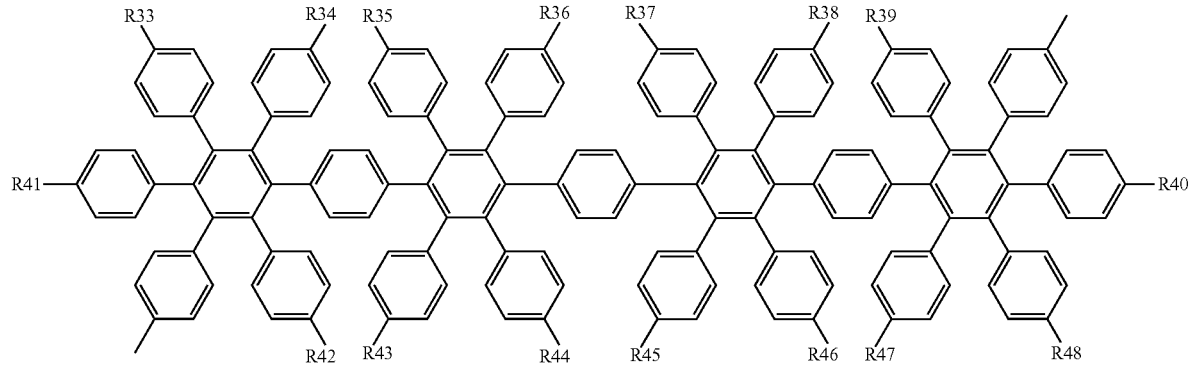

R33 to R48 in the general formulae (12) to (14) independently represent a hydrogen atom or a solubilizing group, and the moiety represented by the general formulae (12) to (14) exhibits a higher solubility in an organic solvent with the solubilizing group than without the solubilizing group.

Examples of the moieties represented by the general formula (11) include those represented by the following general formulae (15) to (17). The moieties of the general formulae (15) to (17) are isomers.

(15)

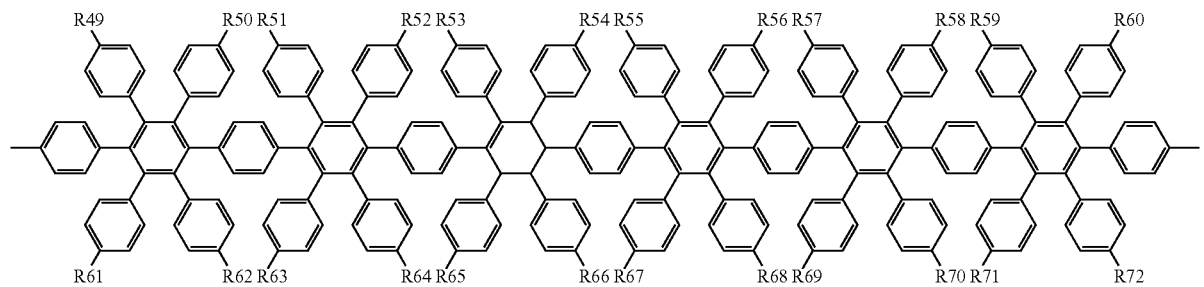

(16)

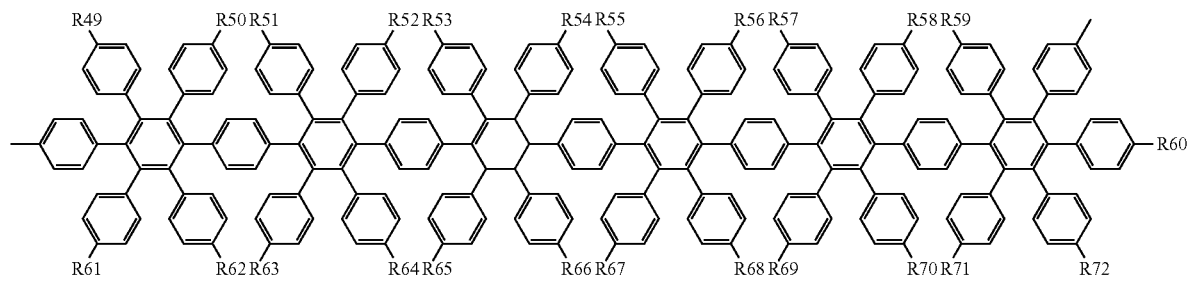

(17)

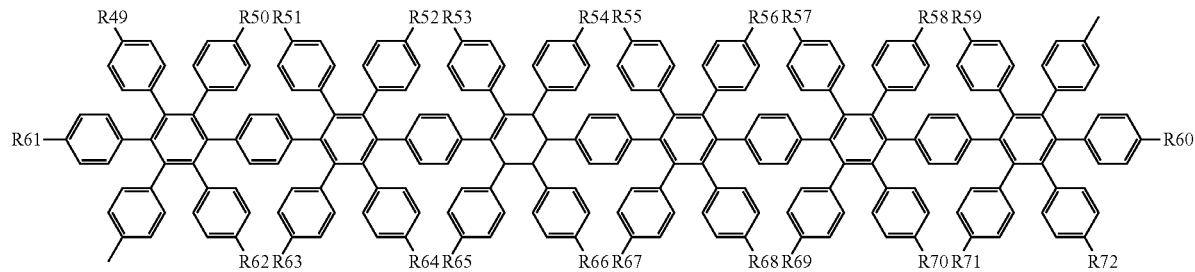

R49 to R72 in the general formulae (15) to (17) independently represent a hydrogen atom or a solubilizing group, and the moiety represented by the general formulae (15) to (17) exhibits a higher solubility in an organic solvent with the solubilizing group than without the solubilizing group.

It is preferred that the nanographene polymer prepared by the reaction of the polyphenylene should have at least one structural unit selected from graphenes represented by the following general formulae (18) to (31).

(18)

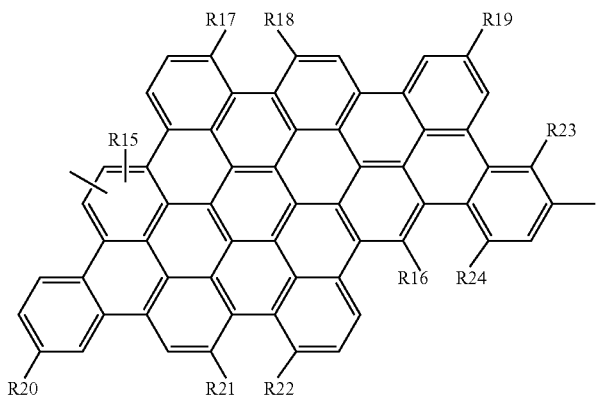

(19)

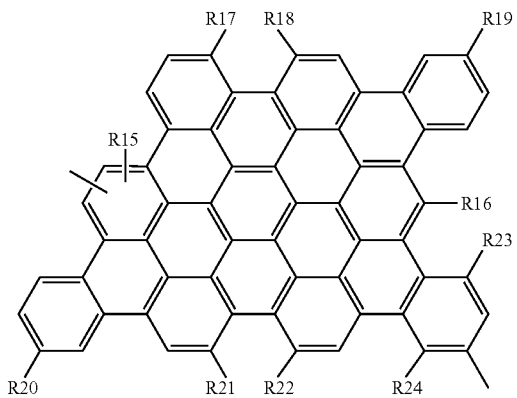

-continued
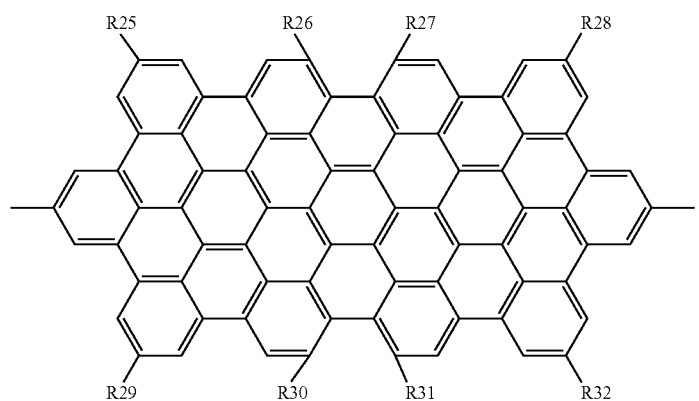
(20)
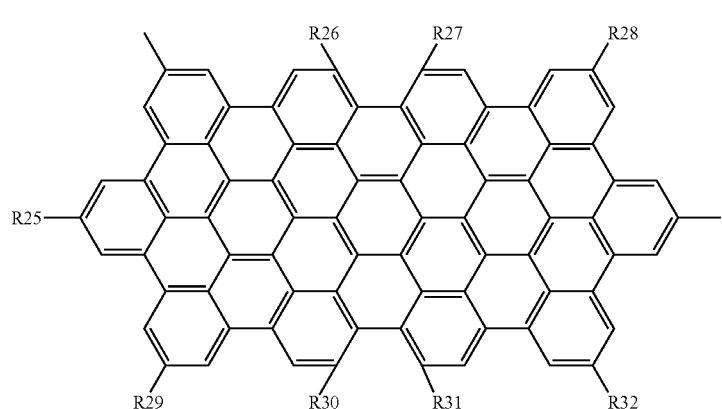
(21)
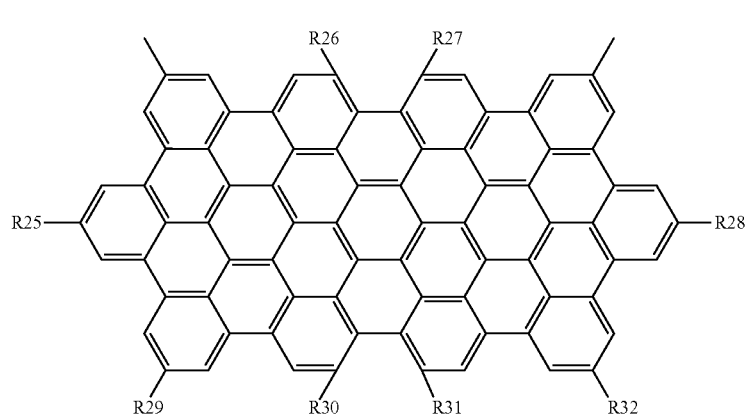
(22)
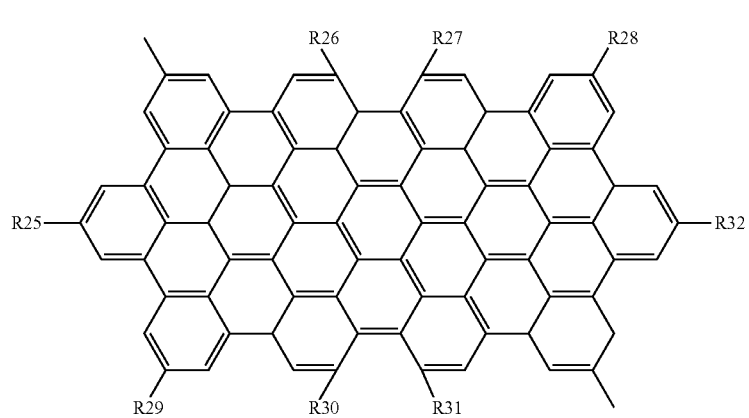
(23)

-continued
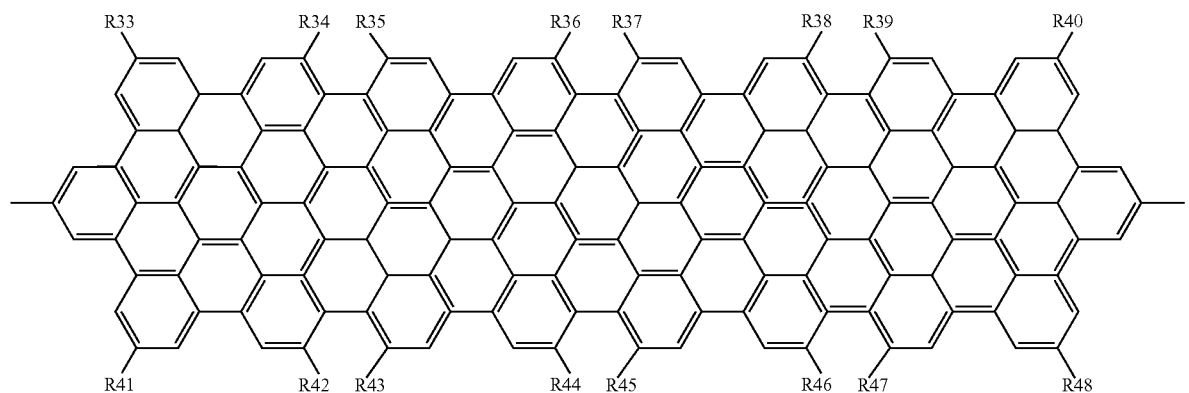
(24)
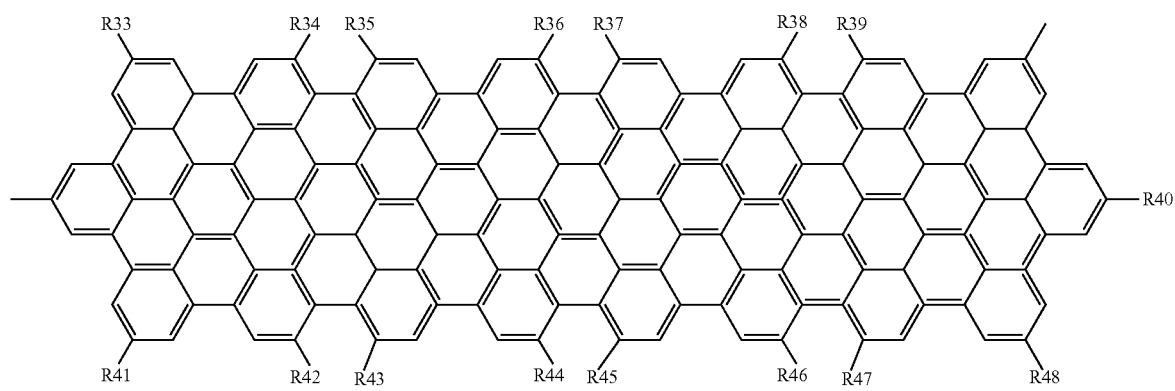
(25)
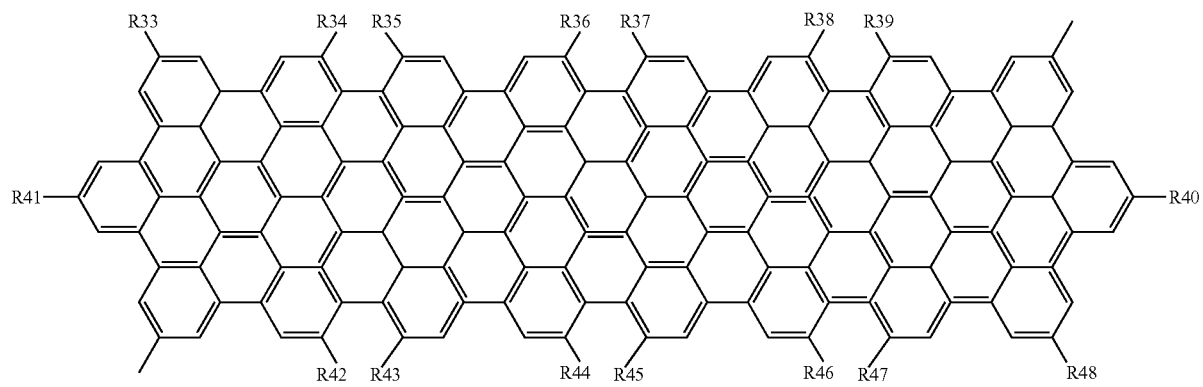
(26)
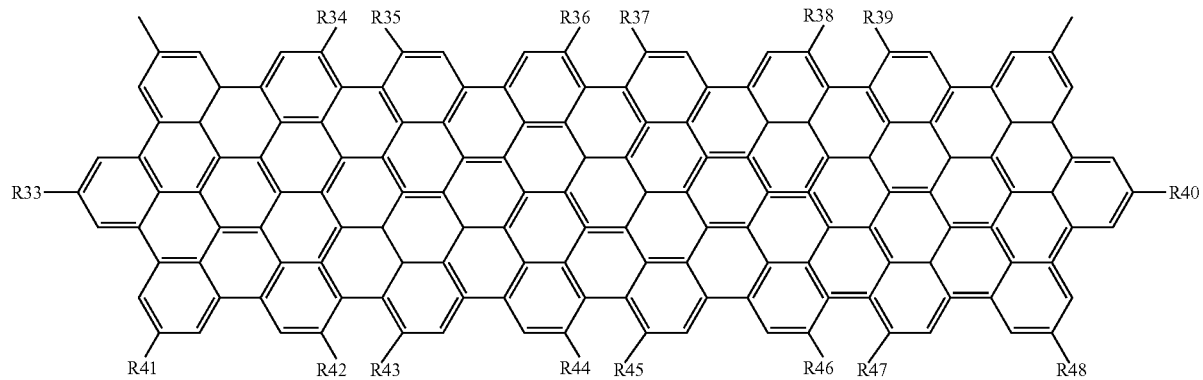
(27)

-continued
(28)
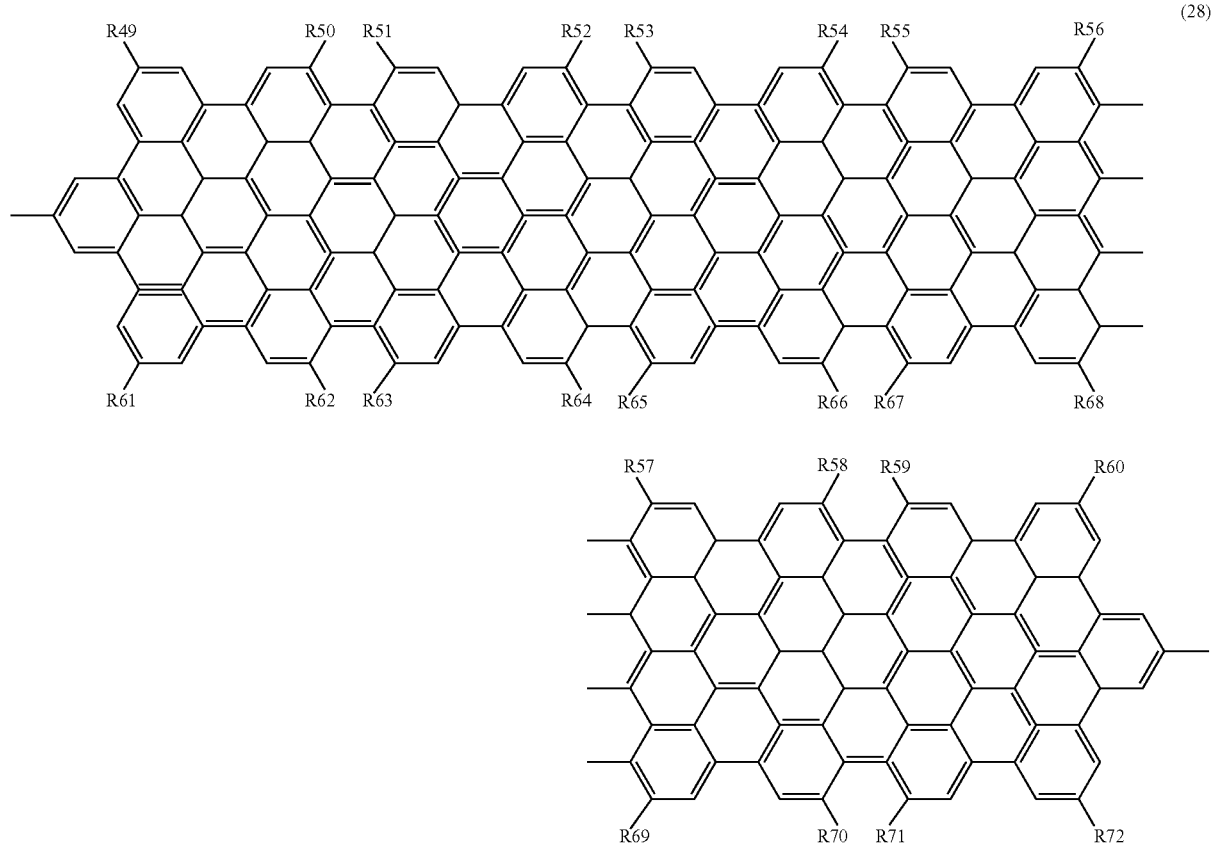
(29)
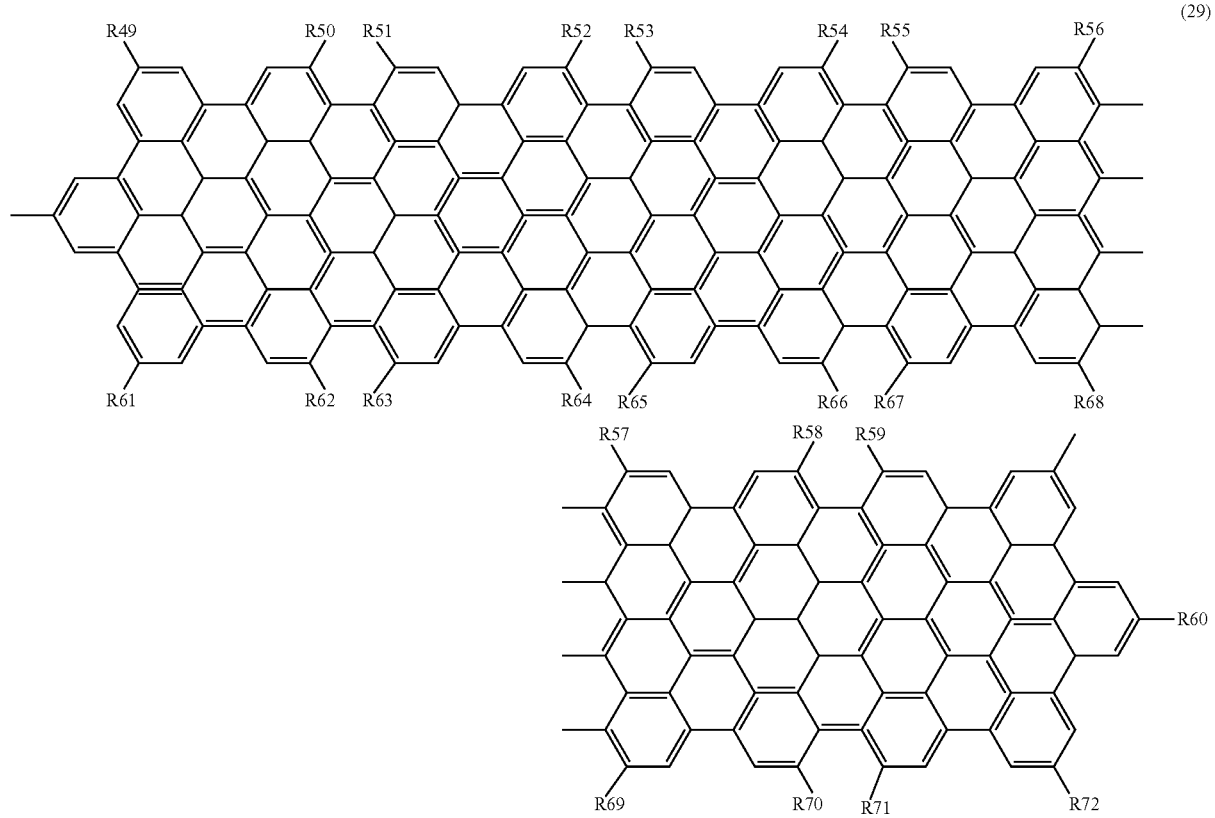

(30)
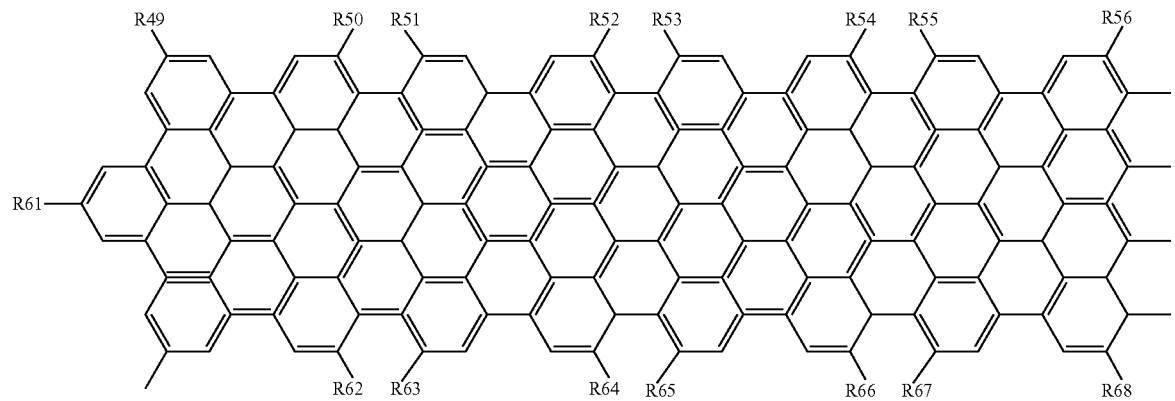
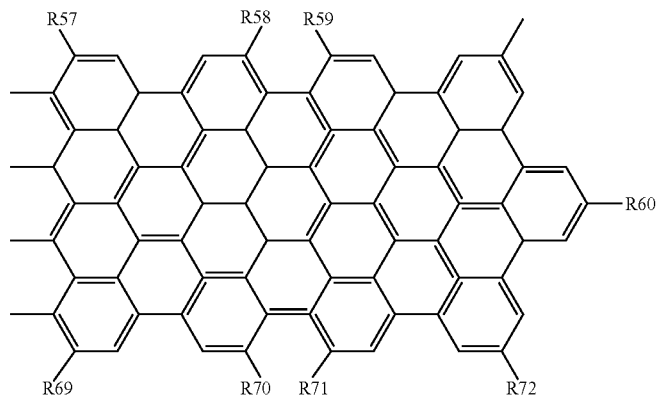
(31)
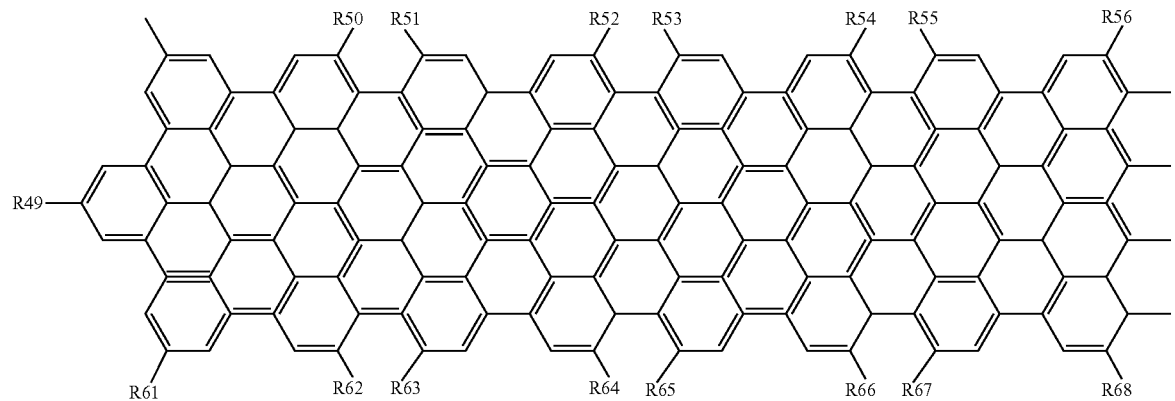
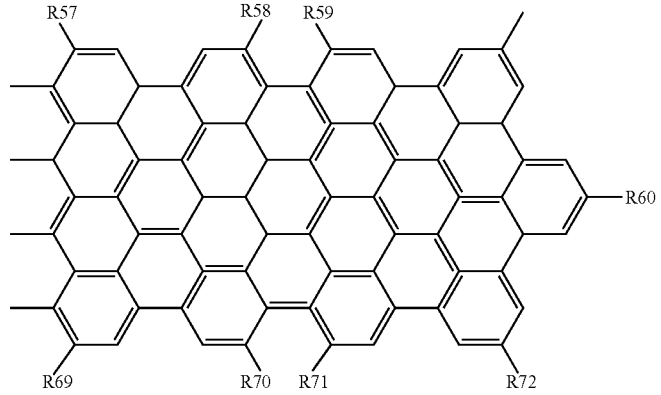

R15 to R72 in the general formulae (18) to (31) independently represent a hydrogen atom or a solubilizing group, and the graphene represented by one of the general formulae (18) to (31) exhibits a higher solubility in an organic solvent with the solubilizing group than without the solubilizing group.

In the produced nanographene polymer, the graphene structure is effectively increased in the main chain skeleton, and the π-conjugated system is suitably expanded. Thus, the π-electron cloud is sufficiently spread over the entire main chain skeleton. Consequently, the organic photovoltaic cell containing the nanographene polymer as the photoelectric conversion material can have an effectively improved photoelectric power conversion efficiency.

It is preferred that each of the monomers, the polyphenylene, and the nanographene polymer should have at least one of straight chain alkyl groups, branched alkyl groups, straight chain alkoxy groups, and branched alkoxy groups as the solubilizing group in the side chain. The solubilizing group preferably should have 3 to 20 carbon atoms. In this case, the solubilizing group can act to prevent cross-linking of the condensed carbocyclic ring units in the polyphenylene, and the nanographene polymer can be easily obtained with the π-electron cloud sufficiently spread over the entire main chain skeleton. Furthermore, the solubility of the nanographene polymer in the organic solvent can be improved by introducing the solubilizing group as the side chain. From the viewpoint of increasing the solubility, the solubilizing group is particularly preferably an alkoxy group, further preferably a branched alkoxy group.

It is preferred that the polymerization degree of the nanographene polymer should be controlled within a range of 2 to 150 in the reaction of the polyphenylene. For example, the polymerization degree of 2 to 150 can be achieved by appropriately selecting the reaction temperature or the reaction time in the polymerization. When the polymerization degree is 2 or more, the absorbance coefficient can be sufficiently increased, and the bandgap can be sufficiently lowered. On the other hand, when the polymerization degree is 150 or less, the time required for the polymerization can be shortened, and the production efficiency of the nanographene polymer can be improved.

According to a further aspect of the present invention, there is provided an organic photovoltaic cell using the above-described photoelectric conversion material. The organic photovoltaic cell has a photoelectric conversion layer containing the photoelectric conversion material as an electron donor.

In the organic photovoltaic cell, for example, in the case of using PCBM as an acceptor, the photoelectric conversion layer using the nanographene polymer as the donor can exhibit a higher absorbance coefficient and can have a maximum absorption wavelength shifted to the longer-wavelength side as compared with a layer using P3HT. Furthermore, the donor of the nanographene polymer can exhibit a narrower bandgap, and can have an LUMO energy level closer to that of the PCBM acceptor.

Therefore, the organic photovoltaic cell can exhibit an active exciton generation property, an improved sunlight utilization efficiency, and a high open circuit voltage Voc. Thus, the organic photovoltaic cell can have an improved photoelectric power conversion efficiency.

Since the organic photovoltaic cell has a high photoelectric power conversion efficiency, only a smaller area is required for achieving a desired power generation capacity in comparison with the other photovoltaic cells having the same power generation capacity. Therefore, the organic photovoltaic cell can have a light weight and a small load applied on its installation site. Furthermore, the organic photovoltaic cell can be placed in a smaller site, so that the layout of the solar cell can be designed more freely.

When the nanographene polymer has the solubilizing group, the nanographene polymer exhibits an improved solubility in the organic solvent. Therefore, even in a case where the molecular weight of the condensed carbocyclic ring structure in the nanographene polymer is increased in order to improve the sunlight utilization efficiency, the photoelectric conversion layer can be formed simply and easily from the nanographene polymer. Thus, the organic photovoltaic cell can be produced simply and easily with an excellent photoelectric power conversion efficiency.

For example, the organic photovoltaic cell is preferably a bulk heterojunction-type organic photovoltaic cell having a photoelectric conversion layer containing a mixture of a donor domain and an acceptor domain. The bulk heterojunction-type photovoltaic cell has a larger contact area between the donor and acceptor domains, as compared with a planar heterojunction-type photovoltaic cell having a donor layer and an acceptor layer formed separately from each other. In the organic photovoltaic cell, the exciton is divided into the electron and hole mainly on the interface between the donor and acceptor domains thereby for power generation. Therefore, in a case where the organic photovoltaic cell is formed as the bulk heterojunction-type, which has a larger contact area between the donor and acceptor domains, the photoelectric power conversion efficiency can be improved.

Particularly, the nanographene polymer having the branched alkoxy group is readily soluble in the organic solvent, whereby the photoelectric conversion layer can be easily formed in the bulk heterojunction-type organic photovoltaic cell by use of the nanographene polymer. The photoelectric conversion layer can contain a mixture of the donor and acceptor domains in a desired phase separation state. Thus, the charge separation efficiency of the photoelectric conversion layer can be improved, and the photoelectric power conversion efficiency of the organic photovoltaic cell can be improved.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3 is a schematic structural view for illustrating a relationship between structural units in a polyphenylene (a) having solubilizing groups and the alkoxy groups;

FIG. 10 is a table showing the power generation performance of a BHJ solar cell according to Example 1;

FIG. 14 is an explanatory view of a structural formula of low-molecular organic semiconductor materials usable as an acceptor.

DESCRIPTION OF THE PREFERRED EMBODIMENTS

A preferred embodiment of the photoelectric conversion material and the production method of the present invention will be described in detail below, using a bulk heterojunction-type organic photovoltaic cell having a photoelectric conversion layer containing the material, with reference to the accompanying drawings.

Figure 1:
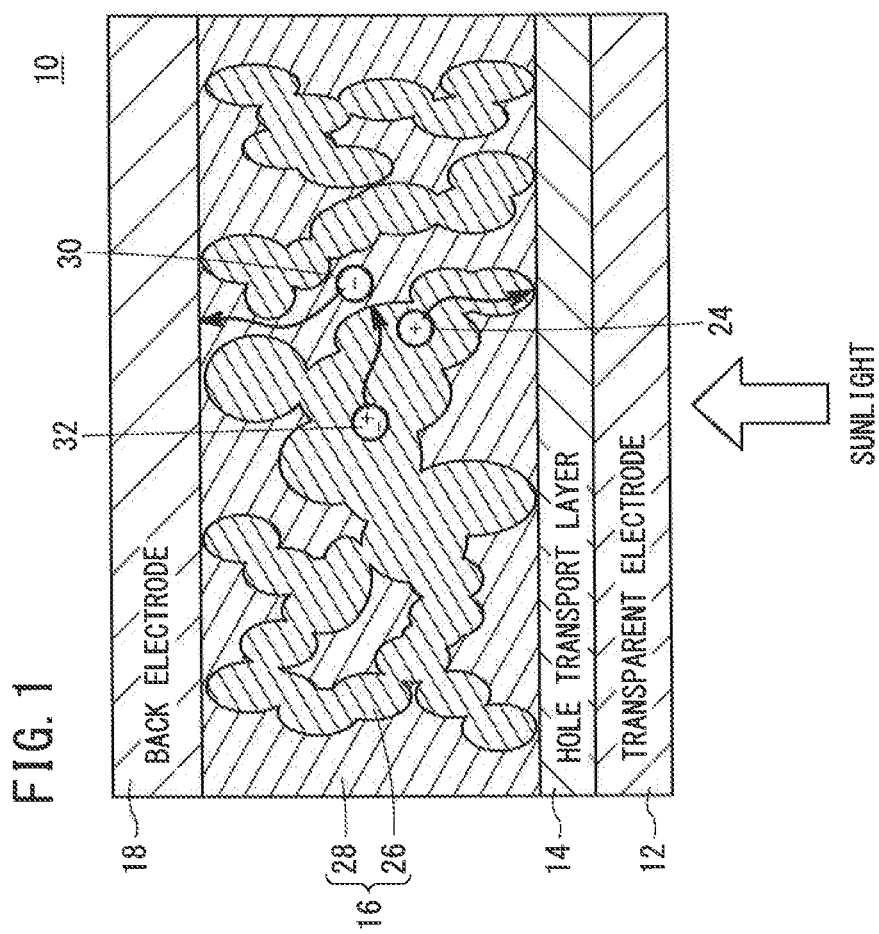
FIG. 1 is a schematic longitudinal cross-sectional view of a bulk heterojunction-type organic photovoltaic cell according to an embodiment of the present invention.

FIG. 1 is a schematic longitudinal cross-sectional view of a principal part in a bulk heterojunction-type organic photovoltaic cell (BHJ solar cell) 10 according to this embodiment. In the BHJ solar cell 10, a hole transport layer 14, a photoelectric conversion layer 16, and a back electrode 18 are stacked in this order on a transparent electrode 12.

The transparent electrode 12 acts as a positive electrode. Thus, holes 24 are transferred to the transparent electrode 12. The transparent electrode 12 may be composed of a material having a sufficient transmittance of a light such as sunlight, and examples of such materials include indium-tin composite oxide (ITO).

The hole transport layer 14 acts to accelerate the transfer of the holes 24 from the photoelectric conversion layer 16 to the transparent electrode 12. In general, the hole transport layer 14 may contain a poly(3,4-ethylenedioxythiophene) doped with a polystyrene sulfonic acid, i.e. a so-called PEDOT:PSS.

The photoelectric conversion layer 16 contains a combination of a donor domain 26 and an acceptor domain 28. The donor domain 26 contains a photoelectric conversion material that acts as an electron donor (donor), and the acceptor domain 28 contains a photoelectric conversion material that acts as an electron acceptor (acceptor). Preferred examples of the acceptors include PCBM. TCNQ, NTCDA, or PTCDA shown in FIG. 14 may be used as the acceptor.

Alternatively, 2,3,5,6-tetrafluoro-7,7,8,8-tetracyanoquinodimethane (F4TCNQ), N,N'-dipentyl-3,4,9,10-perylene-dicarboximide (PTCDI-C5), N,N'-dioctyl-3,4,9,10-perylene-dicarboximide (PTCDI-C8), N,N'-diphenyl-3,4,9,10-perylene-dicarboximide (PTCDI-Ph), or the like may be used as the acceptor.

The donor is a p-type semiconductor composed of a photoelectric conversion material according to this embodiment. The photoelectric conversion material of this embodiment contains a condensed carbocyclic ring polymer (nanographene polymer), which is a reaction product of a polyphenylene prepared by polymerizing monomers represented by the following general formulae (1) and (2).

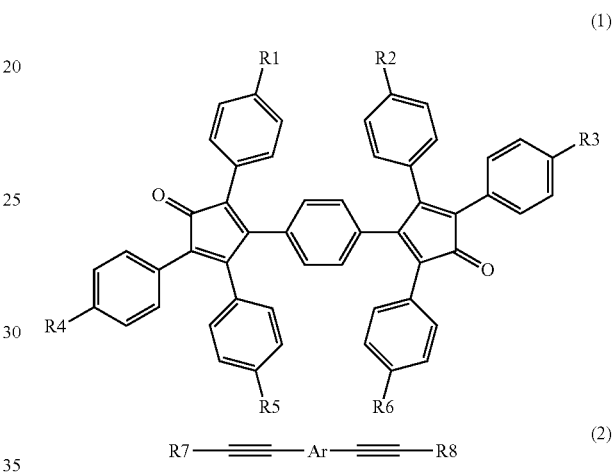

(1)

(2)

R1 to R6 in the general formula (1) independently represent a hydrogen atom or a solubilizing group, and the monomer represented by the general formula (1) exhibits a higher solubility in an organic solvent with the solubilizing group than without the solubilizing group. Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

Preferred examples of the monomer of the general formula (2) include those represented by the following general formulae (3) to (5).

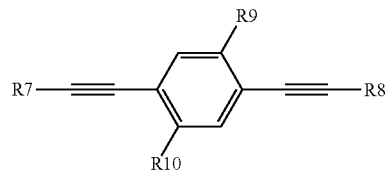

(3)

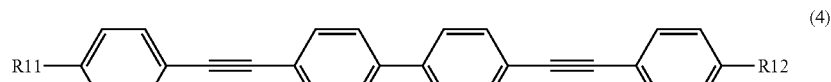

(4)

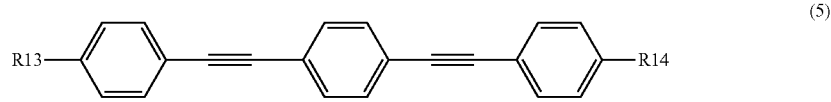

(5)

R9 to R14 in the general formulae (3) to (5) independently represent a hydrogen atom or a solubilizing group, and the monomer represented by the general formulae (3) to (5) exhibits a higher solubility in an organic solvent with the solubilizing group than without the solubilizing group.

Thus, it is preferred that the monomer represented by the general formula (1) should be polymerized with at least one monomer selected from the monomers represented by the general formulae (3) to (5) to thereby prepare the polyphenylene. In this case, in the resultant nanographene polymer, the graphene structure in the main chain skeleton (i.e. the number of the condensed carbocyclic rings) can be effectively increased.

Examples of the polyphenylenes prepared by polymerizing the monomers include those having at least one structural unit selected from moieties represented by the following general formulae (6) to (11).

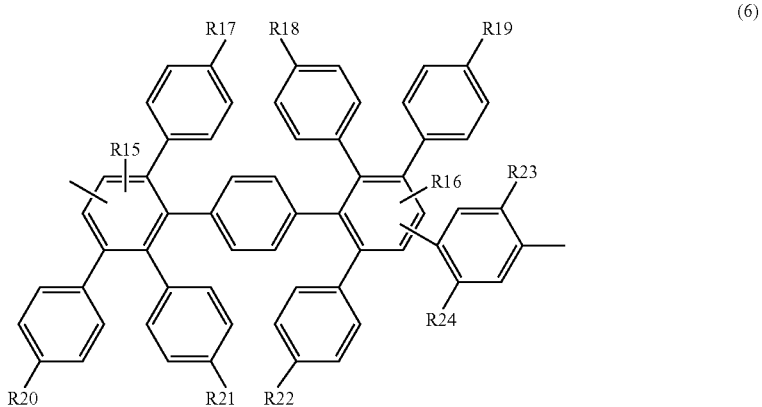

(6)

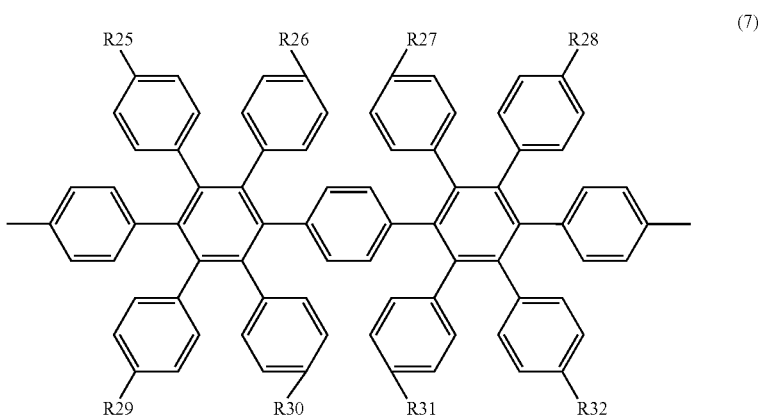

(7)

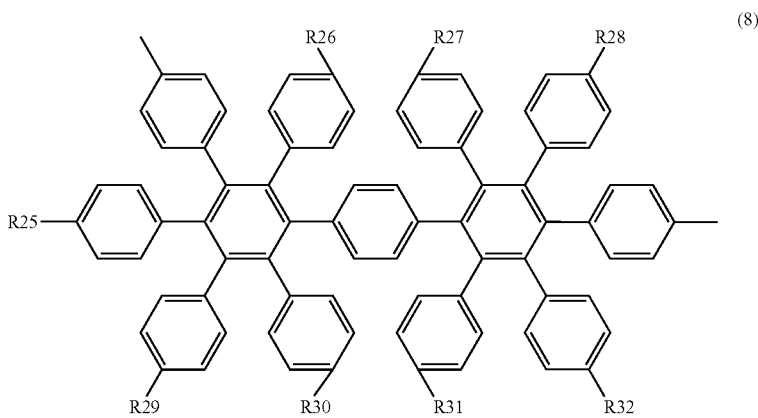

(8)

-continued
(9)
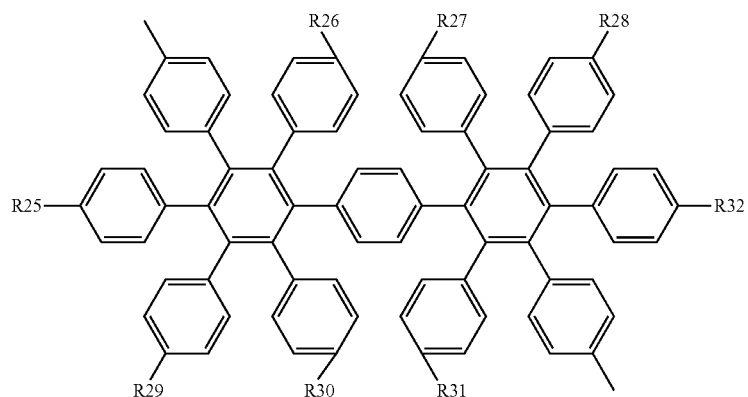
(10)
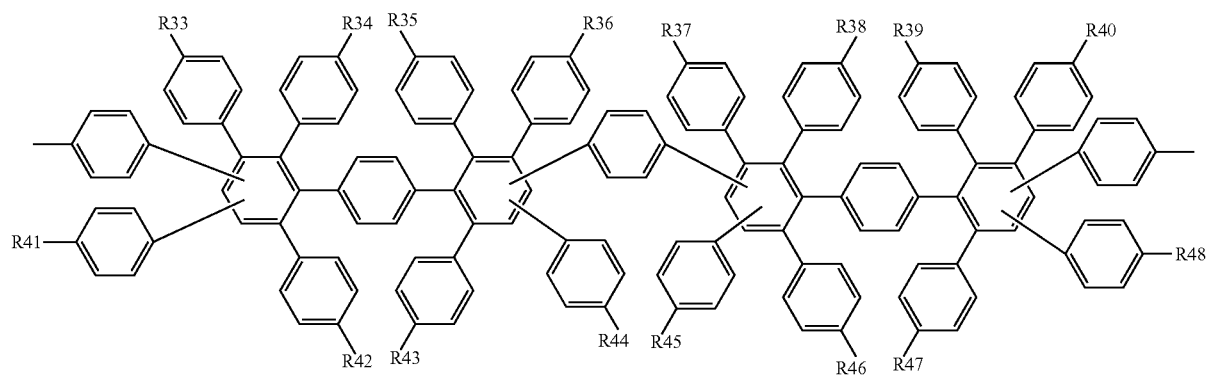
(11)
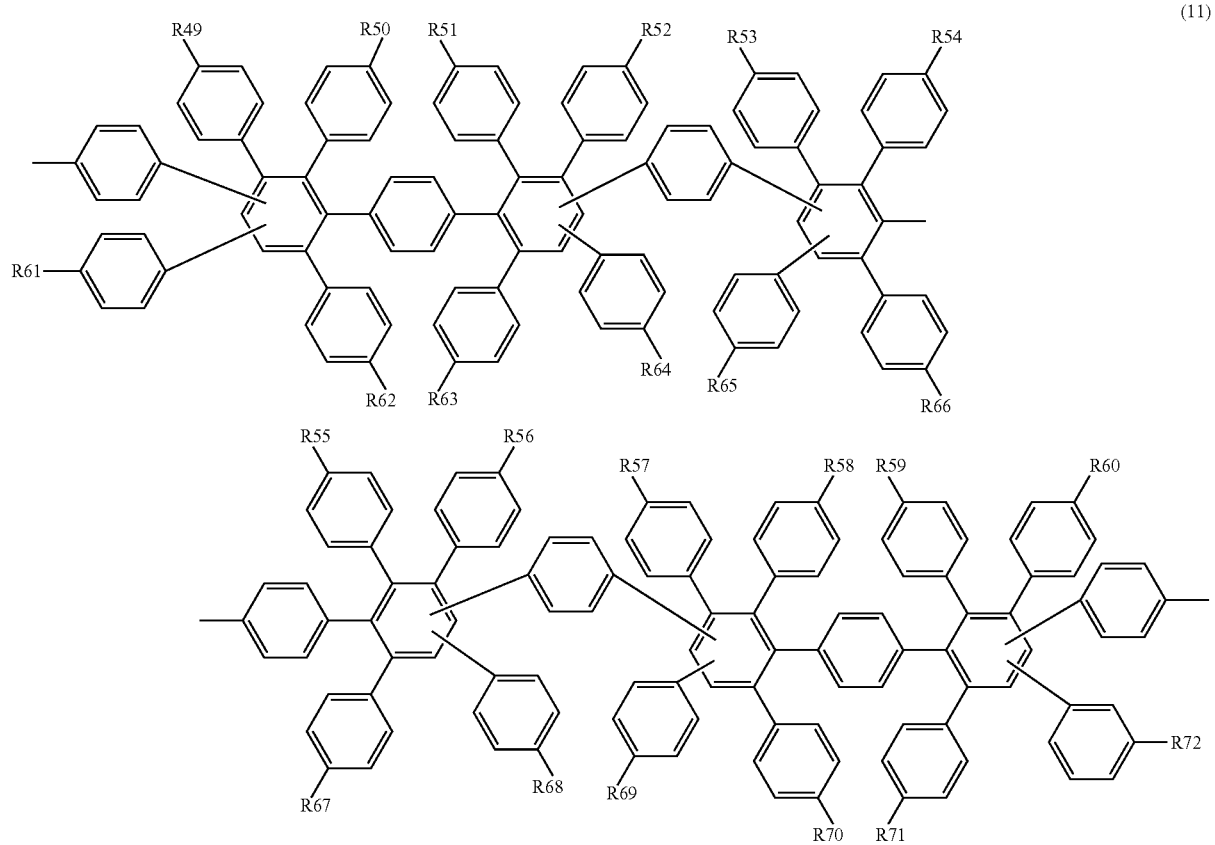

R15 to R72 in the general formulae (6) to (11) independently represent a hydrogen atom or a solubilizing group, and the moiety represented by the general formulae (6) to (11) exhibits a higher solubility in an organic solvent with the solubilizing group than without the solubilizing group.

The polyphenylene having the structural unit of the moiety represented by the general formula (6) can be prepared by polymerizing the monomer of the general formula (1) and the monomer of the general formula (3) at a molar ratio of 1:1. The polyphenylenes having the structural units of the moieties represented by the general formulae (7) to (9) are isomers, and the polyphenylene having the structural unit of the moiety represented by any one of the general formulae (7) to (9) can be prepared by polymerizing the monomers of the general formulae (1) and (4) at a molar ratio of 1:1. The polyphenylene having the structural unit of the moiety represented by the general formula (10) can be prepared by polymerizing the monomers of the general formulae (1), (4), and (5) at a molar ratio of 2:1:1. The polyphenylene having the structural unit of the moiety represented by the general formula (11) can be prepared by polymerizing the monomers of the general formulae (1), (4), and (5) at a molar ratio of 3:1:2.

Specifically, the moieties represented by the general formulae (10) and (11) include a plurality of isomers. Examples of the isomers of the general formula (10) include moieties represented by the following general formulae (12) to (14).

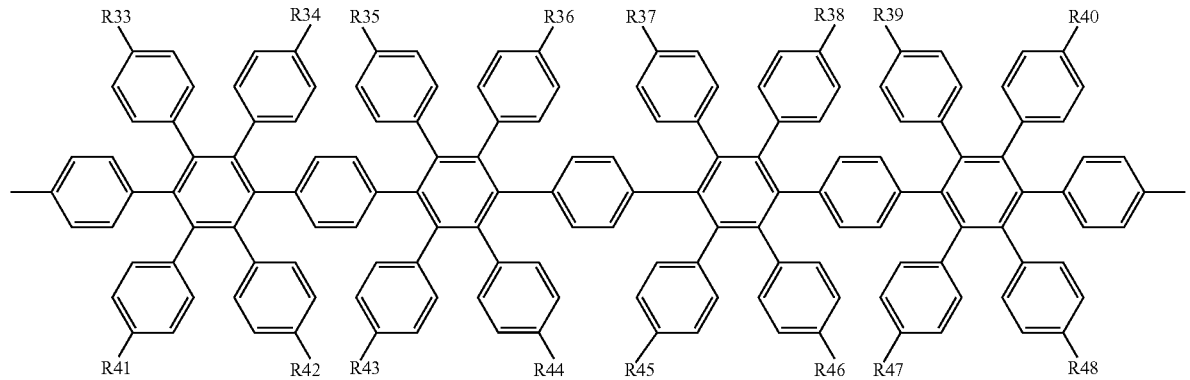

(12)

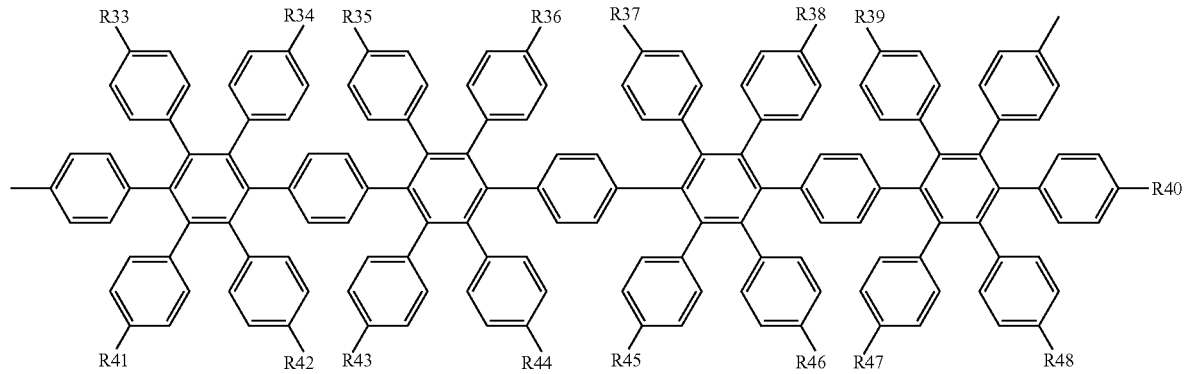

(13)

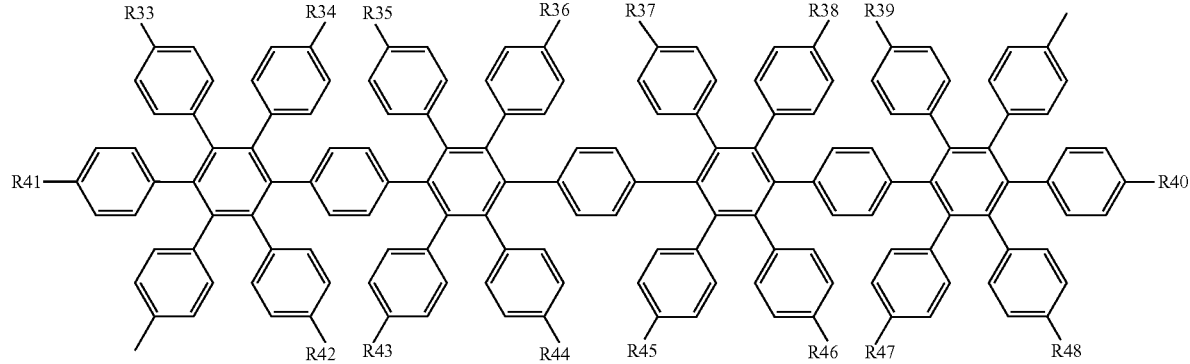

(14)

R33 to R48 in the general formulae (12) to (14) independently represent a hydrogen atom or a solubilizing group, and the moiety represented by the general formulae (12) to (14) exhibits a higher solubility in an organic solvent with the solubilizing group than without the solubilizing group.

Examples of the isomers of the general formula (11) include moieties represented by the following general formulae (15) to (17).

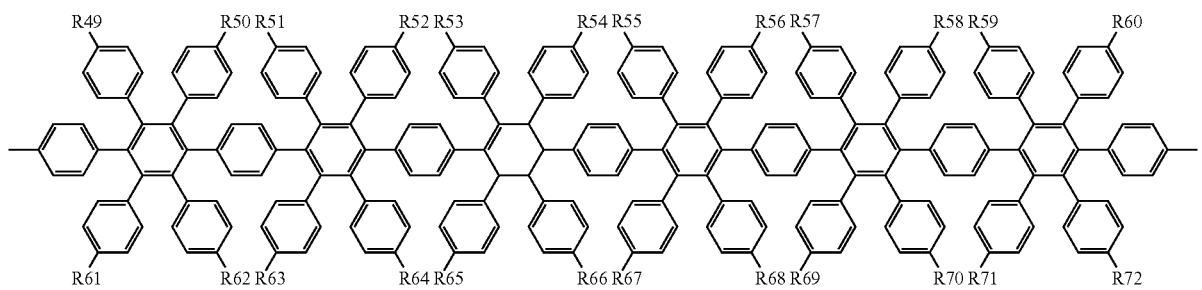

(15)

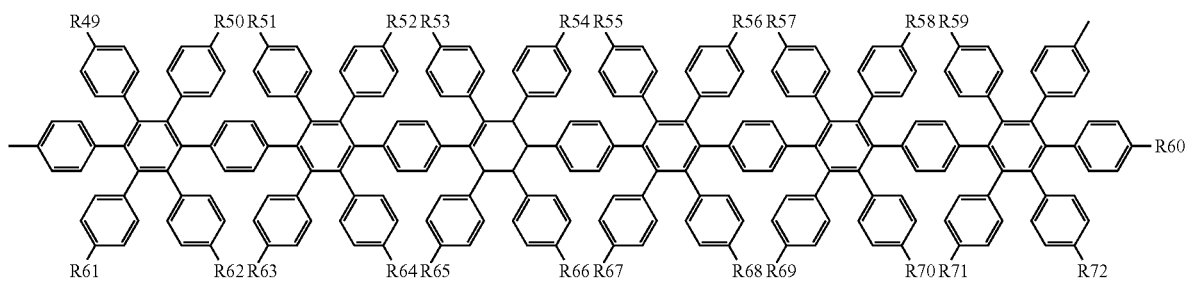

(16)

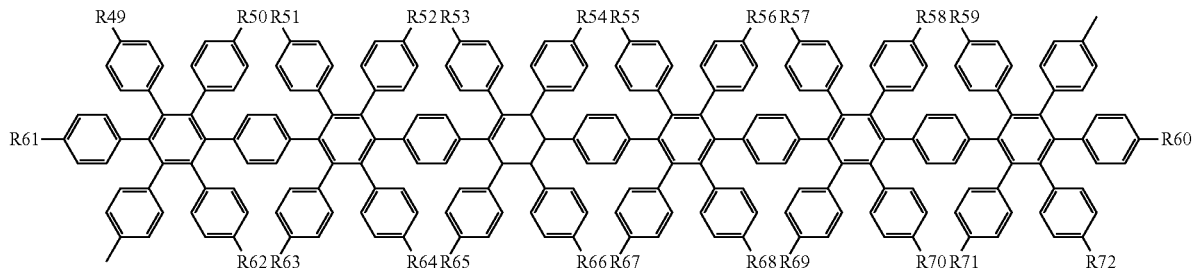

(17)

R49 to R72 in the general formulae (15) to (17) independently represent a hydrogen atom or a solubilizing group, and the moiety represented by the general formulae (15) to (17) exhibits a higher solubility in an organic solvent with the solubilizing group than without the solubilizing group.

The moieties of the general formulae (10) and (11) are not limited to those represented by the general formulae (12) to (14) and (15) to (17), and include all available isomers.

The polyphenylene may be such that only one type of the moieties represented by one of the general formulae (6) to (11) are bonded to each other, but the polyphenylene is not limited thereto. For example, the polyphenylene may be such that the moieties represented by the general formulae (6) to (11) are randomly bonded.

Examples of the nanographene polymers obtained by reacting the above-mentioned polyphenylene include those having at least one structural unit selected from nanographenes represented by the following general formulae (18) to (31).

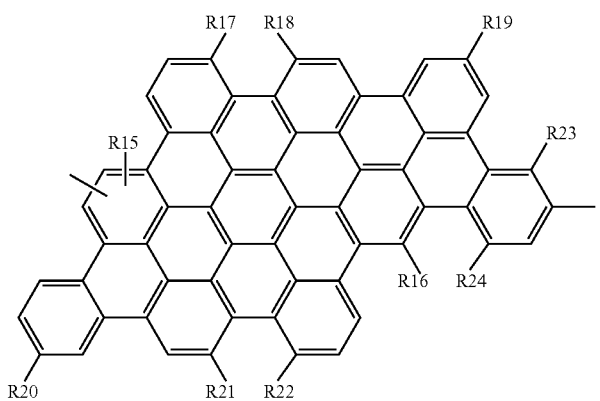

(18)

-continued
(19)
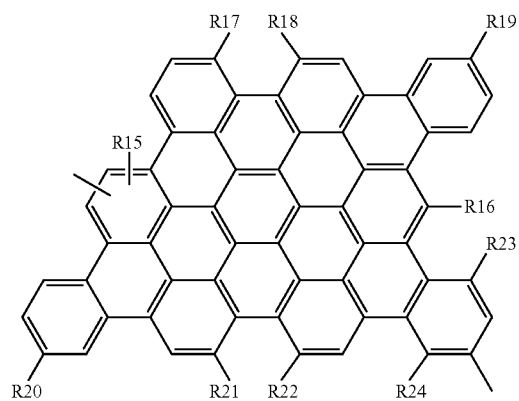
(20)
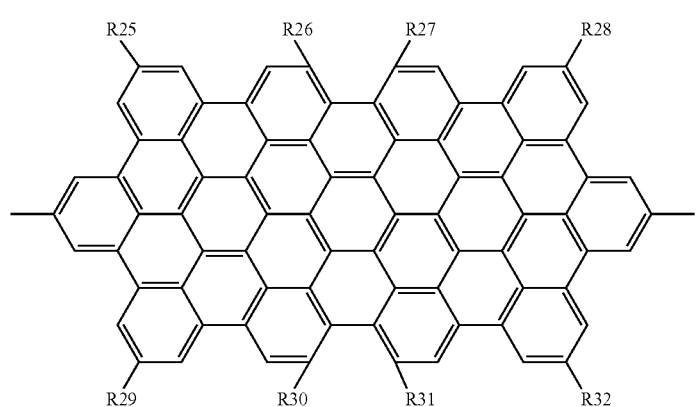
(21)
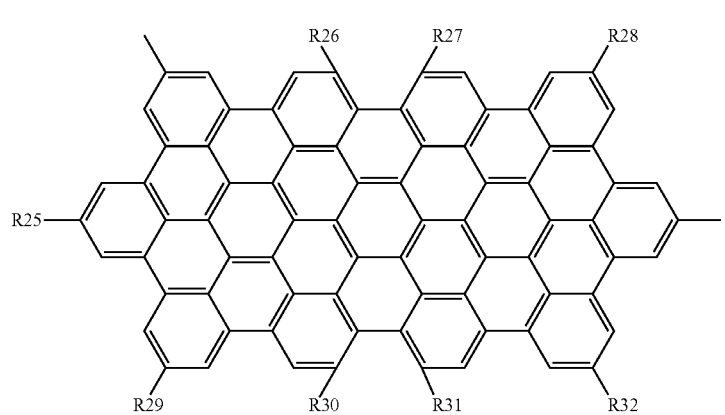
(22)
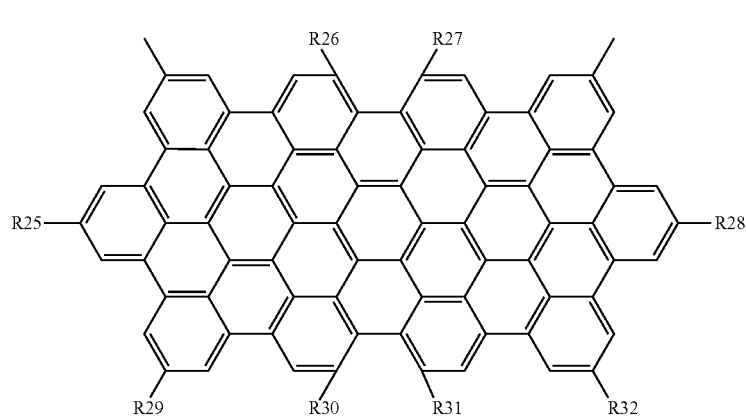

(23)
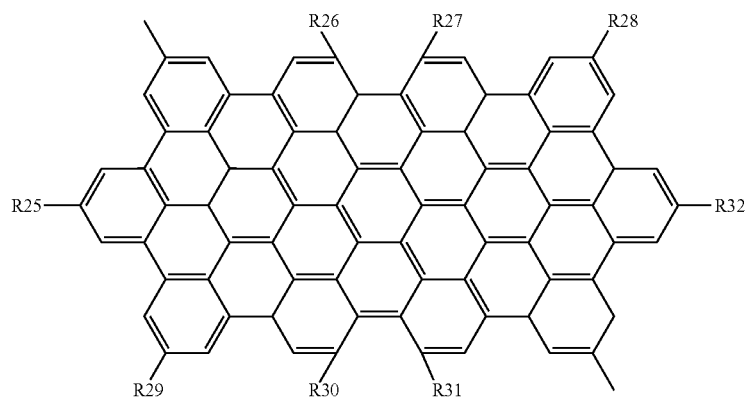
(24)
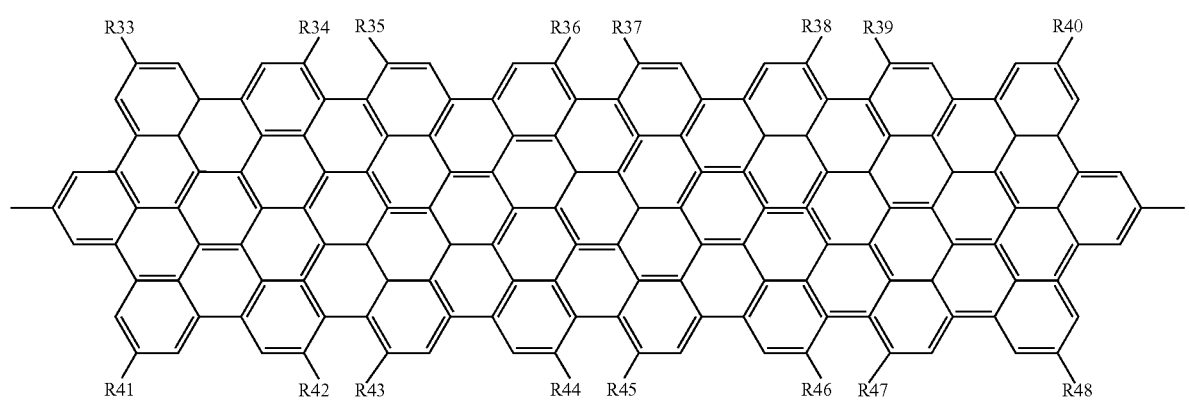
(25)
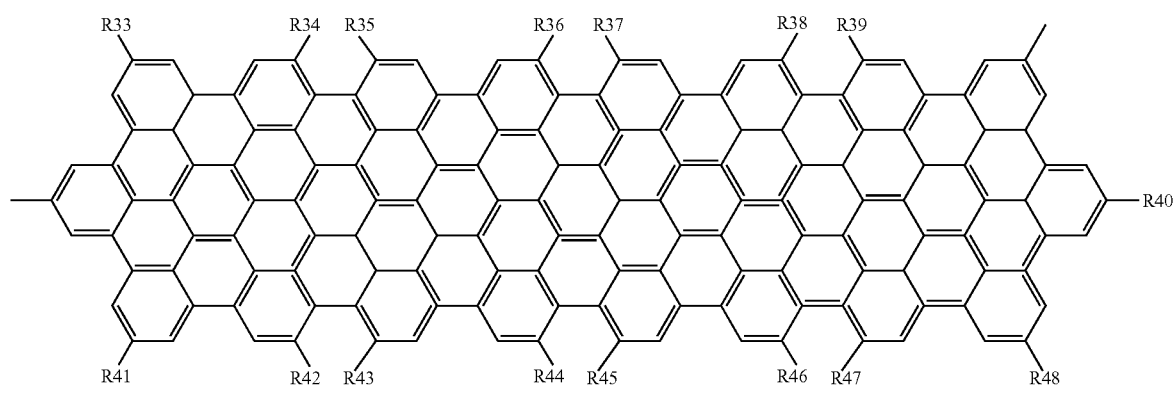
(26)
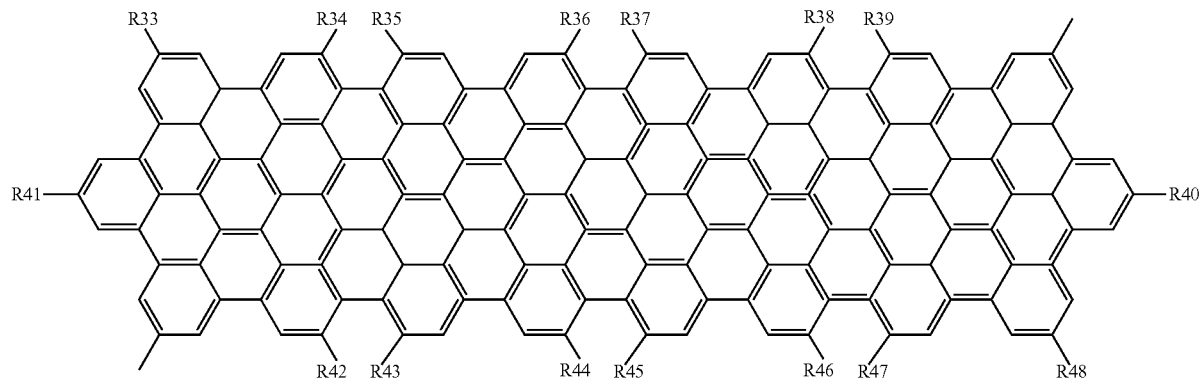

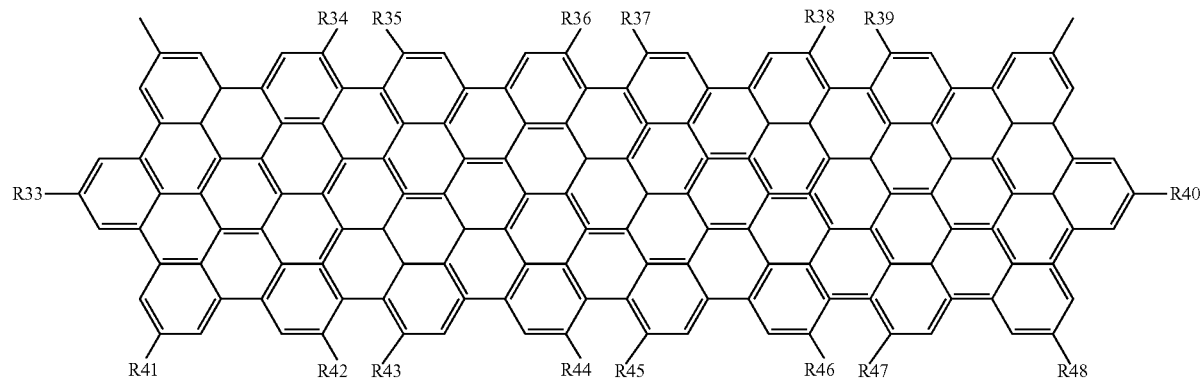
(27)
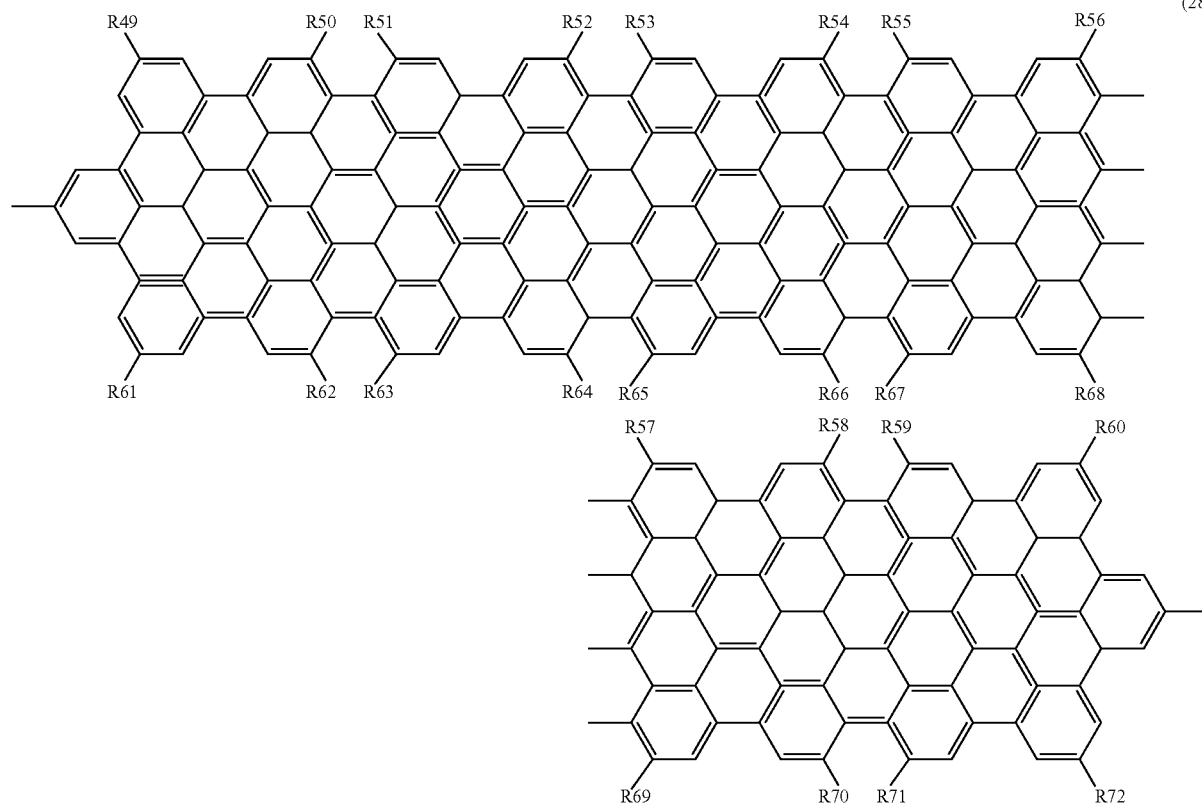
(28)
(29)
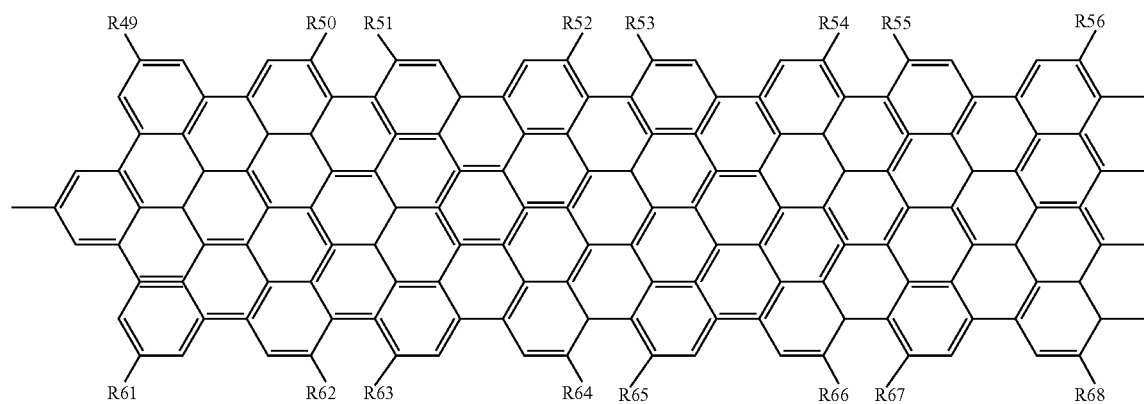

-continued
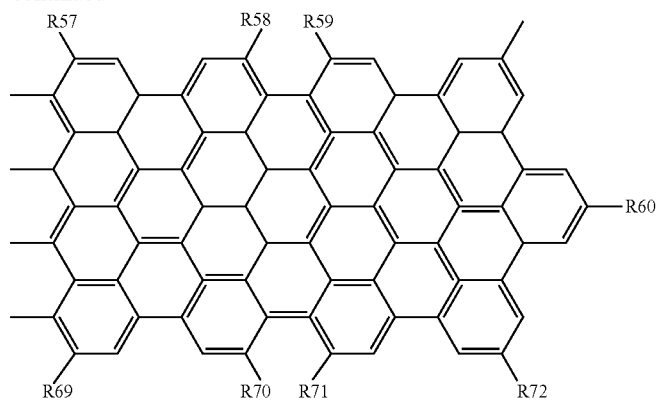
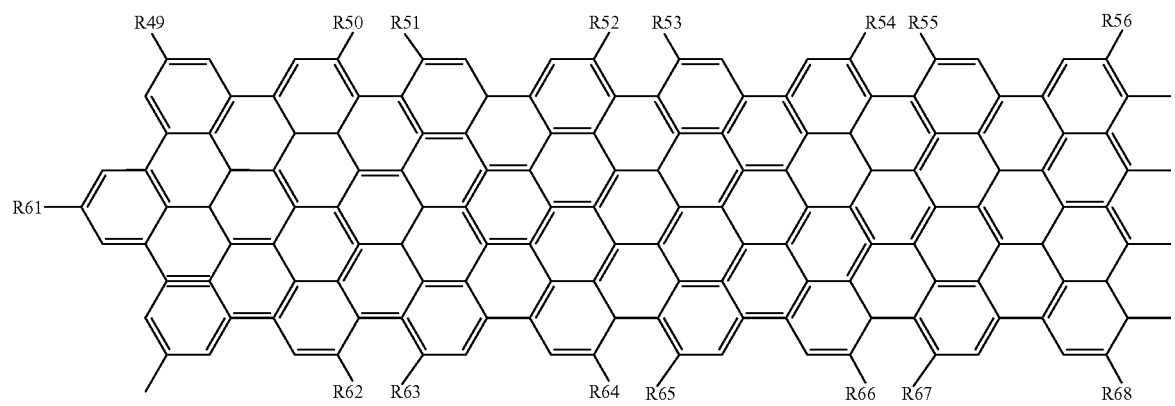
(30)
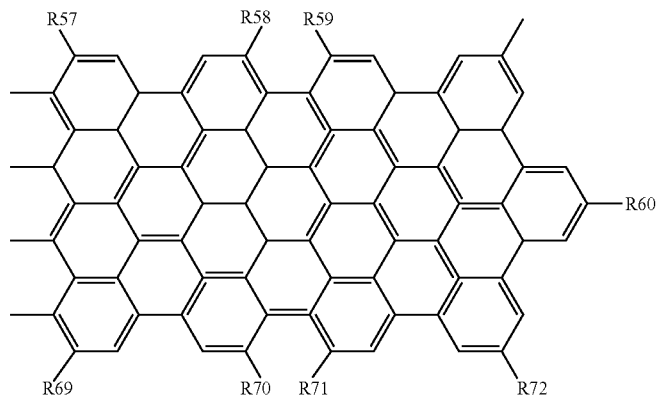
(31)
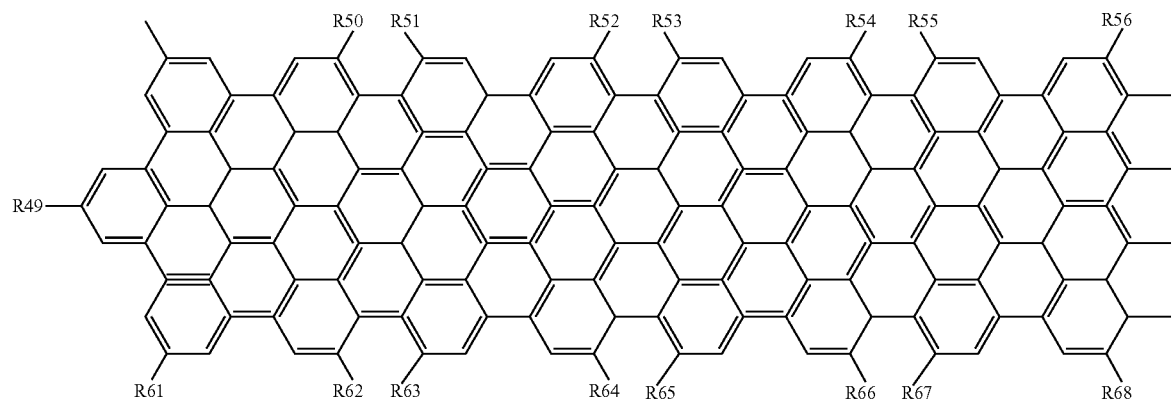

-continued

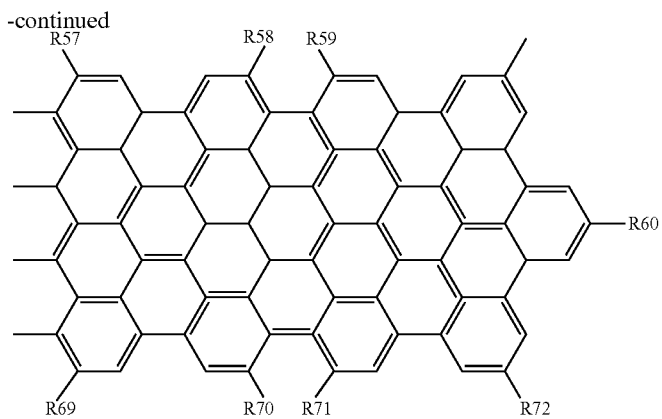

R15 to R72 in the general formulae (18) to (31) independently represent a hydrogen atom or a solubilizing group, and the nanographene represented by the general formulae (18) to (31) exhibits a higher solubility in an organic solvent with the solubilizing group than without the solubilizing group.

The nanographene polymer having the structural unit of the nanographene represented by the general formulae (18) and (19) can be prepared by reacting the polyphenylene having the structural unit of the moiety represented by the general formula (6). Similarly, the nanographene polymer having the structural unit of the general formula (20) or (21) can be prepared by reacting the polyphenylene having the structural unit of the general formula (7) or (8). The nanographene polymer having the structural unit of the general formula (22) or (23) can be prepared by reacting the polyphenylene having the structural unit of the general formula (9). The nanographene polymer having the structural unit of the general formula (24) or (25) can be prepared by reacting the polyphenylene having the structural unit of the general formula (12) or (13). The nanographene polymer having the structural unit of the general formula (26) or (27) can be prepared by reacting the polyphenylene having the structural unit of the general formula (14). The nanographene polymer having the structural unit of the general formula (28) or (29) can be prepared by reacting the polyphenylene having the structural unit of the general formula (15) or (16). The nanographene polymer having the structural unit of the general formula (30) or (31) can be prepared by reacting the polyphenylene having the structural unit of the general formula (17).

The nanographene polymer may be such that only one type of the nanographenes represented by one of the general formulae (18) to (31) are bonded to each other, but the nanographene polymer is not limited thereto. For example, the nanographene polymer may be such that the moieties represented by the general formulae (18) to (31) are randomly bonded.

The structural unit of the nanographene polymer is not limited to the nanographenes represented by the general formulae (18) to (31). The structural units usable in the polyphenylene include all available isomers of the moieties represented by the general formulae (6) to (11), and thus the structural units usable in the nanographene polymer derived from the polyphenylene include a plurality of isomers.

As described above, the composition and structure of the polyphenylene can be controlled by changing the molar ratio, composition, or structure of the monomer represented by the general formula (1) or (2) in the polymerization reaction. Thus, since the nanographene polymer is produced by further reacting the polyphenylene, the composition and structure (such as the number of the condensed carbocyclic rings in the main chain skeleton) of the nanographene polymer can be easily controlled.

In the main chain skeleton of the nanographene polymer, the number of π-electrons depends on the number of double bonds in the condensed carbocyclic ring structure. Therefore, the π-electron number can be controlled by controlling the composition and structure of the nanographene polymer. Specifically, the π-electron number can be obtained by multiplying the double bond number in the condensed carbocyclic ring structure by 2. Thus, the nanographenes of the general formulae (18) and (19) have a π-electron number of 60, the nanographenes of the general formulae (20) to (23) have a π-electron number of 78, the nanographenes of the general formulae (24) to (27) have a π-electron number of 150, and the nanographenes of the general formulae (28) to (31) have a π-electron number of 222.

In the main chain skeleton of the nanographene polymer, the π-electrons are delocalized in the condensed carbocyclic ring structure. The π-electron number corresponds to the π-conjugated system range, and the bandgap (the HOMO and LUMO energy levels) can be controlled by controlling the π-electron number. Thus, the HOMO and LUMO energy levels of the nanographene polymer can be desirably controlled by controlling the π-electron number in the above manner.

Consequently, the nanographene polymer can be used as the donor in combination with various acceptors including the PCBM acceptor and the above-mentioned acceptors, whereby an excellent photoelectric power conversion efficiency can be achieved. This is because optimum HOMO and LUMO energy levels suitable for various acceptors can be obtained by controlling the π-electron number of the nanographene polymer.

Similarly, in a case where the nanographene polymer is used as the acceptor, the nanographene polymer can have an optimum bandgap (optimum HOMO and LUMO energy levels) suitable for various donors. Thus, the nanographene polymer can be used as a highly versatile photoelectric conversion material, and the photoelectric conversion layer can be easily formed with an excellent photoelectric power conversion efficiency by using the nanographene polymer.

It is preferred that the π-electron number in the structural main chain skeleton of the nanographene polymer should be 60 to 250. As the π-electron number is increased, the π-conjugated system is expanded. Therefore, when the π-electron number is 60 or more, the π-conjugated system can be sufficiently expanded, and the nanographene polymer can exhibit an excellent photoelectric power conversion efficiency. Furthermore, as π-electron number is increased, the molecular weight of the condensed carbocyclic ring structure is increased. Therefore, when the π-electron number is 250 or less, the nanographene polymer can be readily dissolved in the organic solvent or the like.

Thus, when the π-electron number of the nanographene polymer is within the above range, the photoelectric conversion layer can be formed with an excellent photoelectric power conversion efficiency simply and accurately.

In the following example, a nanographene polymer prepared by reacting a polyphenylene (unsubstituted polyphenylene) in which R15 to R24 in the general formula (6) are hydrogen atoms will be described. In this case, it is preferred that all the carbocyclic rings in each structural unit should be reacted to form a condensed carbocyclic ring structure indicated in FIG. 2(a).

Figure 2:
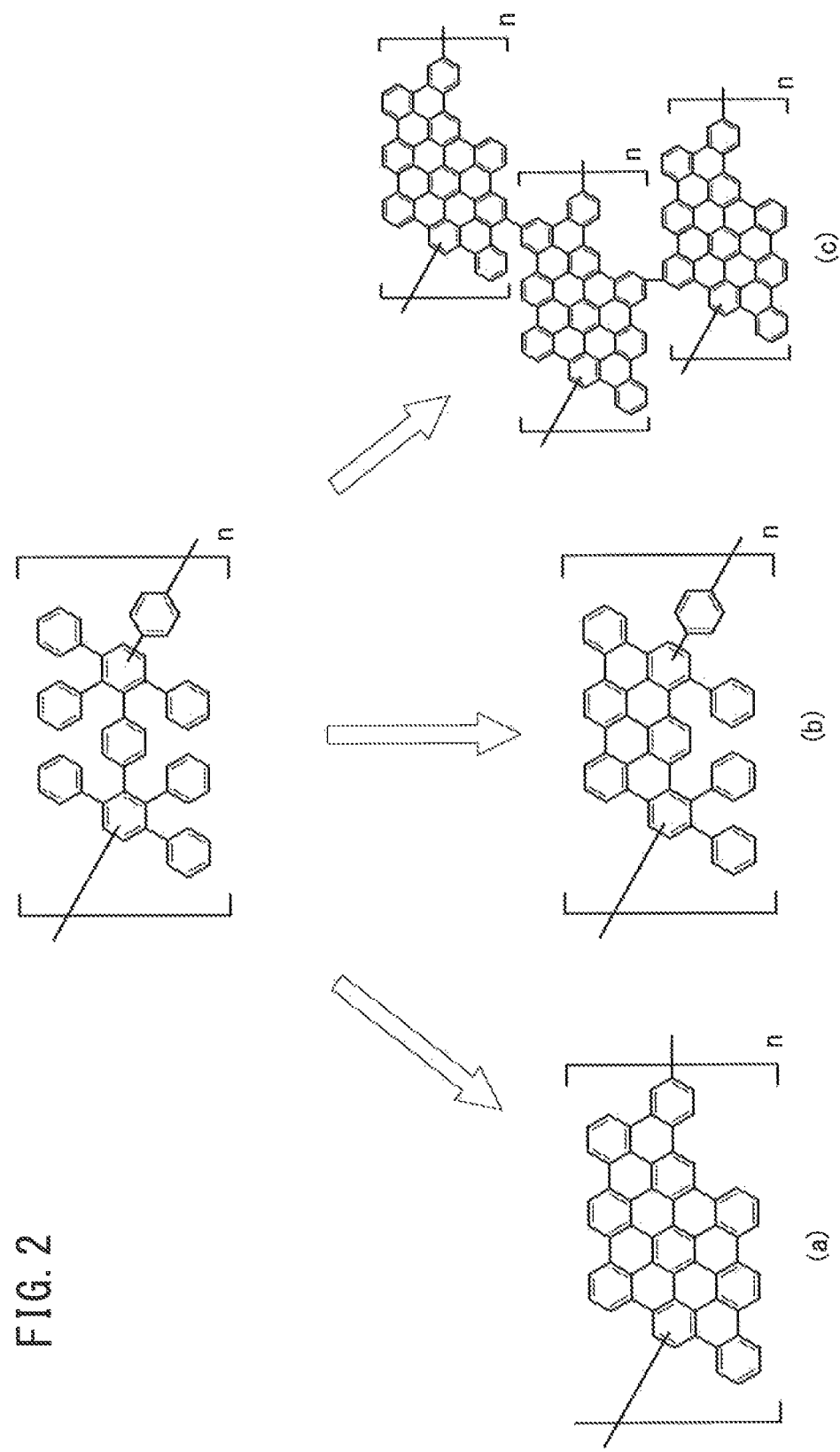
FIG. 2 is an explanatory structural view of reaction products derived from an unsubstituted polyphenylene.

In a structure indicated in FIG. 2(b), some carbocyclic rings in the structural unit are not reacted. Therefore, the nanographene polymer of FIG. 2(a) has more excellently spread π-electron cloud as compared with the nanographene polymer of FIG. 2(b). In a structure indicated in FIG. 2(c), a plurality of the structural units are cross-linked with each other. Therefore, the nanographene polymer of FIG. 2(a) has a higher solubility in the organic solvent as compared with the nanographene polymer of FIG. 2(c). Thus, a layer of the nanographene polymer of FIG. 2(a) can be more easily formed using a solution of the nanographene polymer.

In view of producing the nanographene polymer shown in FIG. 2(a) easily and efficiently, it is preferred that the polyphenylene should have the solubilizing group in at least one of R15 to R24 in the general formula (6). The solubilizing group is such a substituent that the polyphenylene having the solubilizing group as the side chain is more readily soluble in the organic solvent than the unsubstituted polyphenylene. Preferred examples of the solubilizing groups include alkyl groups (such as straight chain alkyl groups and branched alkyl groups) and alkoxy groups (such as straight chain alkoxy groups and branched alkoxy groups).

For example, as shown in FIG. 3, the solubilizing group acts as a steric hindrance in the reaction between the structural units in the polyphenylene (a). The structural units can be thus prevented from coming close to each other. Therefore, the reaction of the carbocyclic rings in each structural unit can effectively proceed. Consequently, the cross-linking of a plurality of the structural units can be prevented, and the nanographene polymer can be produced easily and efficiently with a sufficiently spread π-electron cloud.

In the polyphenylene (a) shown in FIG. 3, R17, R19, R20, and R22 are alkoxy ($OC_{10}H_{21}$) groups, R23 and R24 are alkyl ($C_{12}H_{25}$) groups, and R15 and R16 are alkyl ($CH_3$) groups in the general formula (6). The types and positions of the solubilizing groups are not limited to this example.

Figure 4:
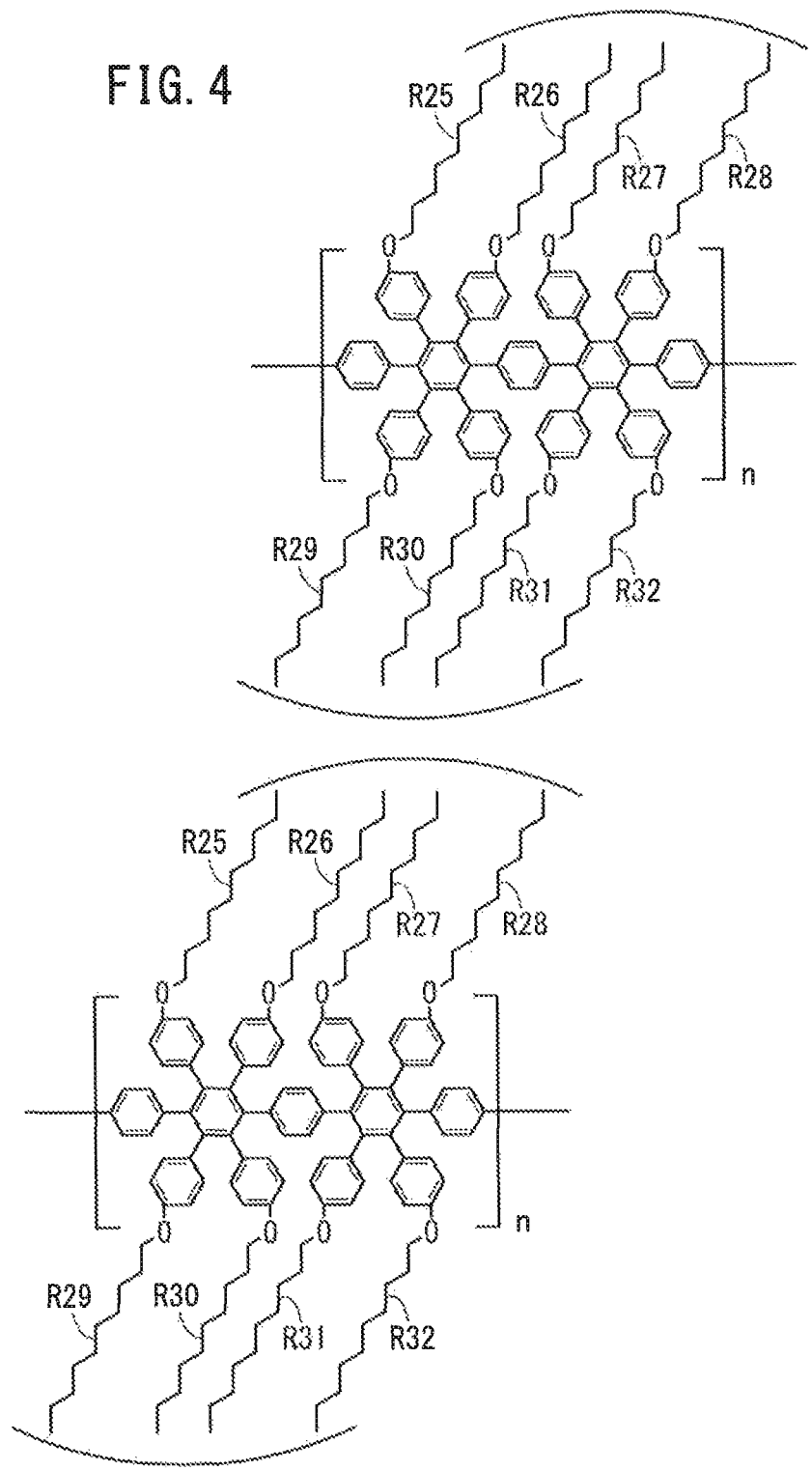
FIG. 4 is a schematic structural view for illustrating a relationship between structural units in a polyphenylene (b) having solubilizing groups and the alkoxy groups.

As shown in FIG. 4, also in a polyphenylene (b) having the moiety of the general formula (7), the reaction between a plurality of the structural units can be prevented by the solubilizing groups, in the same manner as in the polyphenylene (a) having the moiety of the general formula (6).

In the polyphenylene (b) shown in FIG. 4, the moiety of the general formula (7) has $OC_{10}H_{21}$ groups as the alkoxy groups in R25 to R32.

For example, the polyphenylene having the solubilizing group can be prepared by introducing the solubilizing group to at least one of R1 to R6 and R9 to R14 in the monomers of the general formulae (1) and (3) to (5).

The polyphenylene having the alkyl group as the solubilizing group may be prepared from the monomers not having the solubilizing group. The unsubstituted polyphenylene may be prepared from unsubstituted monomers (having hydrogen atoms in all of R1 to R6 and R9 to R14 in the general formulae (1) and (3) to (5)), and then the alkyl group may be introduced to the unsubstituted polyphenylene.

As described above, in a case where the polyphenylene having the solubilizing group as the side chain is reacted to prepare the nanographene polymer, the resultant nanographene polymer also has the solubilizing group. More specifically, the solubilizing group is introduced to at least one of R15 to R72 in the nanographenes represented by the general formulae (18) to (31). Consequently, the nanographene polymer can be readily dissolved in the organic solvent.

In view of improving the solubility of the nanographene polymer, the side chain of the polyphenylene is preferably the alkoxy group, particularly preferably the branched alkoxy group. In this case, the solubility can be further effectively increased.

The alkyl or alkoxy group preferably has 3 to 20 carbon atoms. When the carbon number of the alkoxy group is within this range, the structural units in the polyphenylene can be prevented from coming close to each other, and the solubility of the nanographene polymer in the organic solvent can be improved. Thus, the nanographene polymer, which can exhibit an excellent photoelectric power conversion property and can be readily dissolved in the organic solvent to form the photoelectric conversion layer, can be efficiently produced.

The polymerization degree of the nanographene polymer is preferably 2 to 150. When the polymerization degree (i.e. the number n of the nanographenes bonded to each other) is 2 or more, the absorbance coefficient can be sufficiently increased. On the other hand, when the polymerization degree (i.e. the number n of the nanographenes bonded to each other) is 150 or less, the time required for the polymerization for producing the nanographene polymer can be shortened, and accordingly the production efficiency of the nanographene polymer can be improved. Thus, when the polymerization degree is within the above range, the photoelectric conversion material having a sufficiently improved absorbance coefficient can be efficiently produced.

In the BHJ solar cell 10 (see FIG. 1), the back electrode 18 is stacked on the photoelectric conversion layer 16 containing the photoelectric conversion material containing the nanographene polymer. The back electrode 18 acts as a negative electrode, to which electrons 30 are transferred. An electron transport layer (not shown) containing bathocuproine, lithium fluoride, or the like may be interposed between the photoelectric conversion layer 16 and the back electrode 18. The electron transport layer can act to accelerate the transfer of the electrons 30 generated at the photoelectric conversion layer 16 to the back electrode 18.

The BHJ solar cell 10 of this embodiment has the above-described basic structure. Operations and advantageous effects of the BHJ solar cell 10 will be described below.

When a light (such as sunlight) is injected to the transparent electrode 12 in the BHJ solar cell 10, the light is transferred through the hole transport layer 14 to the photoelectric conversion layer 16. Then, excitons 32 are generated in the photoelectric conversion layer 16.

The generated excitons 32 are moved in the donor domain 26, and reach the interface between the donor domain 26 and the acceptor domain 28. The excitons 32 are divided into the electrons 30 and the holes 24 on the interface. As described above, the electrons 30 are moved in the acceptor domain 28, are transferred through the electron transport layer, and reach the back electrode 18 used as the negative electrode. On the other hand, the holes 24 are moved in the donor domain 26, are transferred through the hole transport layer 14, and reach the transparent electrode 12 used as the positive electrode.

In this embodiment, the donor domain 26 in the photoelectric conversion layer 16 contains the nanographene polymer (the photoelectric conversion material) having at least one structural unit selected from the nanographenes represented by the general formulae (16) to (29).

As is clear from the general formulae (18) to (31), the π-electron cloud spreads over the entire nanographene. The donor domain 26 contains the nanographene polymer having the structural unit of the nanographene. Thus, the π-electron cloud spreads over a wider area in the donor domain 26 than in the single nanographene (monomer).

The donor domain 26, which has such a sufficiently spread π-electron cloud, exhibits a maximum absorption wavelength shifted to the longer-wavelength side and has a high absorbance coefficient. Thus, the donor domain 26 exhibits a narrow bandgap corresponding to a small energy level difference between the HOMO and LUMO. Consequently, the excitons 32 are actively generated in the donor domain 26, resulting in a high sunlight utilization efficiency.

The π-electron number in the main chain skeleton of the nanographene polymer can be desirably controlled. Thus, the bandgap (the HOMO and LUMO energy levels) of the nanographene polymer can be desirably controlled. Therefore, in the case of using the nanographene polymer as the donor, the HOMO and LUMO energy levels of the nanographene polymer can be appropriately controlled depending on the acceptor. Consequently, the photoelectric conversion layer 16 with an excellent photoelectric power conversion efficiency can be easily formed.

In a case where the nanographene polymer has the solubilizing group as the side chain, the nanographene polymer can be dissolved more readily in the organic solvent. Therefore, in this case, the photoelectric conversion layer 16 can be formed easily and accurately, and the production efficiency and the photoelectric power conversion efficiency of the BHJ solar cell 10 can be improved.

Thus, only a smaller area of the BHJ solar cell 10 is required for achieving a desired power generation capacity in comparison with the other solar cells having the same power generation capacity. Consequently, the BHJ solar cell 10 can have a lighter weight and a smaller load on its installation site, so that the layout of the BHJ solar cell 10 can be designed more freely.

A method for producing the photoelectric conversion material (i.e. the nanographene polymer) according to this embodiment will be described below.

As described above, the nanographene polymer of this embodiment can be obtained as the reaction product from the polyphenylene prepared by polymerizing the monomers of the general formulae (1) and (2). An example, which contains reacting the polyphenylene (a) of FIG. 3 to produce a nanographene polymer (a), will be described hereinafter.

First, a dibenzyl ketone having the alkoxy ($OC_{10}H_{21}$) groups is prepared to produce the polyphenylene (a). Specifically, 4-hydroxybenzeneacetic acid methyl ester is reacted with 1-iododecane to obtain 4-decyloxybenzeneacetic acid methyl ester as shown in the following reaction formula (32).

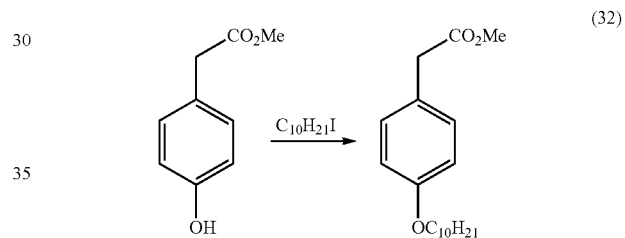

(32)

Then, lithium diisopropylamide (LDA) is added to 4-decyloxybenzeneacetic acid methyl ester, and hydrochloric acid is further added to the intermediate as shown in the following reaction formula (33). As a result, 1,3-didecyloxybenzene-2-propanone is prepared as the dibenzyl ketone having the alkoxy groups.

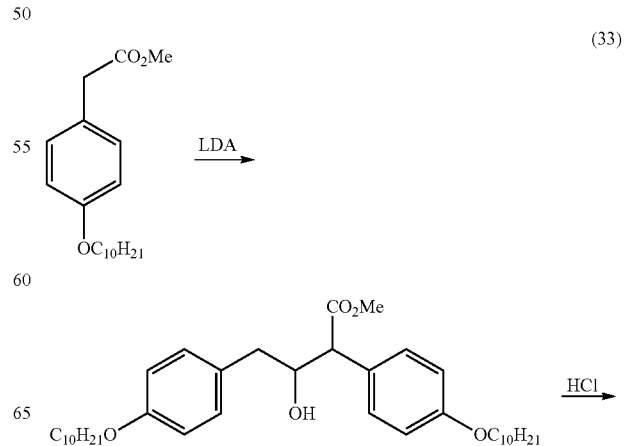

(33)

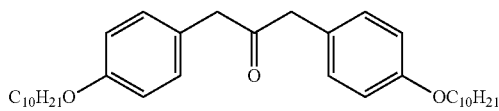

Then, 1,3-didecyloxybenzene-2-propanone and a 1,4-bis-benzil are reacted to prepare an alkoxylated 3,3'-(1,4-phenylene)bis(2,4,5-triphenyl-2,4-cyclopentadiene-1-one) (a) as the monomer represented by the general formula (1). Specifically, a methanol solution of Triton B is added to a solution containing 1,3-didecyloxybenzene-2-propanone, the 1,4-bisbenzil, and n-butanol under heating as shown in the following reaction formula (34). Triton B is benzyltrimethylammonium hydroxide. As a result, the 3,3'-(1,4-phenylene)bis(2,4,5-triphenyl-2,4-cyclopentadiene-1-one) (a) is prepared.

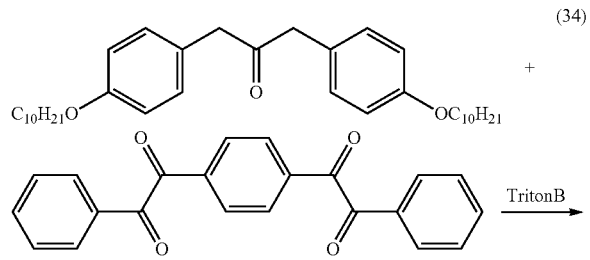
(34)

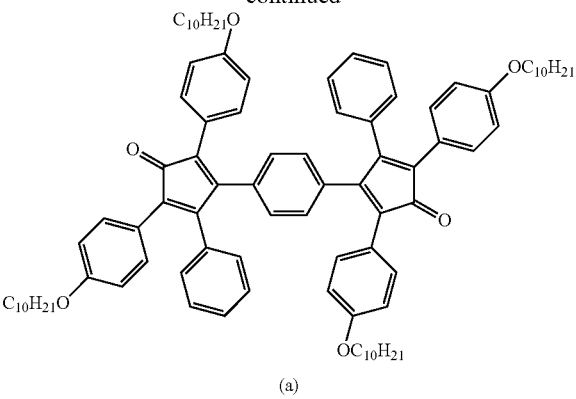
(a)

A Diels-Alder polymerization reaction of the thus-obtained 3,3'-(1,4-phenylene)bis(2,4,5-triphenyl-2,4-cyclopentadiene-1-one) (a) and 1,4-bis(1-propynyl)-2,5-didodecylbenzene (the monomer represented by the general formula (3)) is carried out as shown in the following reaction formula (35). As a result, the polyphenylene (a) is obtained. In this case, by reacting the 3,3'-(1,4-phenylene)bis(2,4,5-triphenyl-2,4-cyclopentadiene-1-one) (a) having alkoxy groups and the 1,4-bis(1-propynyl)-2,5-didodecylbenzene having the alkyl groups, the polyphenylene (a) can be efficiently obtained. Furthermore, the alkoxy groups and the alkyl groups can be introduced to the polyphenylene (a) in this manner, so that the solubility of the polyphenylene (a) in the organic solvent can be further increased.

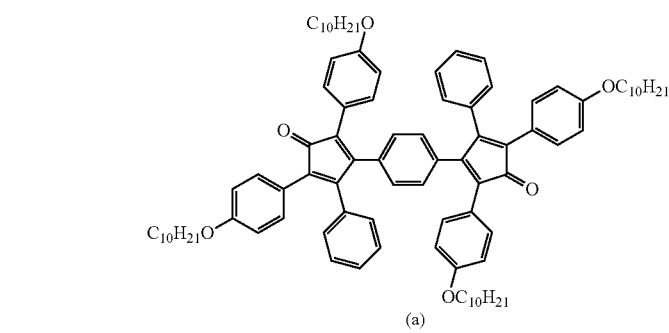
(a)

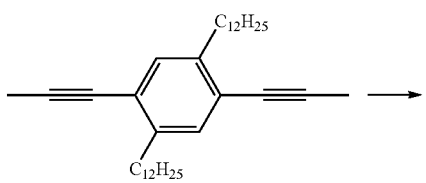

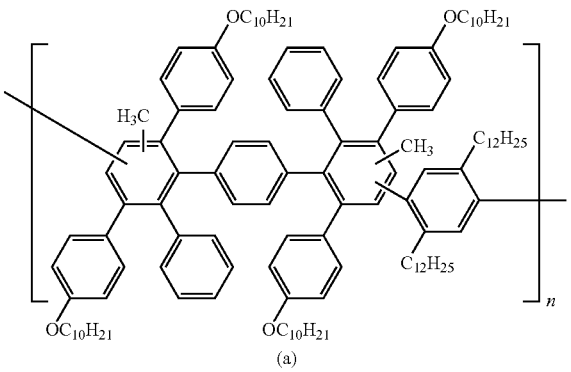
(a)

For example, thus-obtained polyphenylene (a) is reacted in the presence of a Lewis acid catalyst such as ferric chloride (FeCl$_3$) to produce the nanographene polymer (a) having the alkoxy and alkyl groups as shown in the following reaction formula (36). Specifically, the produced nanographene polymer (a) may be one of the above-described structural isomers having the OC$_{10}$H$_{21}$ groups in R17, R19, R20, and R22, the C$_{12}$H$_{25}$ groups in R23 and R24, and the CH$_3$ groups in R15 and R16 in the general formula (18) or (19).

Another example, which contains reacting the polyphenylene (b) of FIG. 4 to produce a nanographene polymer (b), will be described hereinafter.

It is a matter of course that the polyphenylenes having the moieties of the general formulae (8) and (9) are structural isomers of the polyphenylene (b), and therefore can be produced in the same manner as the polyphenylene (b). In addition, the nanographene polymers having the moieties of the general formulae (20) to (23) can be produced from the polyphenylenes having the moieties of the general formulae

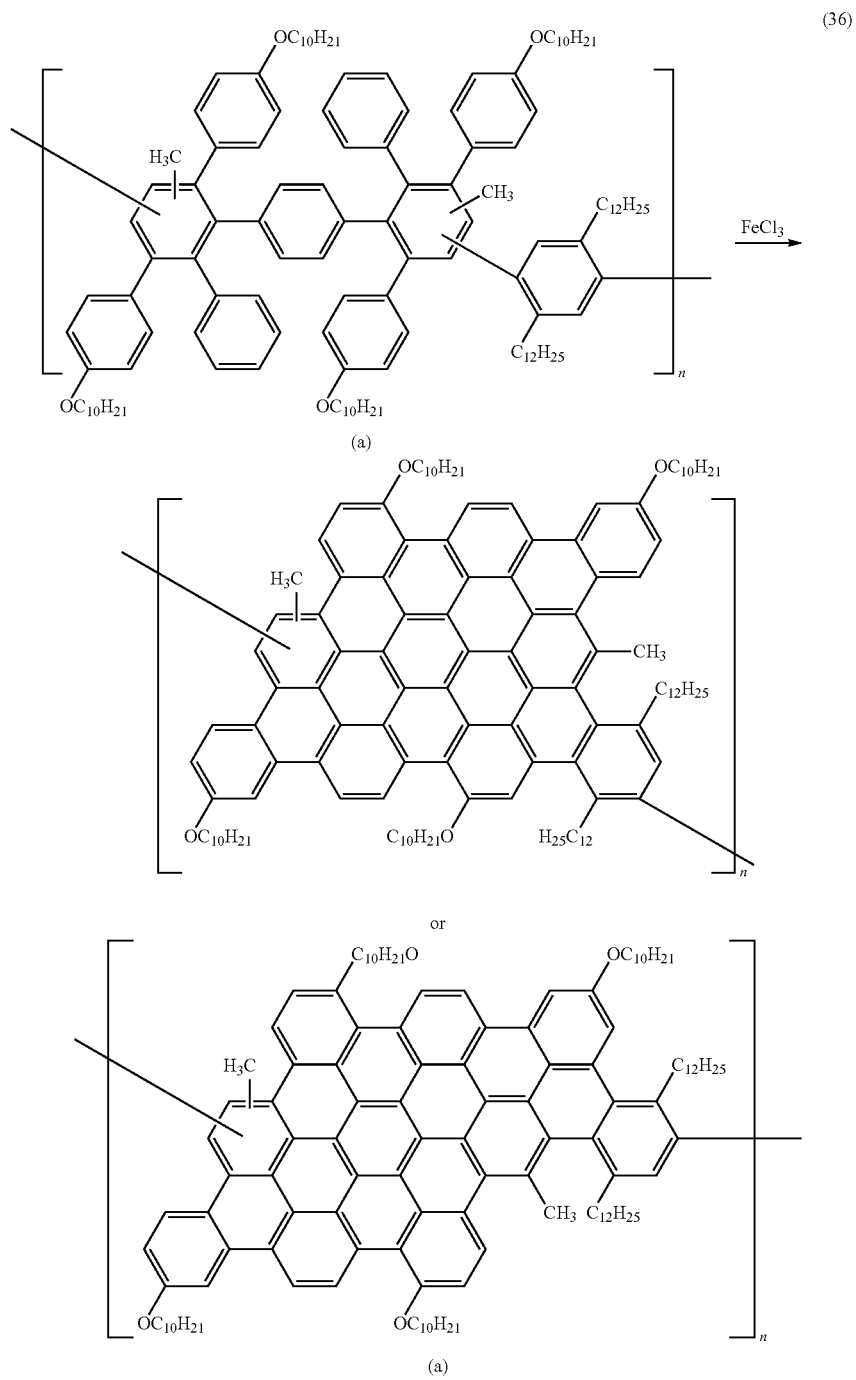

(8) and (9) in the same manner as the production of the nanographene polymer (b) from the polyphenylene (b).

First, a dibenzyl ketone having the alkoxy ($OC_{10}H_{21}$) groups and a 1,4-bisbenzil having the alkoxy ($OC_{10}H_{21}$) groups are prepared in order to produce the polyphenylene (b).

Specifically, the dibenzyl ketone having the alkoxy groups is prepared as shown in the above reaction formulae (32) and (33).

Meanwhile, in the preparation of the 1,4-bisbenzil having the alkoxy groups, iodophenol is reacted with bromodecane to obtain 1-decyloxy-4-iodobenzene as shown in the following reaction formula (37).

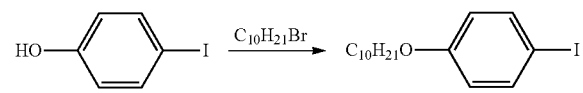

(37)

Then, 1-decyloxy-4-iodobenzene and 1,4-diethynylbenzene are reacted to obtain 1,4-bis(decyloxyphenylethynyl) benzene as shown in the following reaction formula (38).

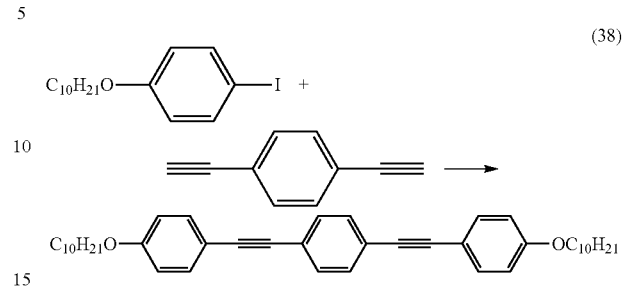

(38)

1,4-bis(decyloxyphenylethynyl)benzene is oxidized using a catalyst such as a palladium (Pd) complex to prepare the 1,4-bisbenzil having the alkoxy groups as shown in the following reaction formula (39).

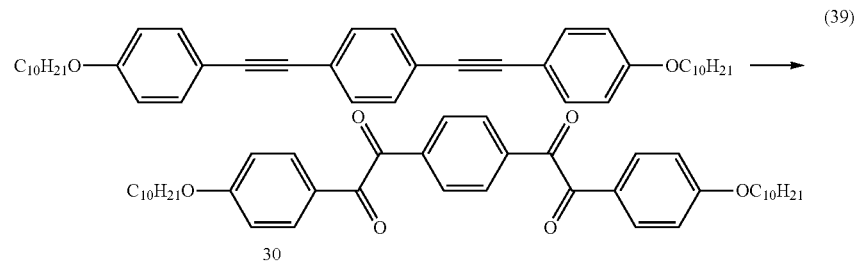

(39)

1,3-didecyloxybenzene-2-propanone and the alkoxylated 1,4-bisbenzil thus obtained are reacted. Thus, a methanol solution of Triton B is added to a solution containing 1,3-didecyloxybenzene-2-propanone, the alkoxylated 1,4-bisbenzil, and n-butanol under heating as shown in the following reaction formula (40). As a result, an alkoxylated 3,3'-(1,4-phenylene)bis(2,4,5-triphenyl-2,4-cyclopentadiene-1-one) (b) (the monomer represented by the general formula (1)) is prepared.

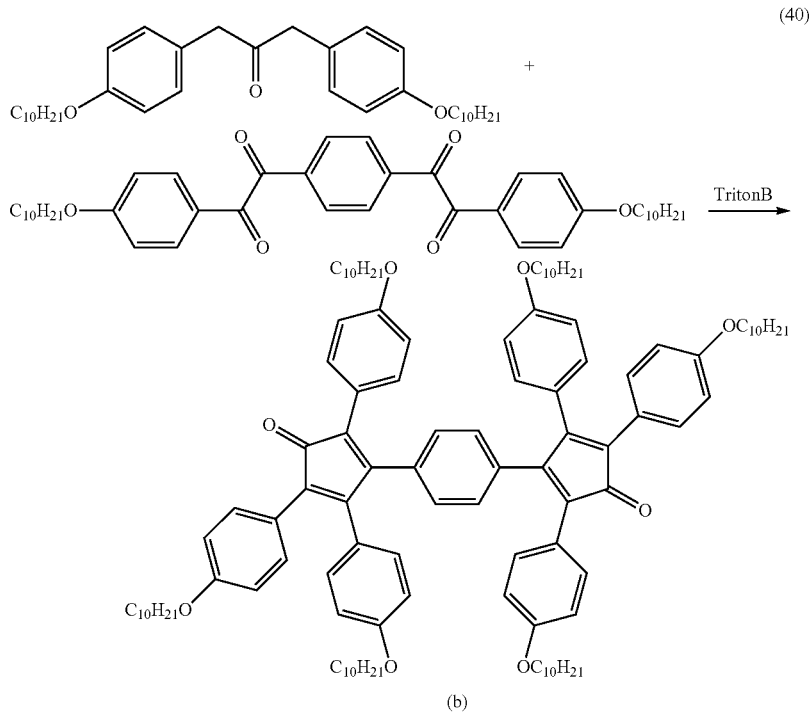

(40)

(b)

A Diels-Alder polymerization reaction of the 3,3'-(1,4-phenylene)bis(2,4,5-triphenyl-2,4-cyclopentadiene-1-one) (b) and 4,4'-bis(decyloxyphenylethynyl)biphenyl (the monomer represented by the general formula (4)) is carried out as shown in the following reaction formula (41). As a result, the polyphenylene (b) is obtained.

Then, 1-decyloxy-4-iodobenzene and 4,4'-diethynylbiphenyl are reacted in the presence of a catalyst in a solvent as shown in the following reaction formula (42). The solvent may be tetrahydrofuran (THF:$C_4H_8O$). The catalyst may contain bis(triphenylphosphine) palladium (II) dichloride (($Ph_3P)_2PbCl_2$), copper iodide (CuI), and diethylamine ($Et_2NH$). Thus, 4,4'-bis(decyloxyphenylethynyl)biphenyl is obtained by the reaction.

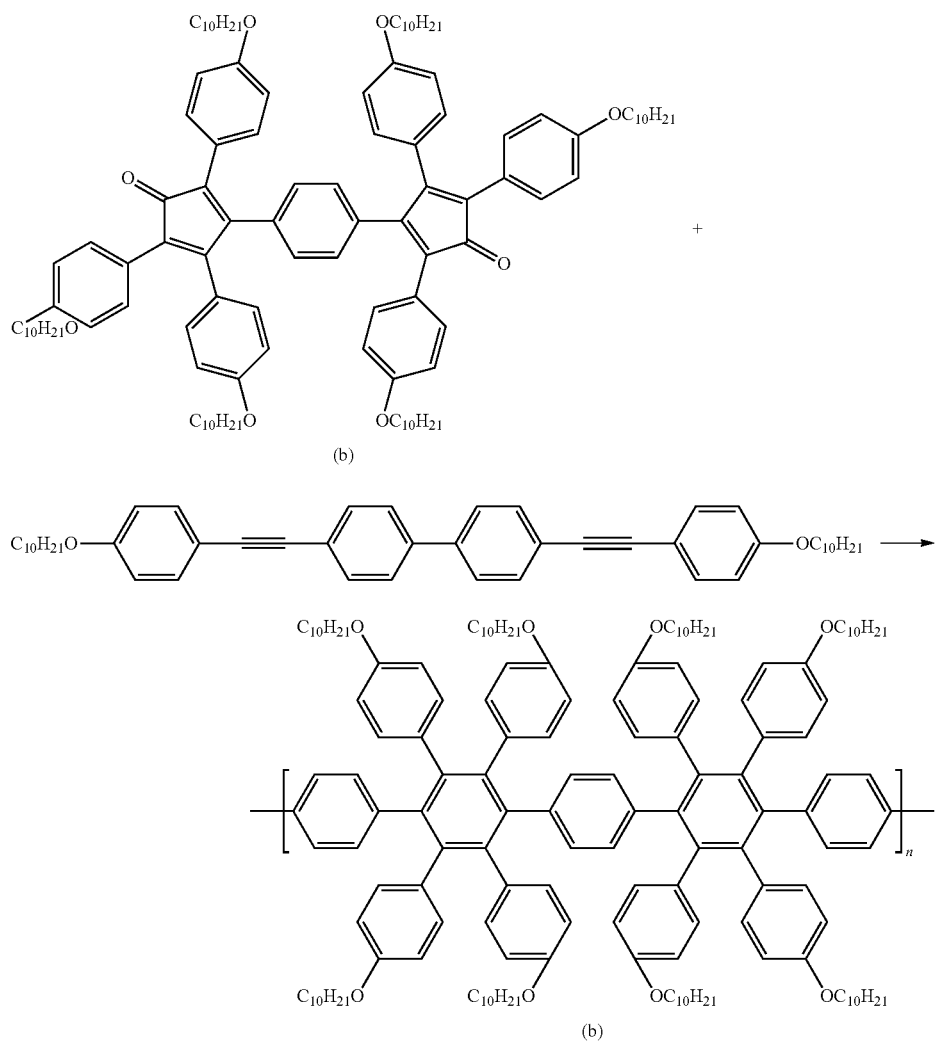

(41)

(b)

4,4'-bis(decyloxyphenylethynyl)biphenyl can be prepared as follows. First, iodophenol is reacted with bromodecane to obtain 1-decyloxy-4-iodobenzene as shown in the above reaction formula (37).

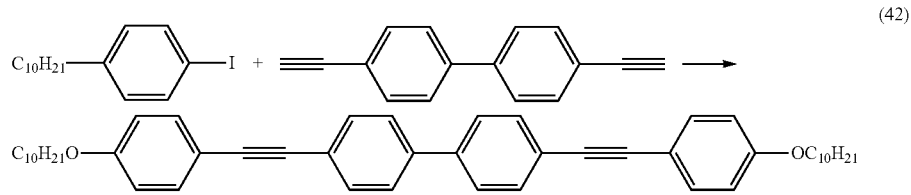

(42)

For example, thus-obtained polyphenylene (b) is reacted in the presence of a Lewis acid catalyst such as ferric chloride (FeCl$_3$) to produce the nanographene polymer (b) as shown in the following reaction formula (43). Thus, the nanographene polymer (b) has the structural unit of the nanographene having the OC$_{10}$H$_{21}$ groups in R25 to R32 in the general formula (20).

The π-electron number (the number of the double bonds in the condensed carbocyclic ring structure in the main chain skeleton) of the nanographene polymer can be easily controlled by changing the polymerization ratio, composition, structure, or the like of the monomer represented by the general formula (1) or (2).

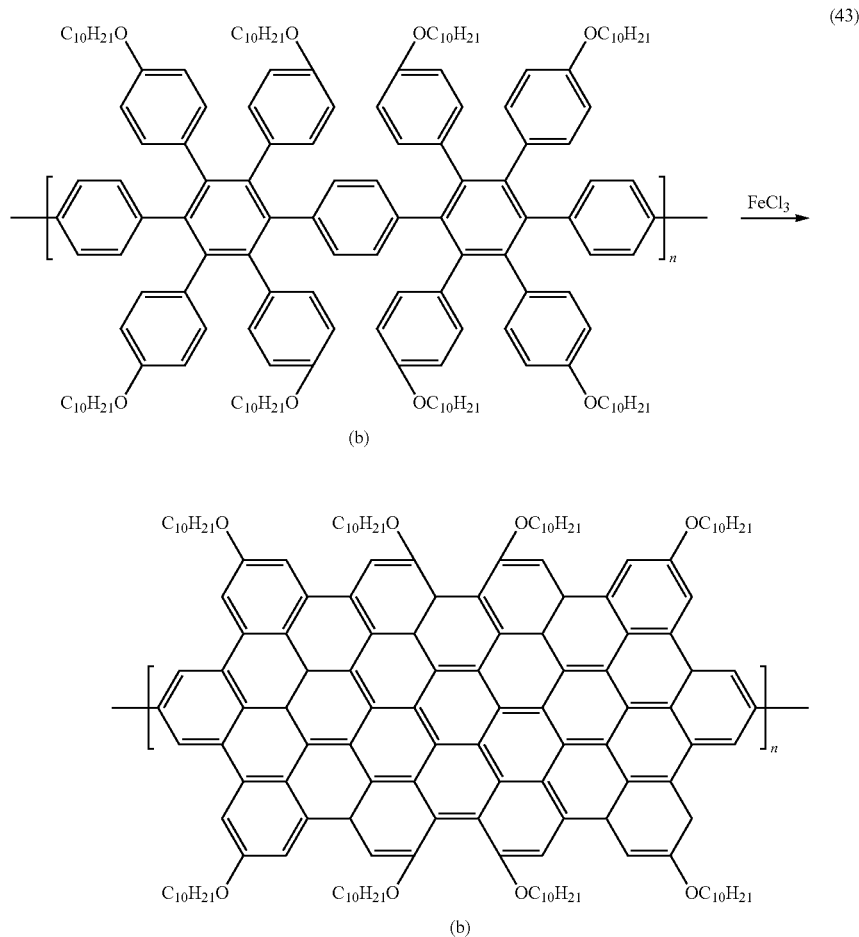

(43)

(b)

(b)

Since the polyphenylenes (a) and (b) have the solubilizing groups as described above, coupling of the structural units (intermolecular coupling) is inhibited in the above reactions. Therefore, all the carbocyclic rings in each of the structural units can be reacted, while preventing the cross-linking between the structural units, for example, by controlling the amount of the ferric chloride catalyst. Consequently, the π-electron cloud can be sufficiently spread over the structural units in each of the condensed carbocyclic ring nanographene polymers (a) and (b). Each structural unit in the main chain skeleton of the nanographene polymer (a) contains 60 π-electrons delocalized in the condensed carbocyclic ring structure, and each structural unit in the main chain skeleton of the nanographene polymer (b) contains 78 π-electrons delocalized in the condensed carbocyclic ring structure.

The polymerization degree of the nanographene polymer can be controlled, preferably within a range of 2 to 150, e.g., by appropriately selecting the ratio of the monomer, the reaction time, and/or the reaction temperature in the polymerization. Thus, the photoelectric conversion material (nanographene polymer) having a sufficiently-improved absorbance coefficient can be efficiently produced.

Figure 5:
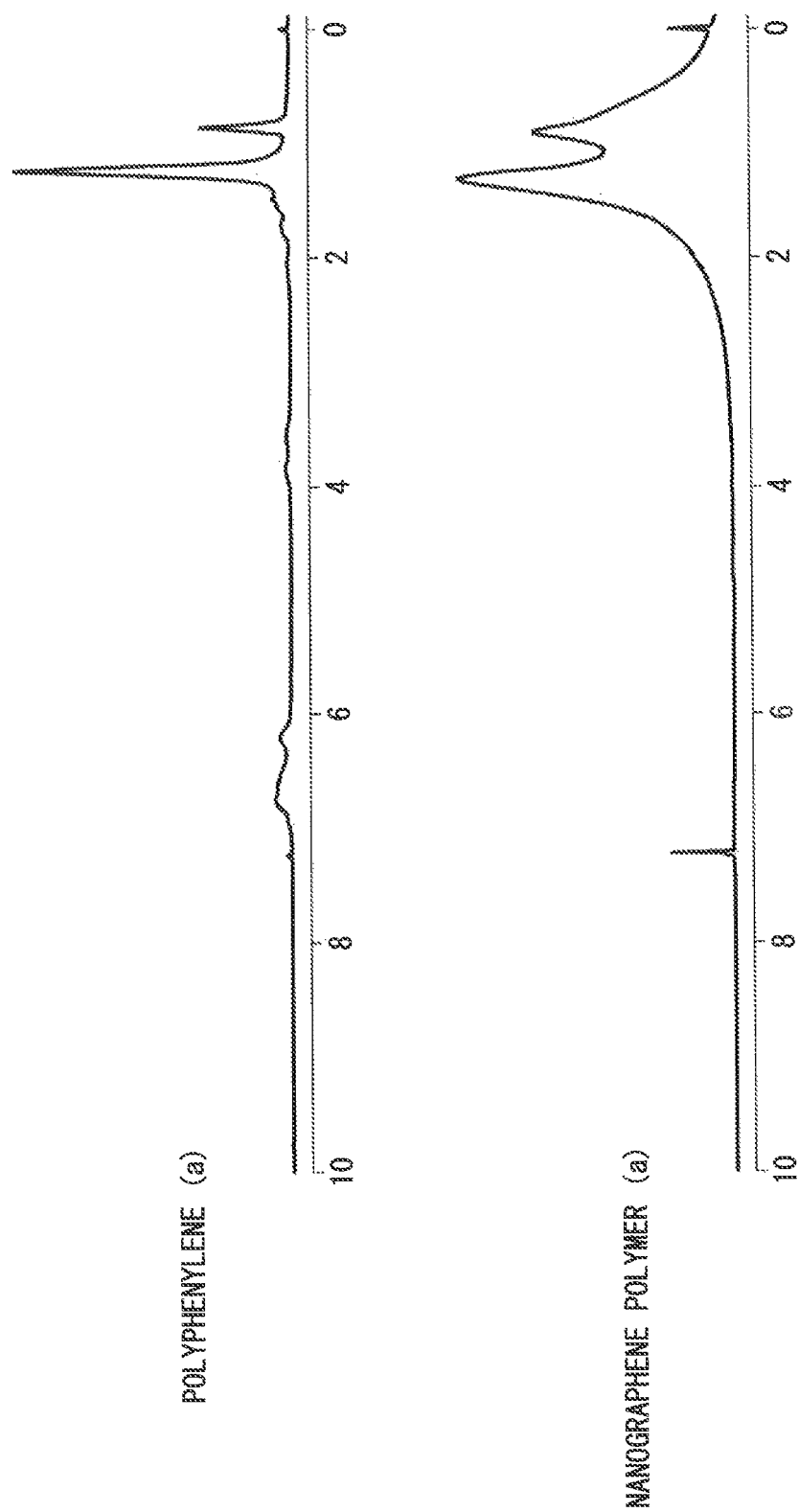
FIG. 5 is a diagram including $^1$H-nuclear magnetic resonance (NMR) spectra of the polyphenylene (a) and a nanographene polymer (a)

FIG. 5 is a diagram including $^1$H-nuclear magnetic resonance (NMR) spectra of the polyphenylene (a) and the nanographene polymer (a). In the spectra, peaks of the hydrogen atoms in the alkoxy groups are observed within a range of 0 to 2 ppm, and peaks of the hydrogen atoms in the phenyl groups are observed within a range of 6 to 8 ppm.

As shown in FIG. 5, the peaks of the hydrogen atoms in the alkoxy groups are observed in the spectrum of the polyphenylene (a), and are observed also in the spectrum of the nanographene polymer (a). It is clear that the nanographene polymer (a) having the alkoxy groups can be produced by the reaction of the polyphenylene (a) having the alkoxy groups.

The peaks of the hydrogen atoms in the phenyl groups are observed in the spectrum of the polyphenylene (a), but are not observed in the spectrum of the nanographene polymer (a). It is clear that the phenyl groups in the structural units of the polyphenylene (a) are reacted with each other to form the condensed carbocyclic ring structure in the nanographene polymer (a). Thus, the π-conjugated system is sufficiently expanded in the nanographene polymer (a).

Figure 6:
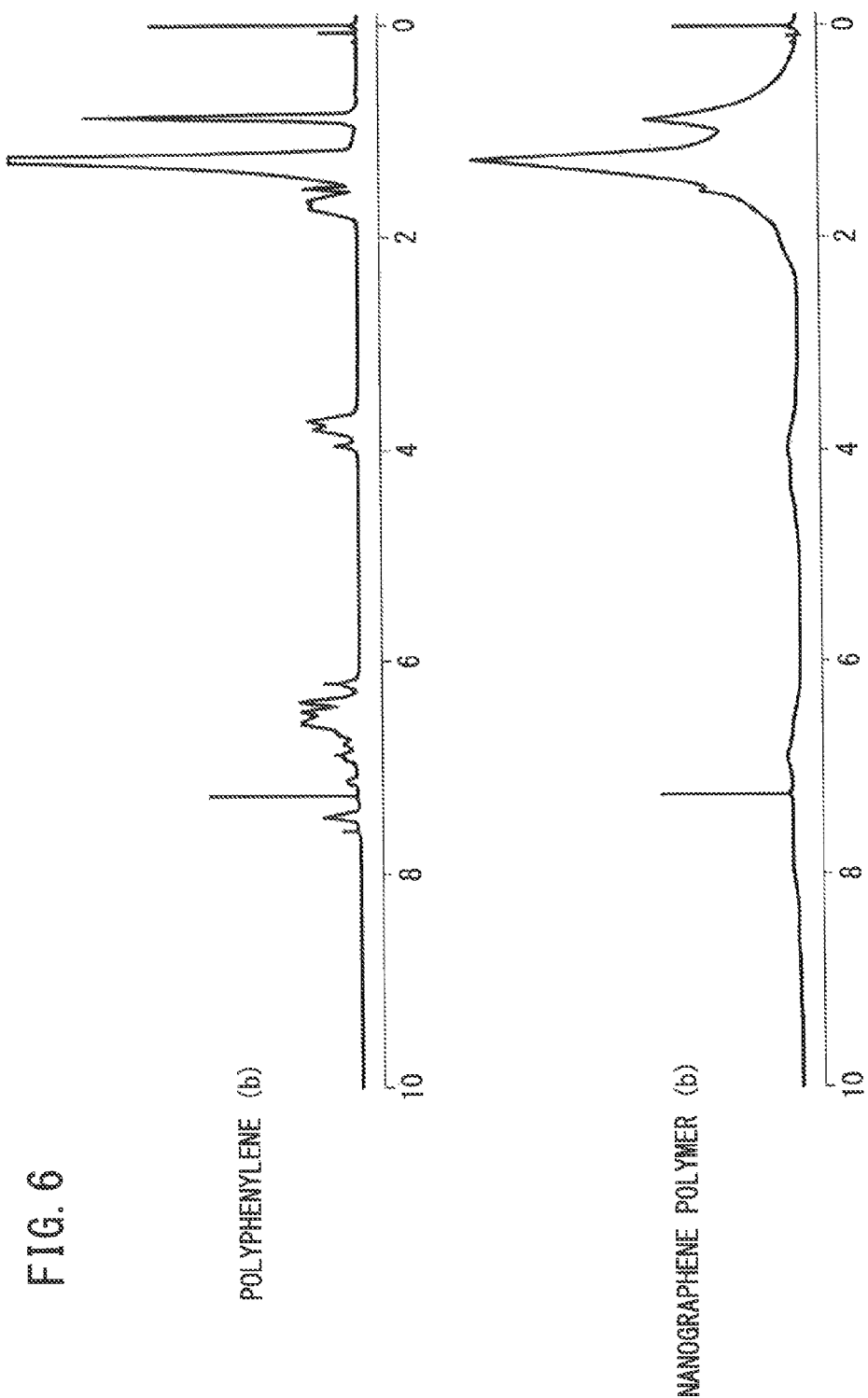
FIG. 6 is a diagram including magnetic resonance (NMR) spectra of the polyphenylene (b) and a nanographene polymer (b)

FIG. 6 is a diagram including $^1$H-nuclear magnetic resonance (NMR) spectra of the polyphenylene (b) and the nanographene polymer (b). In the spectra, peaks of the hydrogen atoms in the alkoxy groups are observed within a range of 0 to 2 ppm, and peaks of the hydrogen atoms in the phenyl groups are observed within a range of 6 to 8 ppm.

As shown in FIG. 6, it is clear that the nanographene polymer (b) having the alkoxy groups can be produced by the reaction of the polyphenylene (b) having the alkoxy groups in the same manner as the production of the nanographene polymer (a) from the polyphenylene (a). In addition, the π-conjugated system is sufficiently expanded in the nanographene polymer (b).

Figure 7:
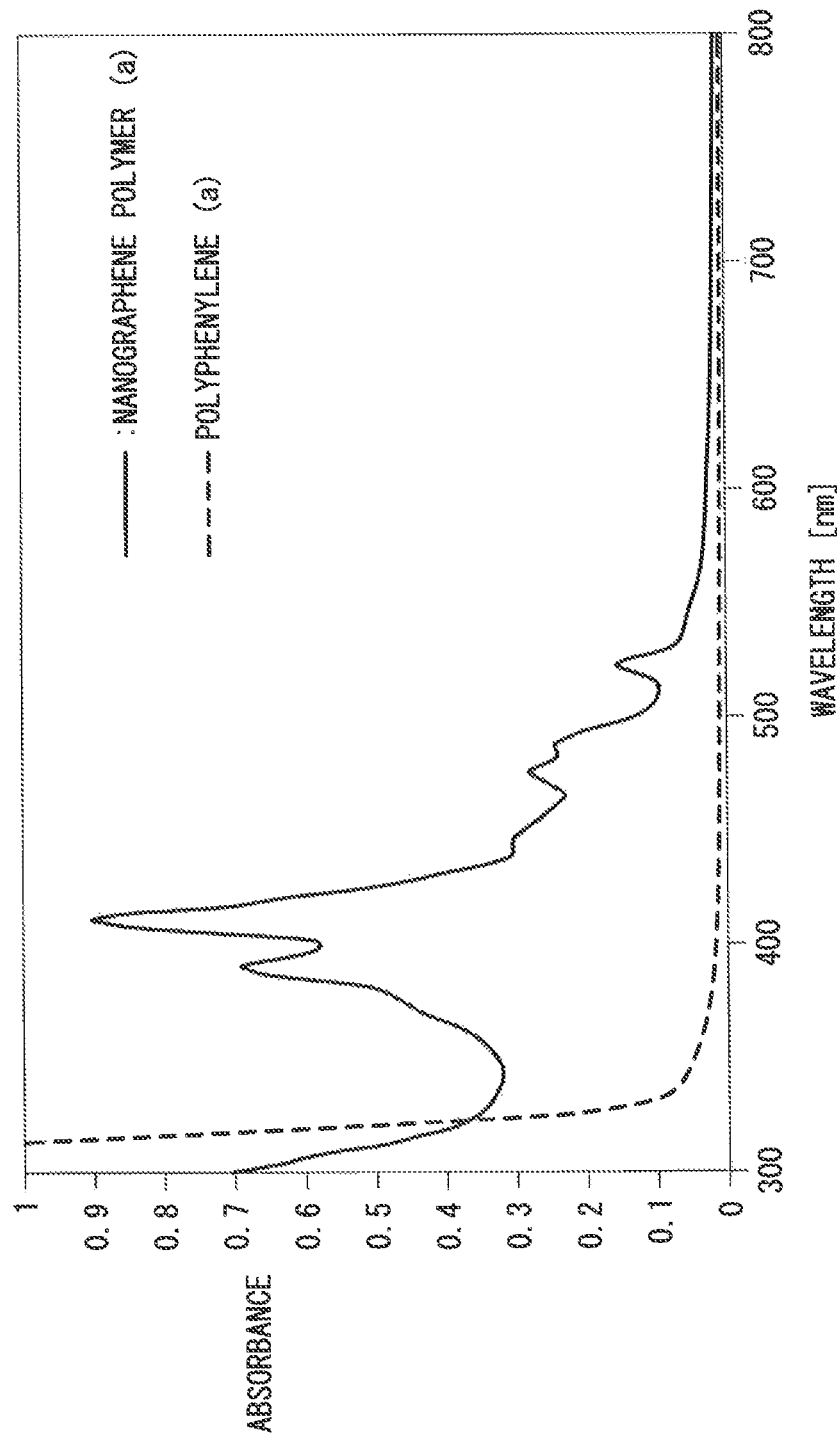
FIG. 7 is a diagram including absorption spectra obtained by ultraviolet-visible spectroscopy concerning the polyphenylene (a) and the nanographene polymer (a)
Figure 8:
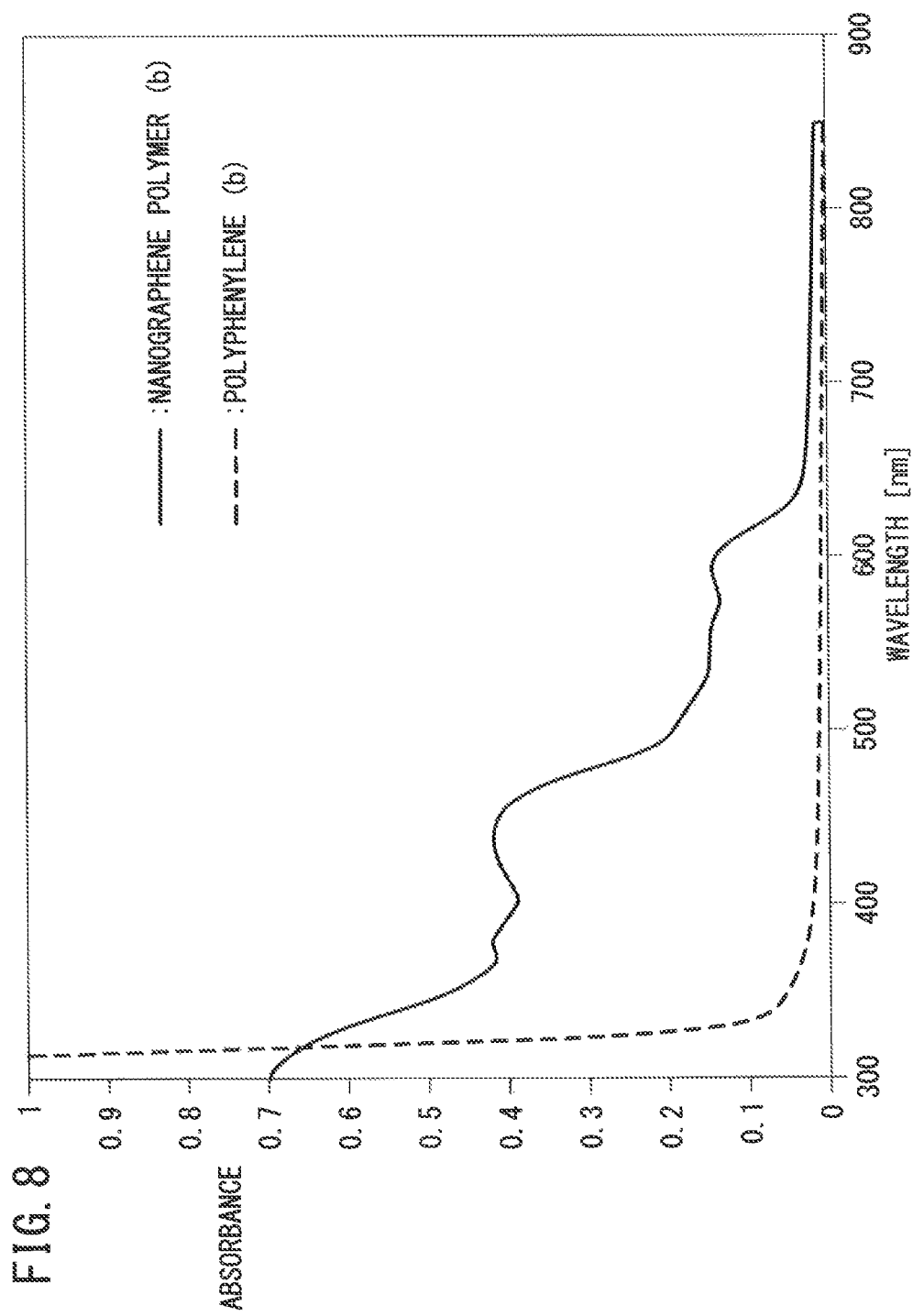
FIG. 8 is a diagram including absorption spectra obtained by ultraviolet-visible spectroscopy concerning the polyphenylene (b) and the nanographene polymer (b)

FIG. 7 is a diagram including ultraviolet-visible (UV-Vis) absorption spectra of the polyphenylene (a) and the nanographene polymer (a), and FIG. 8 is a diagram including ultraviolet-visible (UV-Vis) absorption spectra of the polyphenylene (b) and the nanographene polymer (b).

As shown in FIGS. 7 and 8, the long-wavelength absorption edges of the polyphenylenes (a) and (b) are observed at about 330 nm, while the long-wavelength absorption edge of the nanographene polymer (a) is observed at about 585 nm and the long-wavelength absorption edge of the nanographene polymer (b) is observed at about 650 nm. Thus, the maximum absorption wavelengths of the nanographene polymers (a) and (b) are shifted to the longer-wavelength side as compared with the long-wavelength absorption edges (i.e., the maximum absorption wavelengths) of the polyphenylenes (a) and (b). In general, in a π-conjugated system, as the molecular weight and the π-electron number is increased, the maximum absorption wavelength is shifted to the longer-wavelength side and the light absorption region is expanded to the visible region. Thus, it is clear also from FIGS. 7 and 8 that each of the nanographene polymers (a) and (b) has the condensed carbocyclic ring structure with the π-electron cloud sufficiently spread over the structural units, and the π-conjugated system is sufficiently expanded.

The other nanographene polymers having various structural units, as well as the nanographene polymers (a) and (b), can be produced by controlling the molar ratio, composition, structure, or the like of each monomer represented by the general formula (1) or (2) in the polymerization step.

A method for producing a nanographene polymer having the nanographene of the general formula (18) with hydrogen atoms in all of R15 to R24 (the unsubstituted nanographene) will be described below. This nanographene polymer is hereinafter referred to also as the nanographene polymer (c). In this method, in the step of preparing the nanographene polymer (a), an unsubstituted 3,3'-(1,4-phenylene)bis(2,4,5-triphenyl-2,4-cyclopentadiene-1-one) may be used instead of the 3,3'-(1,4-phenylene)bis(2,4,5-triphenyl-2,4-cyclopentadiene-1-one) (a) shown in the reaction formula (35).

Thus, a Diels-Alder polymerization reaction of the unsubstituted 3,3'-(1,4-phenylene)bis(2,4,5-triphenyl-2,4-cyclopentadiene-1-one) and 1,4-bis(1-propynyl)-2,5-didodecylbenzene (the monomer represented by the general formula (3)) is carried out to prepare a polyphenylene (c). Then, the polyphenylene (c) is reacted in the presence of a Lewis acid catalyst such as ferric chloride (FeCl$_3$) to produce the nanographene polymer (c).

A method for producing a nanographene polymer (d) having the nanographene of the general formula (18) with octyl groups as alkyl groups in R17 to R19 and R20 to 22 will be described below. In this method, the polyphenylene (c) is prepared in the above manner, and thereafter acyl groups are introduced to the polyphenylene (c) as the side chains. Specifically, the acyl groups are introduced to the positions of R17 to R19 and R20 to R22 in the general formula (6). For example, the polyphenylene (c) is acylated using a carboxylic acid chloride as an acylating agent in the presence of an aluminum chloride (AlCl$_3$) catalyst as shown in the following reaction formula (44).

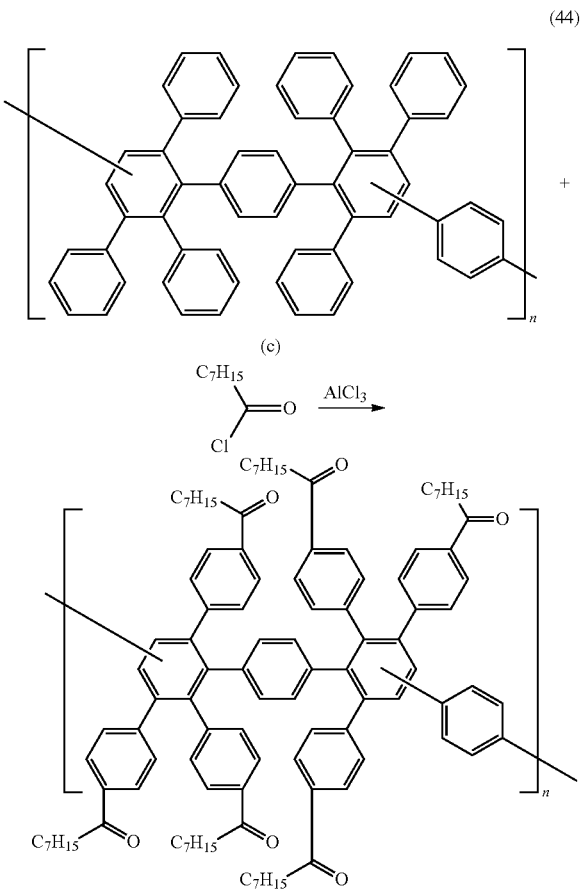

(44)

Then, for example, the acylated polyphenylene (c) is reduced using lithium aluminum hydride (LiAlH$_4$) and aluminum chloride as reducing agents as shown in the following reaction formula (45). As a result, a polyphenylene (d) having the octyl groups in R17 to R19 and R20 to R22 in the general formula (6) is obtained.

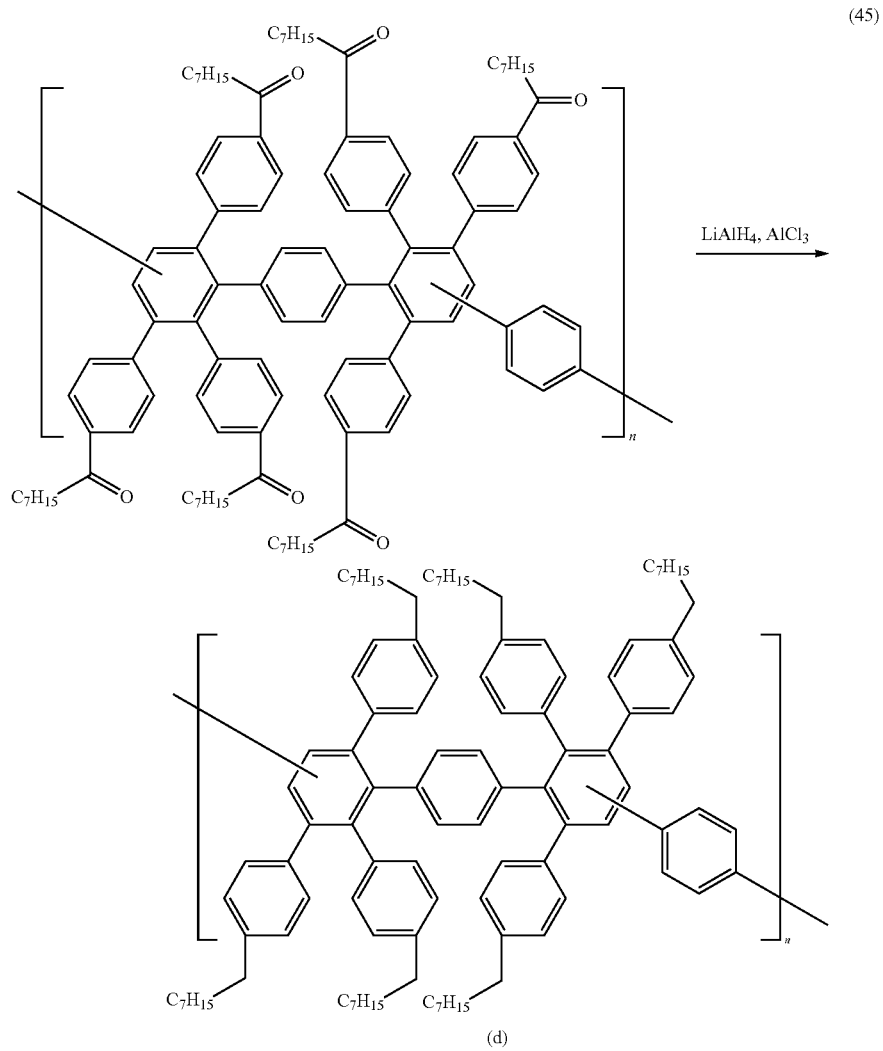
(45)
The polyphenylene (d) is reacted in the presence of a Lewis acid catalyst such as ferric chloride ($FeCl_3$) to produce the nanographene polymer (d) as shown in the following reaction formula (46).
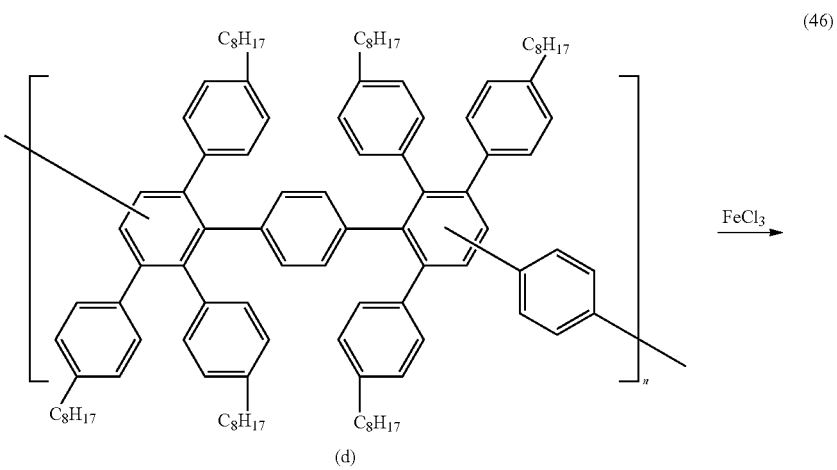
(46)

-continued

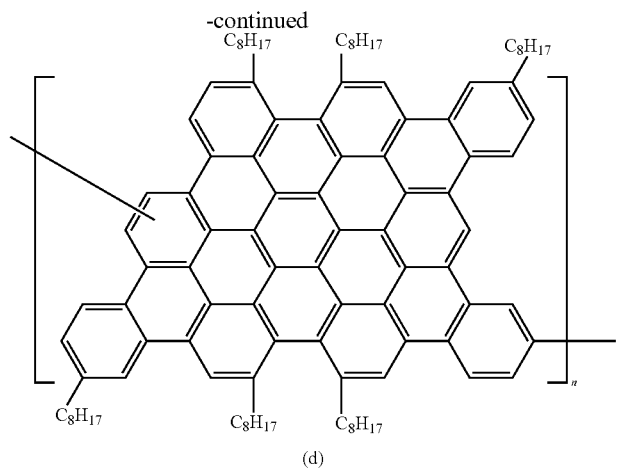

(d)

Figure 9:
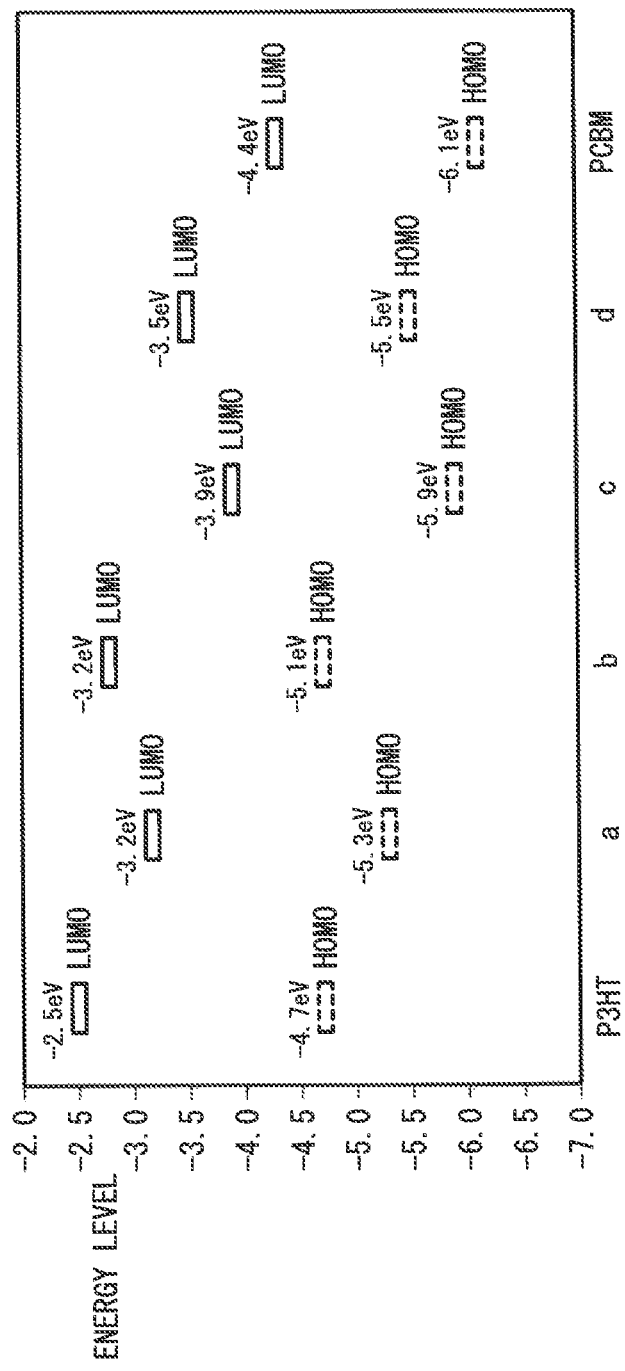
FIG. 9 is an energy level diagram showing the HOMO and LUMO energy levels of nanographene polymers (a), (b), (c), and (d), P3HT, and PCBM.
Figure 11:
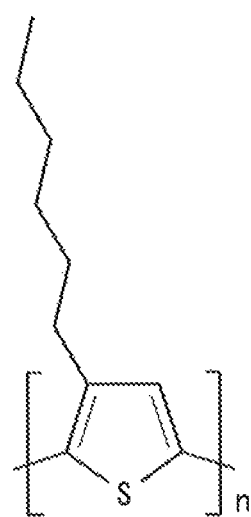
FIG. 11 is an explanatory view of a structural formula of P3HT.
Figure 12:
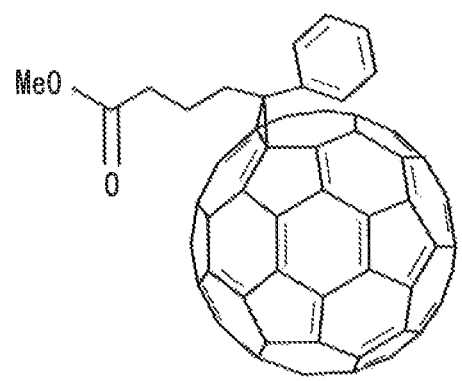
FIG. 12 is an explanatory view of a structural formula of PCBM.
Figure 13:
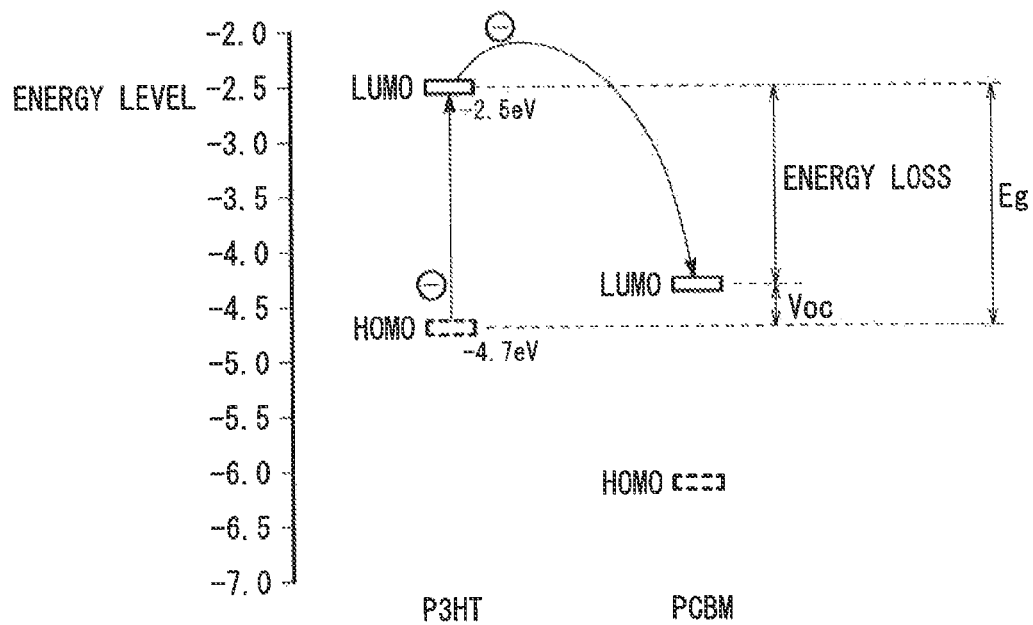
FIG. 13 is a schematic explanatory view for illustrating electron transition from the HOMO of P3HT through the LUMO of P3HT to the LUMO of PCBM.

FIG. 9 is a diagram showing the HOMO and LUMO energy levels of the nanographene polymers (a), (b), (c), and (d), P3HT, and PCBM, measured by an ultraviolet-visible absorption spectroscopic analysis (UV-Vis) and a photoelectron yield spectroscopic analysis (PYS).

As shown in FIG. 9, the nanographene polymers (a), (b), (c), and (d) have bandgaps (corresponding to the HOMO-LUMO energy level differences) of 2.1, 1.9, 2.0, and 2.0 eV respectively, and P3HT has a bandgap of 2.2 eV. Thus, the bandgaps of the nanographene polymers (a) to (d) are narrower than that of P3HT.

The nanographene polymers (a), (b), (c), and (d) have LUMO energy levels of about −3.2, −3.2, −3.9, and −3.5 eV respectively, and P3HT has a LUMO energy level of about −2.5 eV. Thus, the LUMO energy levels of the nanographene polymers (a) to (d) are lower than that of P3HT and closer to that of PCBM (a fullerene derivative) than that of P3HT. This is likely because the structural units of the nanographenes (a) to (d) in the nanographene polymers (a) to (d) each have the condensed carbocyclic ring structure with a carbocyclic hydrocarbon ring as a basic skeleton, which is similar to the structure of PCBM. Therefore, in the BHJ solar cell 10 including the photoelectric conversion layer 16 using one of the nanographene polymers (a) to (d) as the donor and the PCBM as the acceptor, the open circuit voltage Voc can be higher than that in a case of the layer using the P3HT as the donor.

In addition, the π-electron number of the nanographene polymer can be controlled such that the nanographene polymer can have an optimum photoelectric power conversion efficiency suitable for various materials of acceptors as is the case of using the PCBM as the acceptor. Consequently, the photoelectric conversion layer can be easily formed with an excellent power conversion efficiency.

Similarly, in the case of using the nanographene polymer as the acceptor, the bandgap (the HOMO and LUMO energy levels) of the nanographene polymer can be controlled such that the nanographene polymer can have an optimum property suitable for various donors.

The photoelectric conversion layer 16 containing the nanographene polymer as the donor can be formed as follows. First, a mixture of the nanographene polymer and PCBM is added to an appropriate solvent such as toluene, chloroform, chlorobenzene, or the like. Alternatively, the nanographene polymer and PCBM may be separately added to the solvent. Since the nanographene polymer and PCBM can be readily dissolved in the organic solvent, a mixture solution can be easily prepared.

The mixture solution is applied onto the hole transport layer 14 by a spin coating process, an ink-jet printing process, a roll casting process, a roll-to-roll process, or the like.

The applied mixture solution on the hole transport layer 14 is hardened under heating, whereby the photoelectric conversion layer 16 is formed. The photoelectric conversion layer 16 may be subjected to an annealing treatment if necessary. In the annealing treatment, the phase separation between the donor domain 26 and the acceptor domain 28 can be further improved, and the joint interface area between the donor domain 26 and the acceptor domain 28 can be increased to improve the power generation function.

In a case where a monomer is used as the donor, it is difficult to use the above process for forming the photoelectric conversion layer 16 because of the low solubility of the monomer in the organic solvent. In contrast, in this embodiment, the nanographene polymer having the solubilizing group is used as the donor as described above. Since the nanographene polymer is readily soluble in a predetermined solvent, the photoelectric conversion layer 16 can be simply formed with ease at low cost by the above process. Furthermore, since the phase separation between the donor domain 26 and the acceptor domain 28 can be further facilitated, the photoelectric power conversion efficiency of the BHJ solar cell 10 can be improved.

As described above, the nanographene polymer of this embodiment has the π-conjugated system with the widely spread π-electron cloud, and therefore has a high absorbance coefficient. Furthermore, the nanographene polymer can satisfactorily absorb the long-wavelength (near-infrared) light to improve the sunlight utilization efficiency. In addition, the nanographene polymer has a narrow bandgap and a low HOMO energy level. Thus, the LUMO energy level of the nanographene polymer is close to that of PCBM.

Therefore, in the BHJ solar cell 10 using the nanographene polymer as the donor and the PCBM as the acceptor, the excitons 32 can be actively generated. Furthermore, the BHJ solar cell 10 can exhibit a high open circuit voltage Voc. Thus, the photoelectric power conversion efficiency can be improved suitably.

The present invention is not limited to the above embodiment, and various changes and modifications may be made therein without departing from the scope of the invention.

In the above embodiment, the nanographene polymer having the structural unit of the nanographene represented by one of the general formulae (18) to (31) is prepared from the monomers represented by the general formulae (1) and (2). However, the nanographene polymer is not limited thereto, and may have an appropriate π-electron number selected depending on a desired bandgap (HOMO and LUMO energy levels).

In the above embodiment, the nanographene polymers (a) and (b) have the straight chain alkoxy ($OC_{10}H_{21}$) groups as the side chain solubilizing groups. A nanographene polymer having branched alkoxy groups instead of the straight chain alkoxy groups may be produced as follows.

2-ethylhexyl iodide is used instead of 1-iododecane in the reaction formula (32) in the production of the nanographene polymer (a). As a result, a nanographene polymer, which has the same structure as the nanographene polymer (a) except for using the branched alkoxy groups instead of the straight chain alkoxy groups, can be produced.

2-ethylhexyl bromide is used instead of bromodecane in the reaction formula (37) in the production of the nanographene polymer (b). As a result, a nanographene polymer, which has the same structure as the nanographene polymer (b) except for using the branched alkoxy groups instead of the straight chain alkoxy groups, can be produced.

In the above embodiment, the monomer of the general formula (2) is represented by one of the general formulae (3) to (5). The monomer of the general formula (2) is not limited thereto, and may be selected from those represented by the following general formulae (47) to (50).

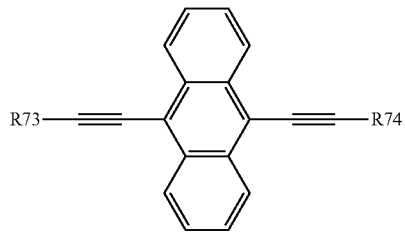
(47)

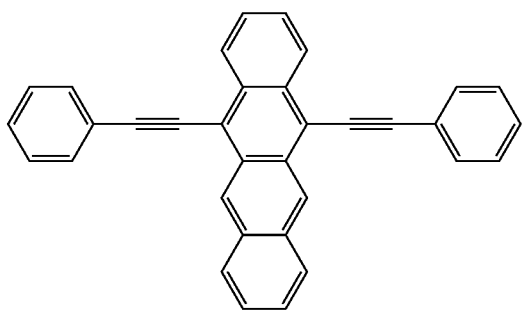
(48)

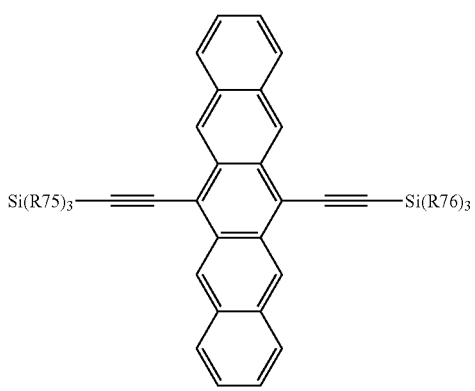
(49)

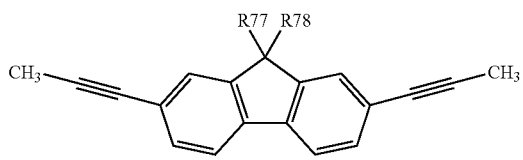
(50)

R73, R74, R77, and R78 in the general formulae (47) and (50) independently represent a hydrogen atom, an unsubstituted or substituted aromatic group, a methyl group, or a silyl group, and R75 and R76 in the general formula (49) independently represent an alkyl group.

In a case where the monomer represented by the general formula (1) and the monomer represented by one of the general formulae (47) to (50) are polymerized at a molar ratio of 1:1, the resultant polyphenylene has a structural unit represented by one of the following general formulae (51) to (54).

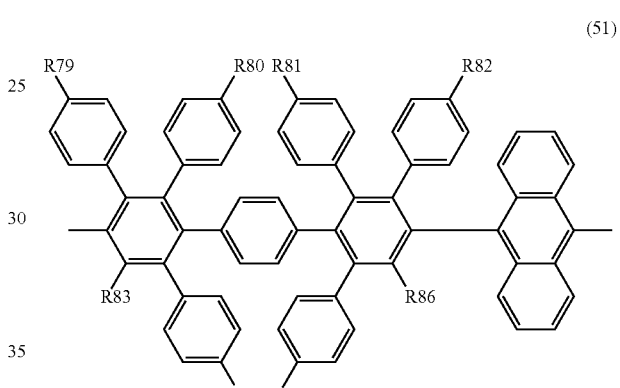
(51)

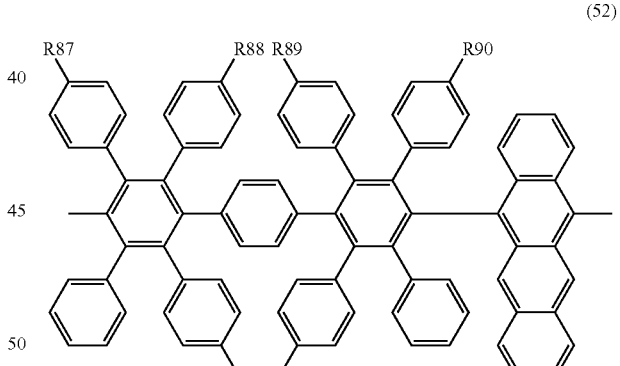
(52)

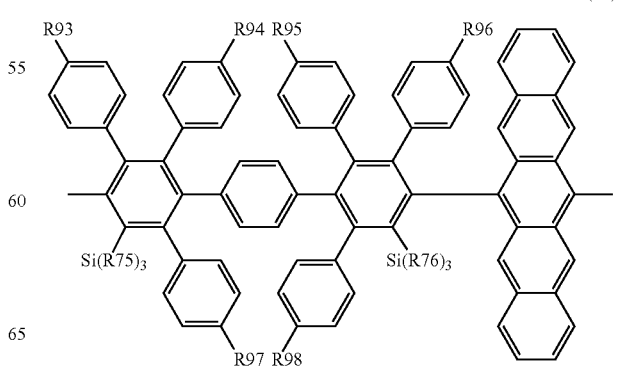
(53)

(54)

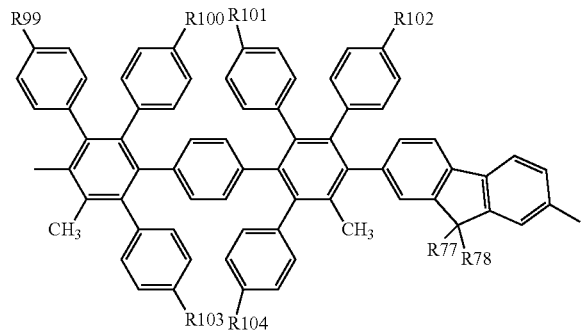

R79 to R104 in the general formulae (51) to (54) independently represent a hydrogen atom or a solubilizing group, and the moiety represented by one of the general formulae (51) to (54) exhibits a higher solubility in an organic solvent with the solubilizing group than without the solubilizing group. R75 and R76 in the general formula (53) independently represent an alkyl group, and R77 and R78 in the general formula (54) independently represent a hydrogen atom, an unsubstituted or substituted aromatic group, a methyl group, or a silyl group.

In a case where this polyphenylene is further reacted, the resultant nanographene polymer has a structural unit selected from nanographenes represented by the following general formulae (55) to (58) having π-electron numbers of 52, 68, 60, and 54 respectively.

(55)

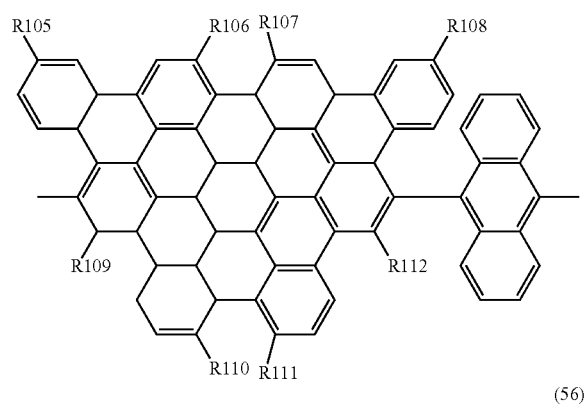

(56)

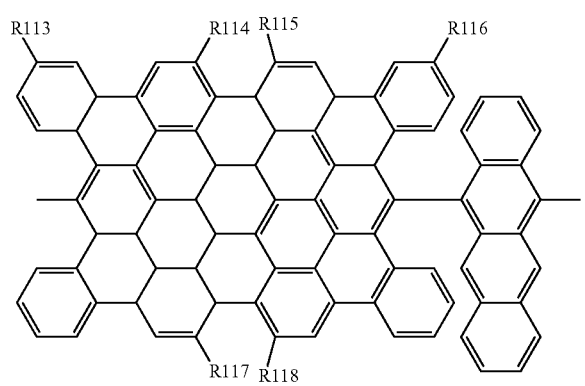

(57)

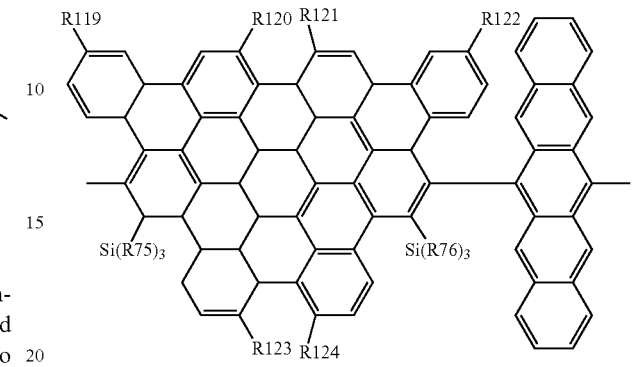

(58)

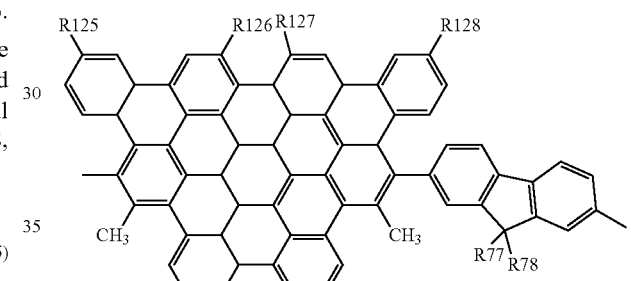

R105 to R130 in the general formulae (55) to (58) independently represent a hydrogen atom or a solubilizing group, and the graphene represented by one of the general formulae (55) to (58) exhibits a higher solubility in an organic solvent with the solubilizing group than without the solubilizing group. R75 and R76 in the general formula (57) independently represent an alkyl group, and R77 and R78 in the general formula (58) independently represent a hydrogen atom, an unsubstituted or substituted aromatic group, a methyl group, or a silyl group.

In the above embodiment, the moiety of the general formula (10) is selected from those represented by the general formulae (12) to (14). The moiety of the general formula (10) is not limited thereto, and may be selected from those represented by the following general formulae (59) to (61).

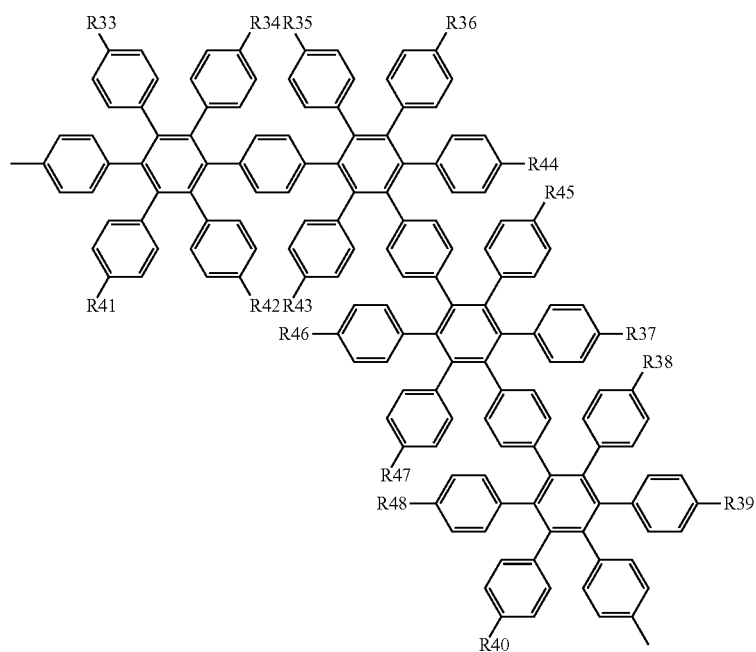
(59)
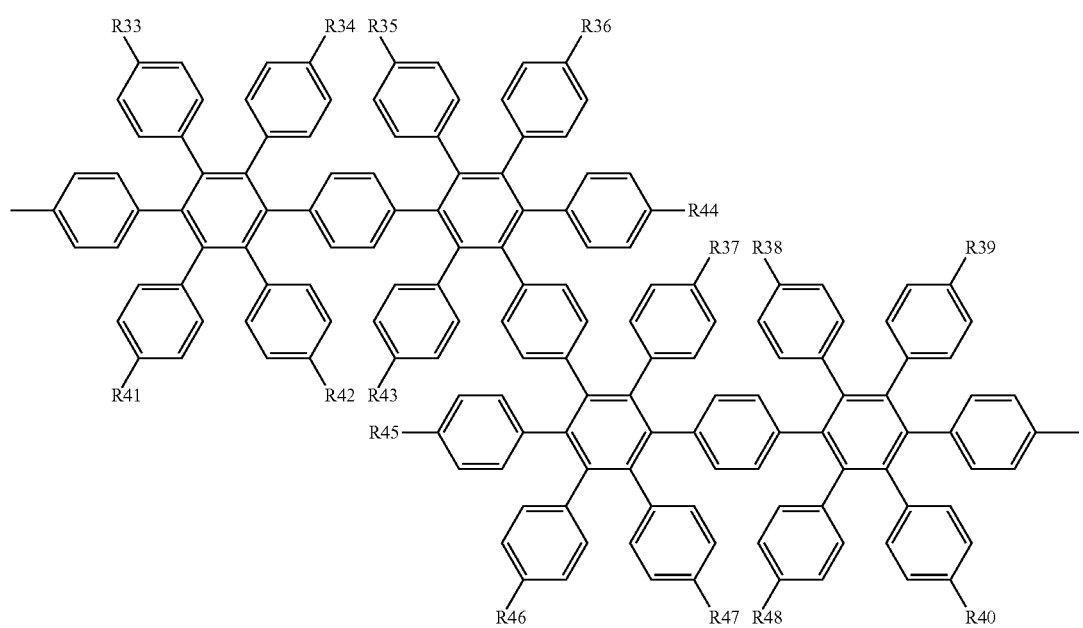
(60)

(61)

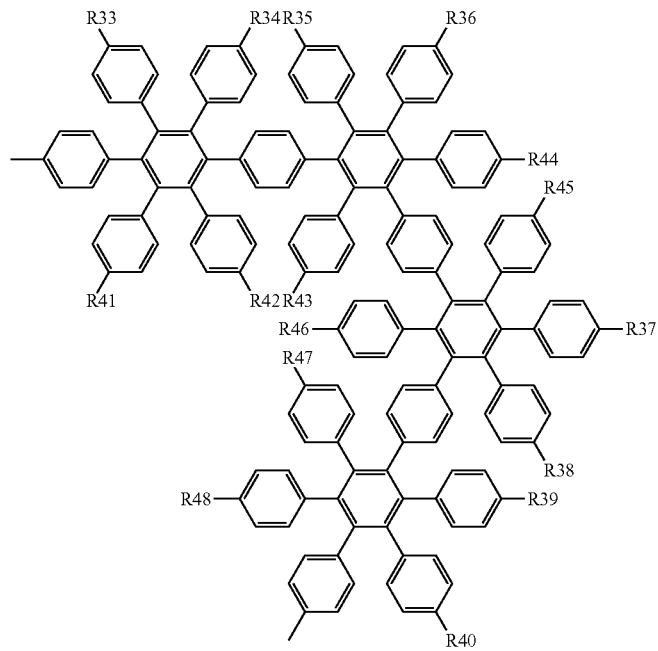

R33 to R48 in the general formulae (59) to (61) independently represent a hydrogen atom or a solubilizing group, and the moiety represented by one of the general formulae (59) to (61) exhibits a higher solubility in an organic solvent with the solubilizing group than without the solubilizing group.

The moieties represented by the general formulae (59) to (61) are isomers of the moieties represented by the general formulae (12) to (14). Therefore, also the polyphenylene having the moiety represented by the general formulae (59) to (61) can be prepared in the same manner as the polyphenylene having the moiety represented by the general formulae (12) to (14).

In a case where the polyphenylene having the moiety represented by one of the general formulae (59) to (61) is further reacted, for example, the resultant nanographene polymer may have a structural unit selected from nanographenes represented by the following general formulae (62) to (64).

(62)

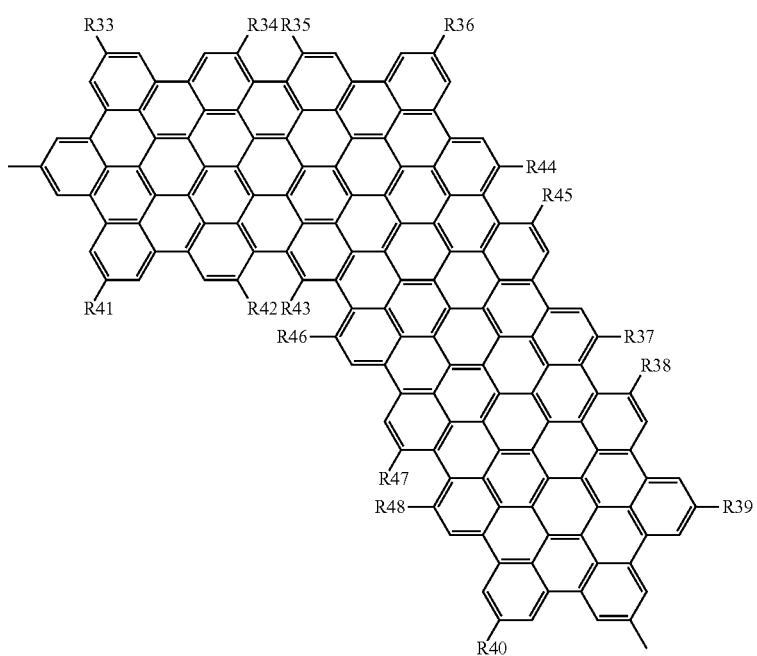

-continued

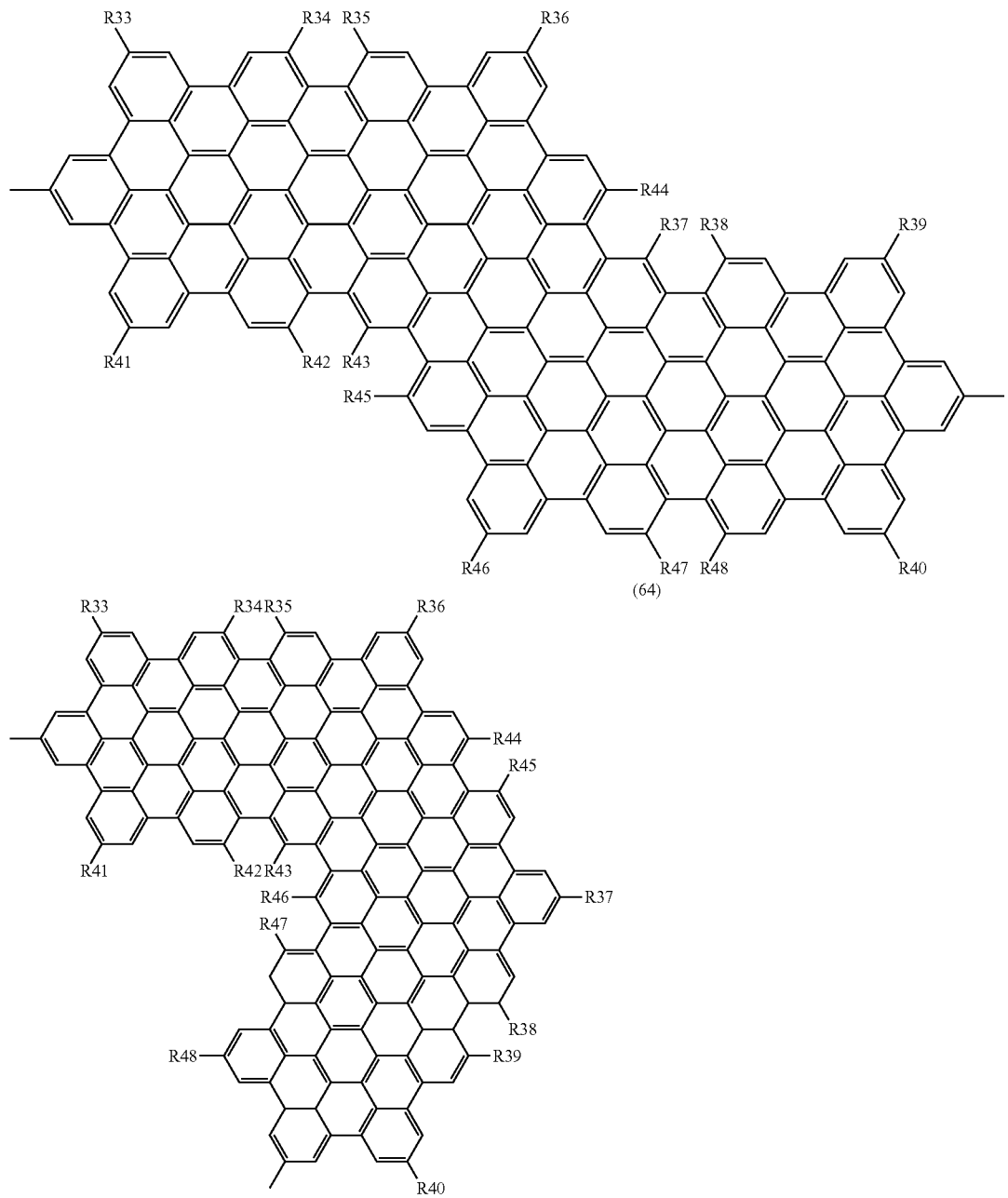

(63)

(64)

R33 to R48 in the general formulae (62) to (64) independently represent a hydrogen atom or a solubilizing group, and the moiety represented by one of the general formulae (62) to (64) exhibits a higher solubility in an organic solvent with the solubilizing group than without the solubilizing group.

The above embodiment is described with relation to the BHJ solar cell 10 having the photoelectric conversion layer 16 containing the mixture of the donor and the acceptor. However, the nanographene polymer (photoelectric conversion material) may be used in a planar heterojunction-type organic photovoltaic cell having a donor layer and an acceptor layer formed separately from each other. In this case, the nanographene polymer may be contained in the donor layer.

In the above embodiment, the nanographene polymer is used as the donor in the organic photovoltaic cell. The present invention is not particularly limited thereto, and the nanographene polymer may be used as the acceptor in the organic photovoltaic cell.

Furthermore, the use of the nanographene polymer is not limited to the use in the photoelectric conversion layer 16 in the organic photovoltaic cell. For example, the nanographene polymer may be used in an optical sensor.

Example 1

A BHJ solar cell was produced using the nanographene polymer (a) as a donor and a PCBM as an acceptor in a photoelectric conversion layer.

Specifically, first, a glass substrate having a patterned ITO electrode was washed and fixed to a spin coater. Then, an aqueous PEDOT:PSS dispersion liquid was dropped onto the substrate, and the substrate was rotated at 4,000 rpm. As a result, a hole transport layer having a thickness of about 40 nm was formed.

Meanwhile, 4 mg of the nanographene polymer (a) having the structural unit shown in FIG. 3 and 16 mg of PCBM were dissolved in 1.0 ml of orthodichlorobenzene to prepare a mixture solution.

The substrate fixed to the spin coater was placed in a glove box, the mixture solution was dropped onto the hole transport layer, and the substrate was rotated at 1,000 rpm. As a result, a photoelectric conversion layer having a thickness of about 40 nm was formed.

The substrate having the hole transport layer and the photoelectric conversion layer was placed in a vacuum deposition apparatus. An electron transport layer containing bathocuproine, lithium fluoride, or the like was deposited on the photoelectric conversion layer, and an aluminum electrode having a thickness of 200 nm was further deposited on the electron transport layer, to produce the BHJ solar cell.

The power generation function of the BHJ solar cell was measured, and the measurement result is shown in FIG. 10. In the measurement, the BHJ solar cell was irradiated with a pseudo sunlight at AM 1.5 G (100 mW/cm$^2$) from a solar simulator equipped with an air mass filter. Specifically, in the BHJ solar cell, a current was measured under the above light irradiation while applying a voltage using a source meter unit (Keithley 2400). The short-circuit current density Isc (mA/cm$^2$), the open circuit voltage Voc (V), the fill factor FF, and the photoelectric power conversion efficiency (%) were obtained from the measurement result.

As shown in FIG. 10, the BHJ solar cell had a short-circuit current density Isc of 3.27 mA/cm$^2$, an open circuit voltage Voc of 0.80 V, a fill factor FF of 0.5, and a photoelectric power conversion efficiency of 1.3%.

As described above, it has been confirmed that the BHJ solar cell using the nanographene polymer (a) of the present embodiment as the donor has a larger open circuit voltage Voc and a satisfactory photoelectric power conversion efficiency. Thus, the power generation function can be desirably improved.

What is claimed is:

1. A photoelectric conversion material that acts as an electron donor for donating an electron or an electron acceptor for accepting an electron, comprising:
a condensed carbocyclic ring polymer obtained by reaction of a polyphenylene prepared by polymerizing monomers represented by the following general formulae (1) and (2):

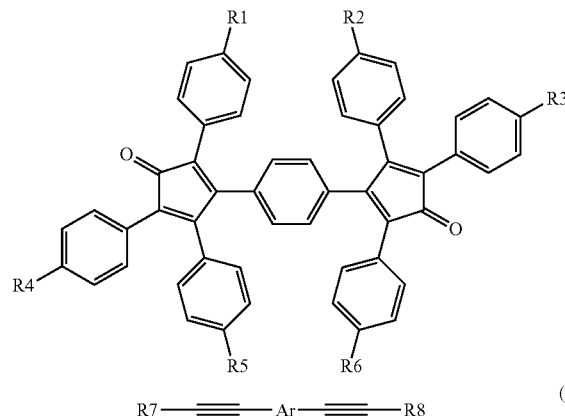

(1)

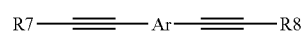

(2)

wherein R1 to R6 in the general formula (1) independently represent a hydrogen atom or a solubilizing group, the monomer represented by the general formula (1) exhibits a higher solubility in an organic solvent with the solubilizing group than without the solubilizing group, Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

2. The photoelectric conversion material according to claim 1, wherein the monomer represented by the general formula (2) is at least one of monomers represented by the following general formulae (3) to (5):

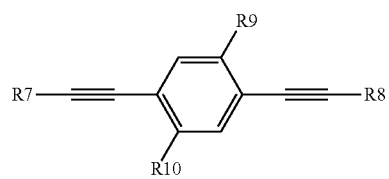

(3)

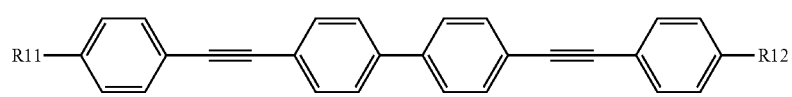

(4)

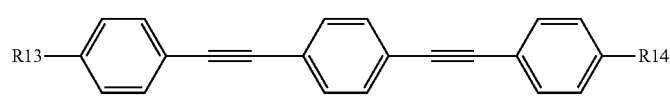

(5)

wherein R9 to R14 in the general formulae (3) to (5) independently represent a hydrogen atom or a solubilizing group, and the monomer represented by the general formulae (3) to (5) exhibits a higher solubility in an organic solvent with the solubilizing group than without the solubilizing group.

3. The photoelectric conversion material according to claim 1, wherein a number of π-electrons in a main chain skeleton of a structural unit of the condensed carbocyclic ring polymer is 60 to 250.

4. The photoelectric conversion material according to claim 1, wherein the polyphenylene has at least one structural unit selected from moieties represented by the following general formulae (6) to (11):

(6)
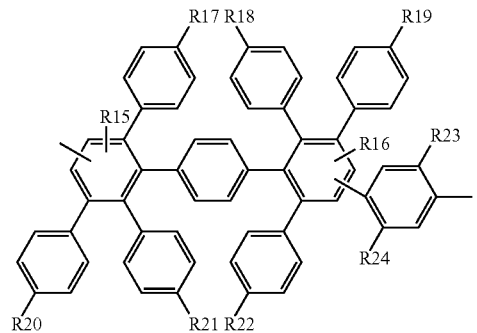

(7)
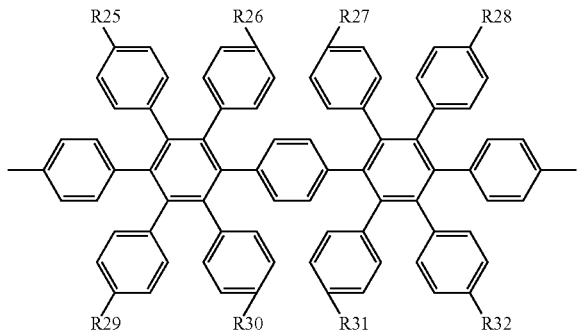

(8)
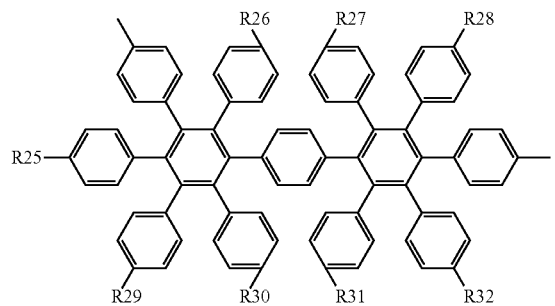

(9)
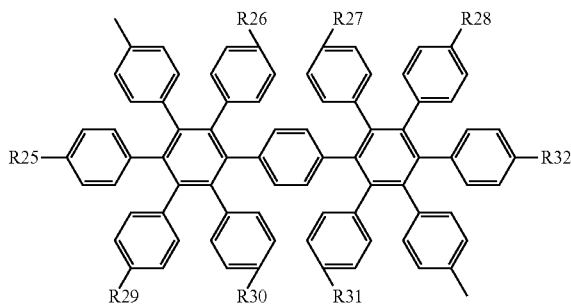

(10)
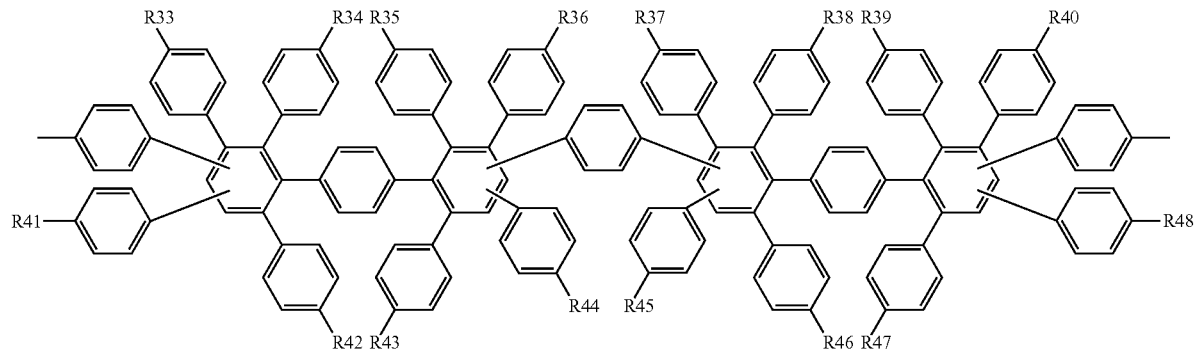

(11)
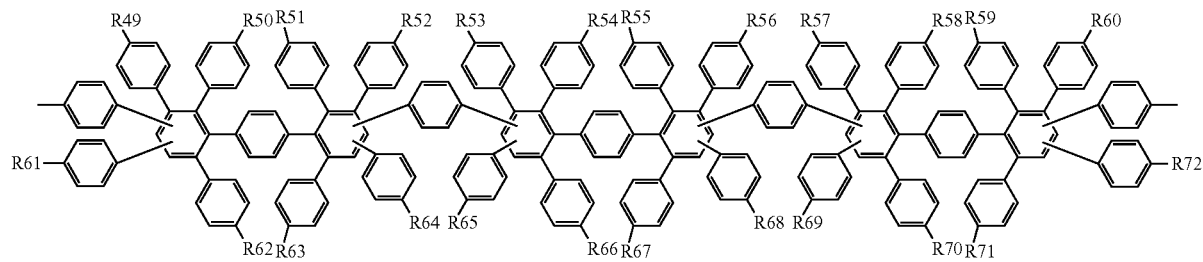

wherein R15 to R72 in the general formulae (6) to (11) independently represent a hydrogen atom or a solubilizing group, and the moiety represented by the general formulae (6) to (11) exhibits a higher solubility in an organic solvent with the solubilizing group than without the solubilizing group.

5. The photoelectric conversion material according to claim 4, wherein the moiety represented by the general formula (10) is at least one of moieties represented by the following general formulae (12) to (14):

wherein R33 to R48 in the general formulae (12) to (14) independently represent a hydrogen atom or a solubilizing group, and the moiety represented by the general formulae (12) to (14) exhibits a higher solubility in an organic solvent with the solubilizing group than without the solubilizing group.

6. The photoelectric conversion material according to claim 4, wherein the moiety represented by the general formula (11) is at least one of moieties represented by the following general formulae (15) to (17):

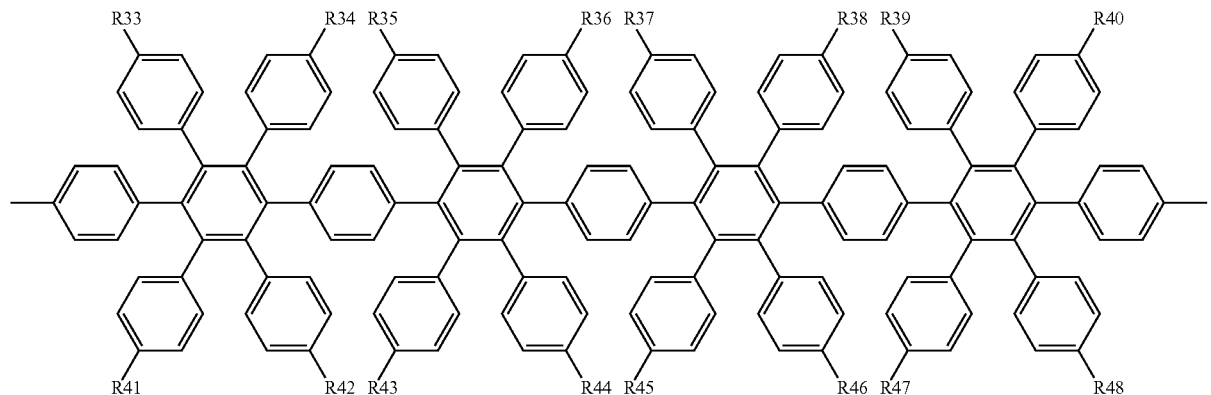

(12)

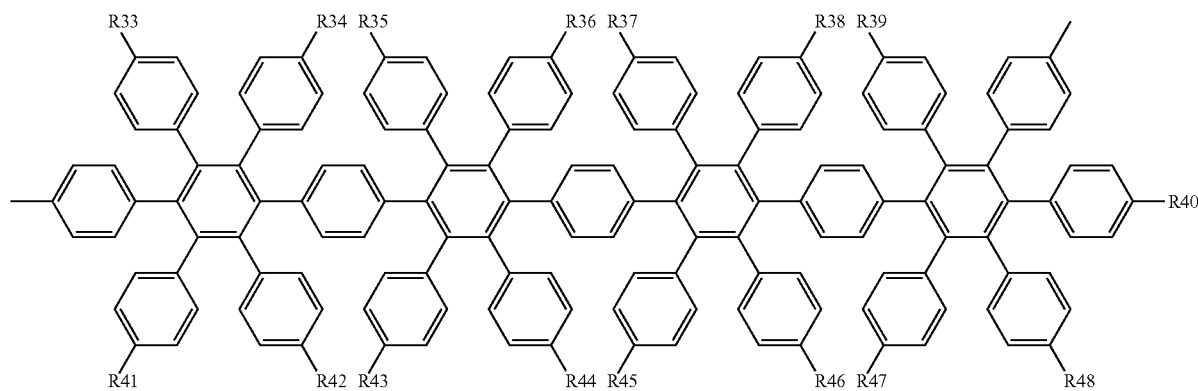

(13)

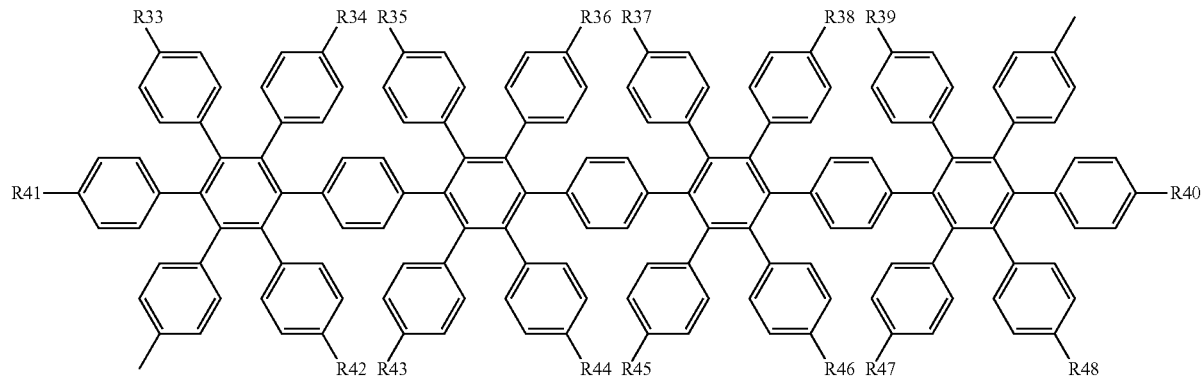

(14)

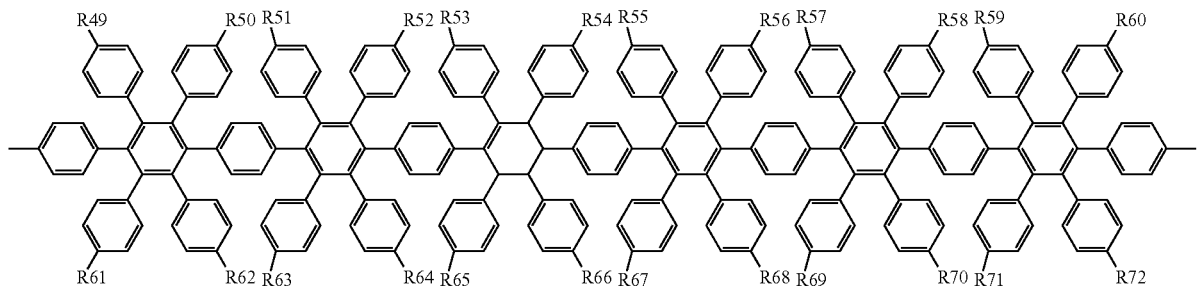

(15)

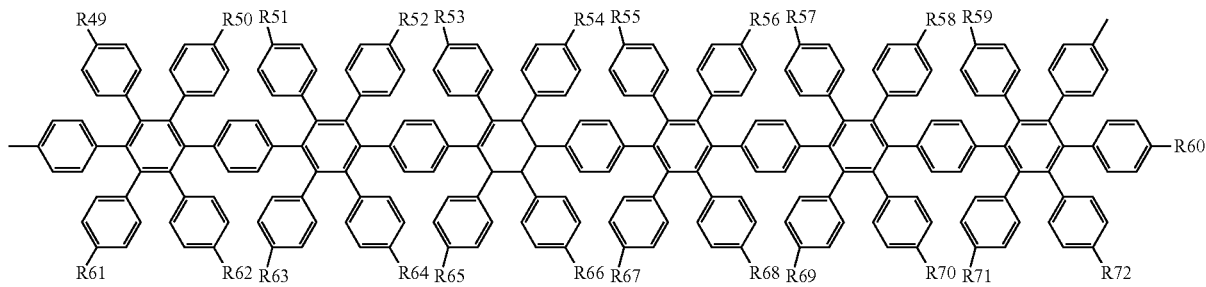

(16)

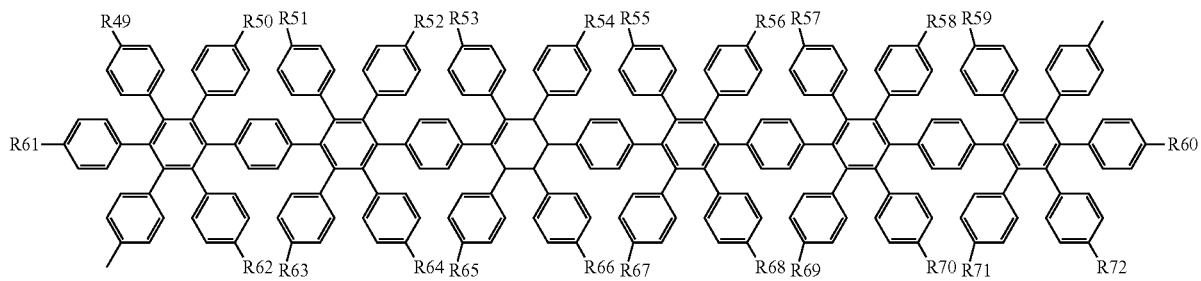

(17)

wherein R49 to R72 in the general formulae (15) to (17) independently represent a hydrogen atom or a solubilizing group, and the moiety represented by the general formulae (15) to (17) exhibits a higher solubility in an organic solvent with the solubilizing group than without the solubilizing group.

7. The photoelectric conversion material according to claim 1, wherein the condensed carbocyclic ring polymer has at least one structural unit selected from graphenes represented by the following general formulae (18) to (31):

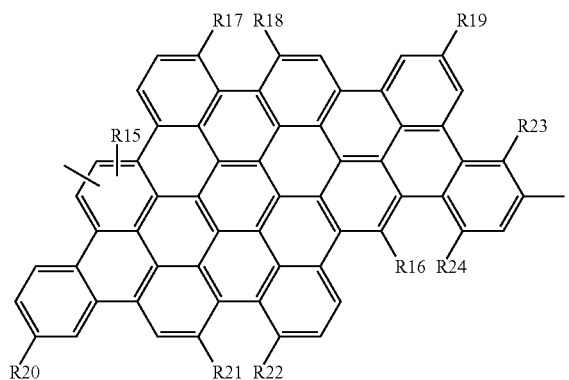

(18)

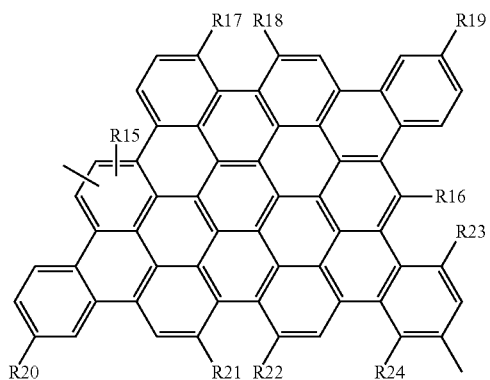

(19)

(20)
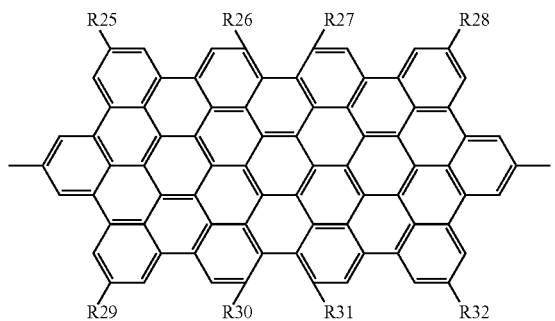
(21)
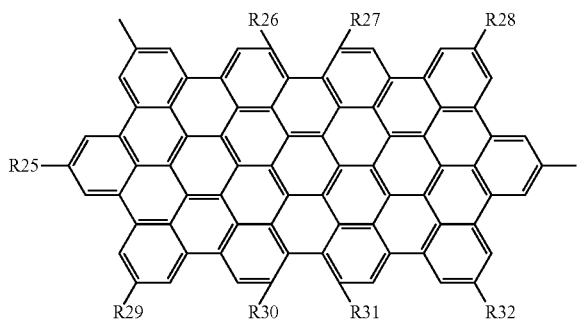
(22)
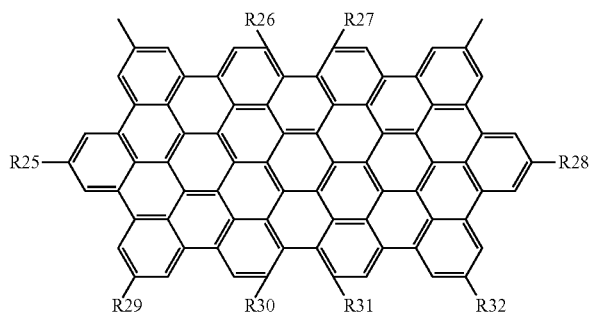
(23)
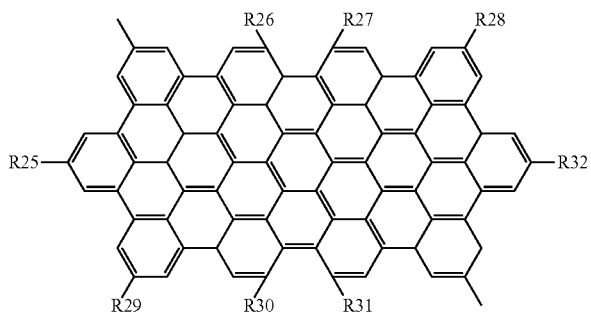
(24)
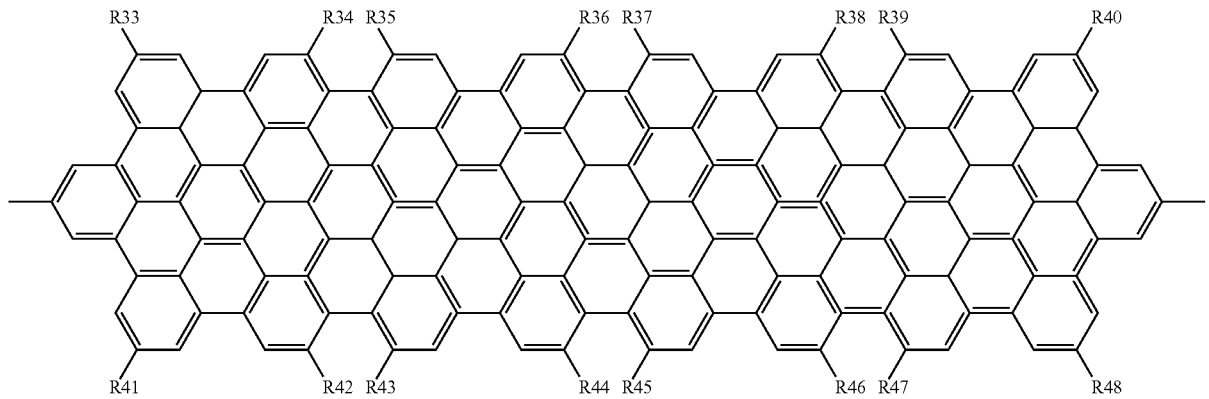
(25)
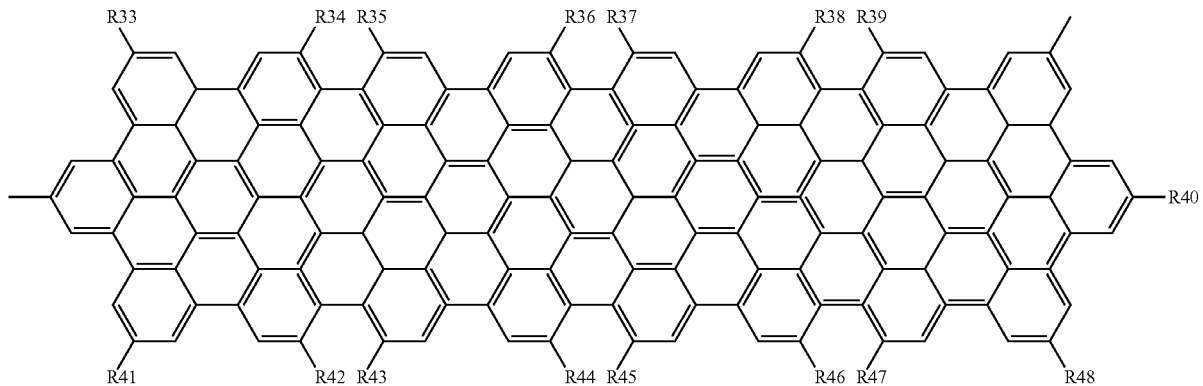

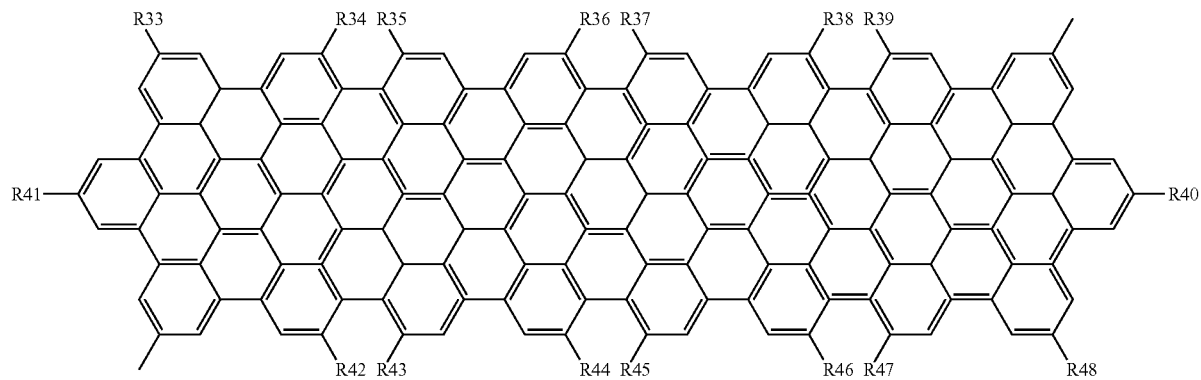
(26)
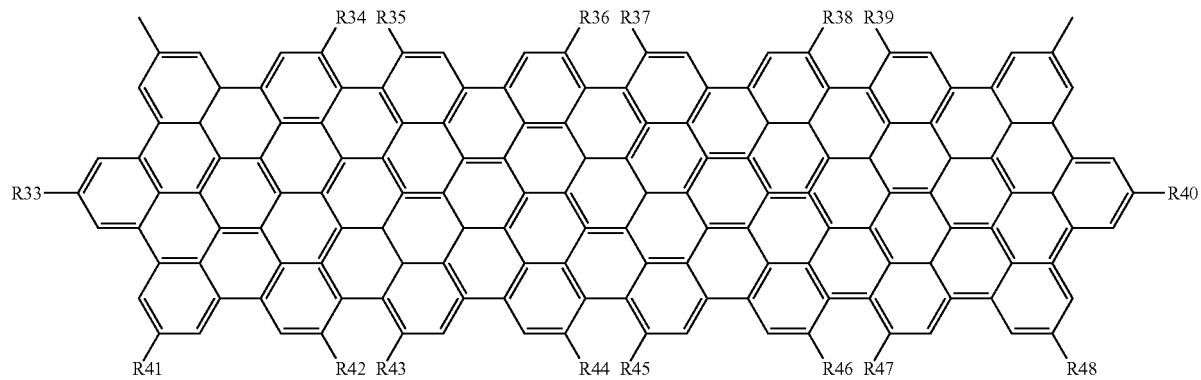
(27)
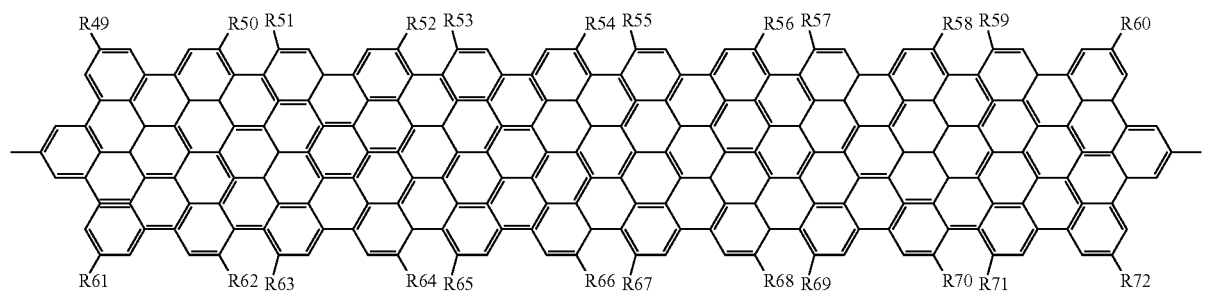
(28)
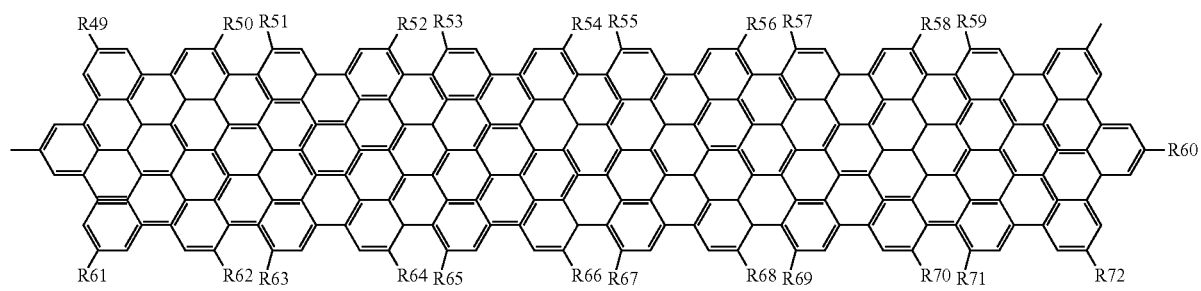
(29)

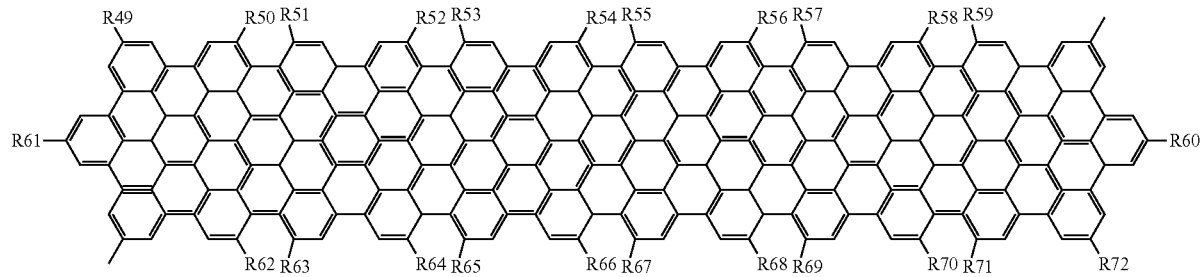

(30)

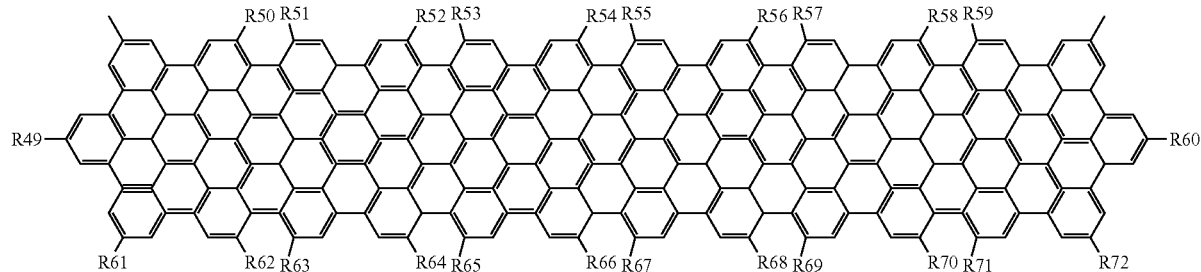

(31)

wherein R15 to R72 in the general formulae (18) to (31) independently represent a hydrogen atom or a solubilizing group, and the graphene represented by the general formulae (18) to (31) exhibits a higher solubility in an organic solvent with the solubilizing group than without the solubilizing group.

8. The photoelectric conversion material according to claim 1, wherein the solubilizing group is at least one of a straight chain alkyl group, a branched alkyl group, a straight chain alkoxy group, and a branched alkoxy group.

9. The photoelectric conversion material according to claim 8, wherein the solubilizing group has 3 to 20 carbon atoms.

10. The photoelectric conversion material according to claim 1, wherein the condensed carbocyclic ring polymer has a polymerization degree of 2 to 150.

11. A method for producing a photoelectric conversion material that acts as an electron donor for donating an electron or an electron acceptor for accepting an electron, comprising:
    polymerizing monomers to prepare a polyphenylene; and
    reacting the polyphenylene to prepare a condensed carbocyclic ring polymer as the photoelectric conversion material,
    the monomers being represented by the following general formulae (1) and (2):

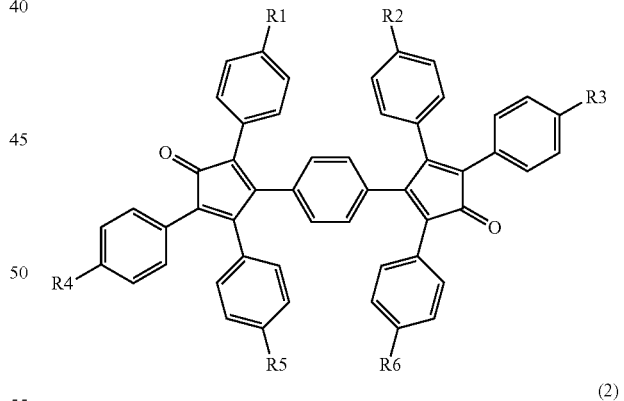

wherein R1 to R6 in the general formula (1) independently represent a hydrogen atom or a solubilizing group, the monomer represented by the general formula (1) exhibits a higher solubility in an organic solvent with the solubilizing group than without the solubilizing group, Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

12. The method according to claim 11, wherein the monomer represented by the general formula (2) is at least one of monomers represented by the following general formulae (3) to (5):

(3)

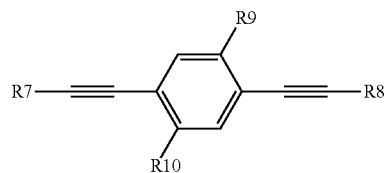

(4)

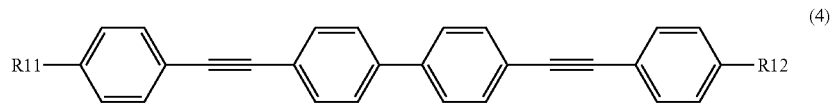

(5)

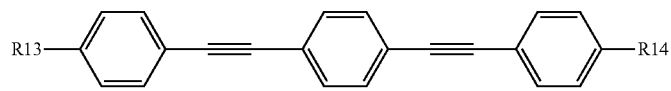

wherein R9 to R14 in the general formulae (3) to (5) independently represent a hydrogen atom or a solubilizing group, and the monomer represented by the general formulae (3) to (5) exhibits a higher solubility in an organic solvent with the solubilizing group than without the solubilizing group.

13. The method according to claim 11, wherein a number of π-electrons in a main chain skeleton of a structural unit of the condensed carbocyclic ring polymer is 60 to 250.

14. The method according to claim 11, wherein the polyphenylene has at least one structural unit selected from moieties represented by the following general formulae (6) to (11):

(6)

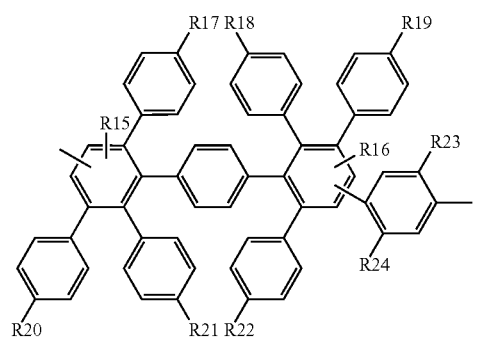

(7)

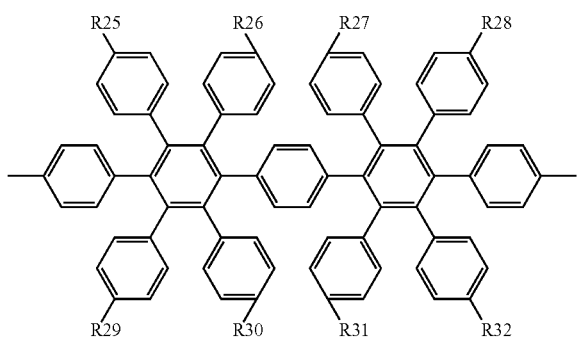

(8)

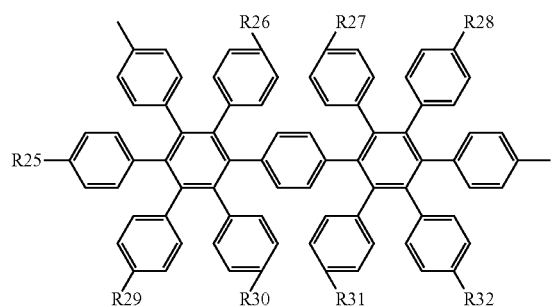

(9)

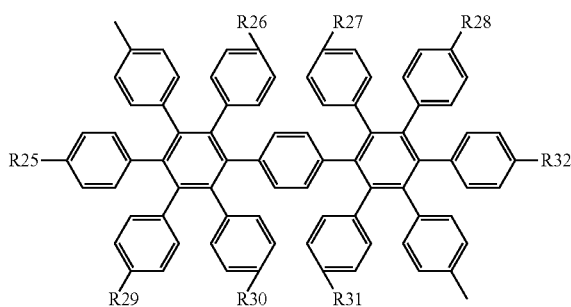

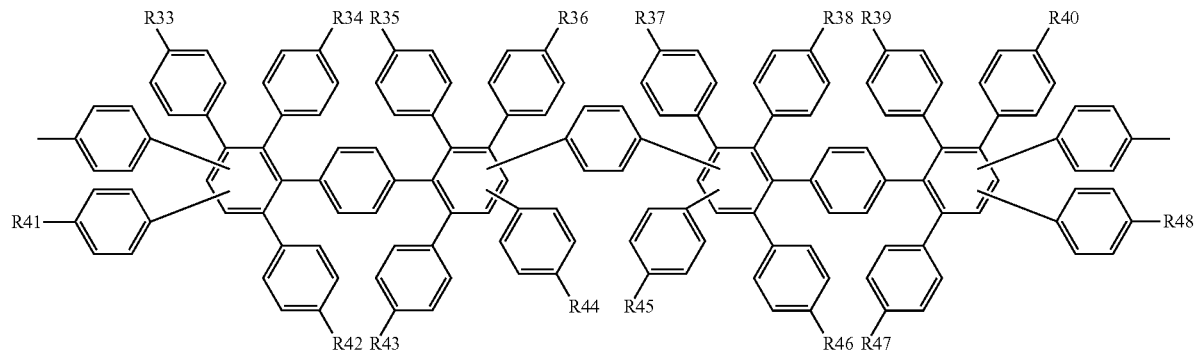

(10)

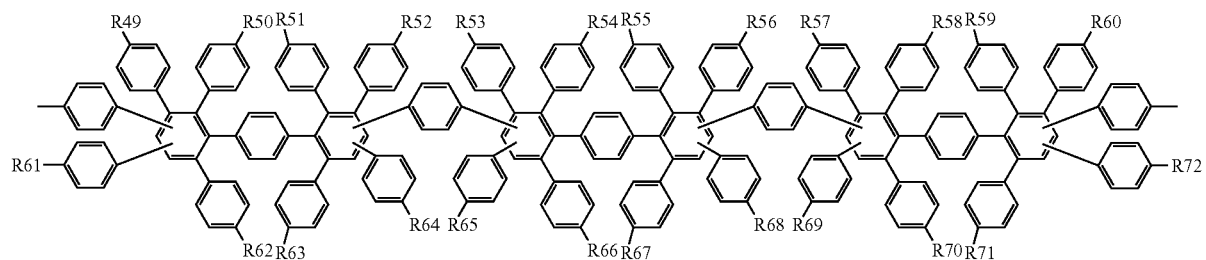

(11)

wherein R15 to R72 in the general formulae (6) to (11) independently represent a hydrogen atom or a solubilizing group, and the moiety represented by the general formulae (6) to (11) exhibits a higher solubility in an organic solvent with the solubilizing group than without the solubilizing group.

15. The method according to claim 14, wherein the moiety represented by the general formula (10) is at least one of moieties represented by the following general formulae (12) to (14):

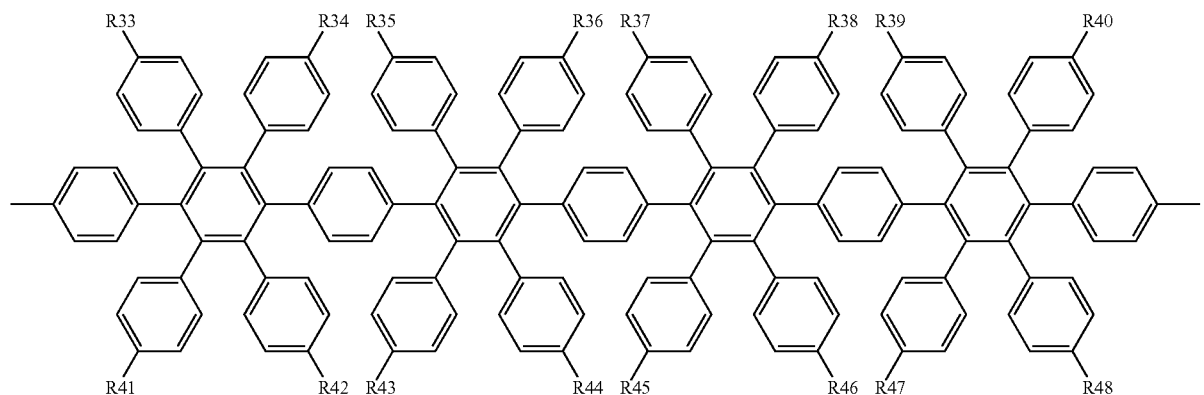

(12)

(13)

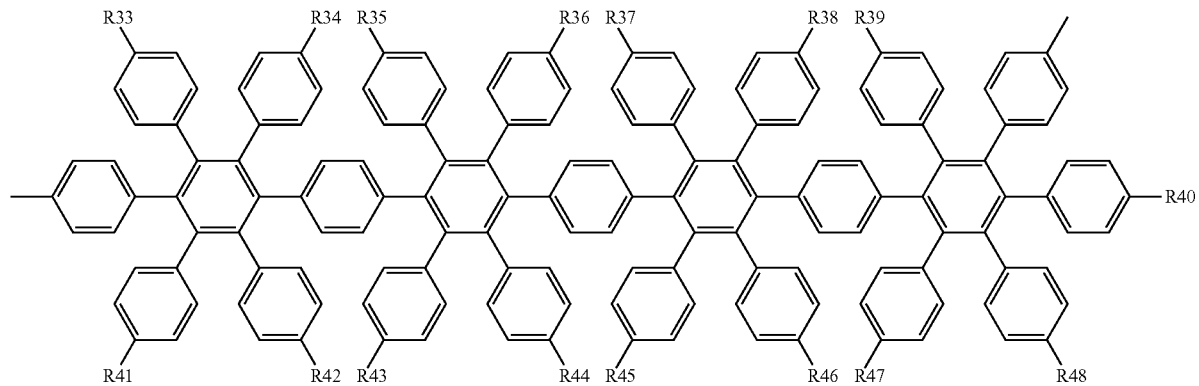

(14)

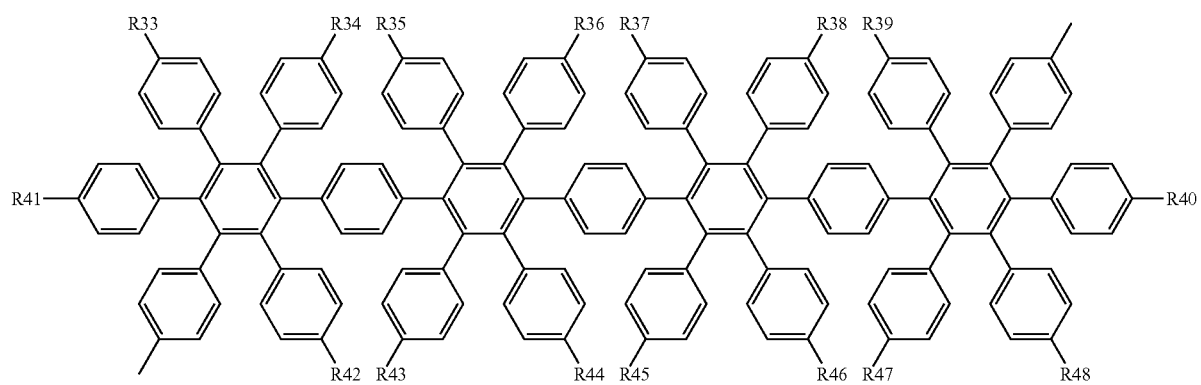

wherein R33 to R48 in the general formulae (12) to (14) independently represent a hydrogen atom or a solubilizing group, and the moiety represented by the general formulae (12) to (14) exhibits a higher solubility in an organic solvent with the solubilizing group than without the solubilizing group.

16. The method according to claim 14, wherein the moiety represented by the general formula (11) is at least one of moieties represented by the following general formulae (15) to (17):

(15)

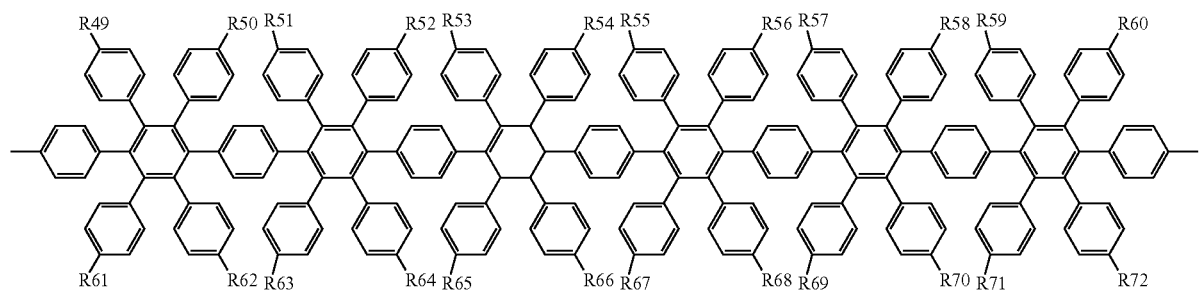

(16)

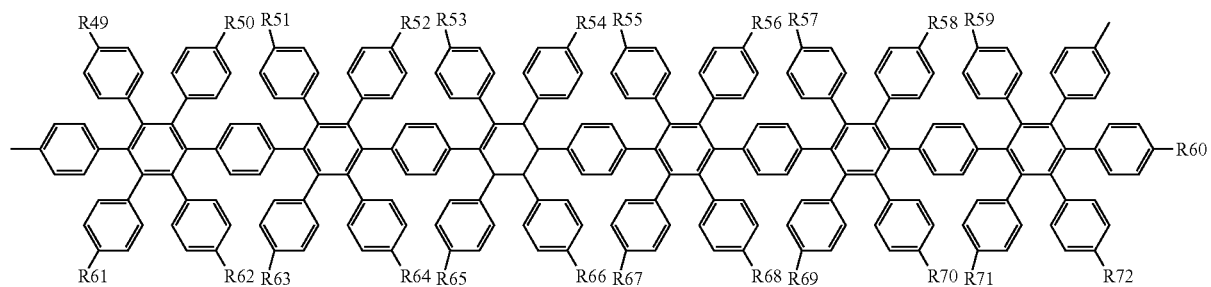

-continued (17)

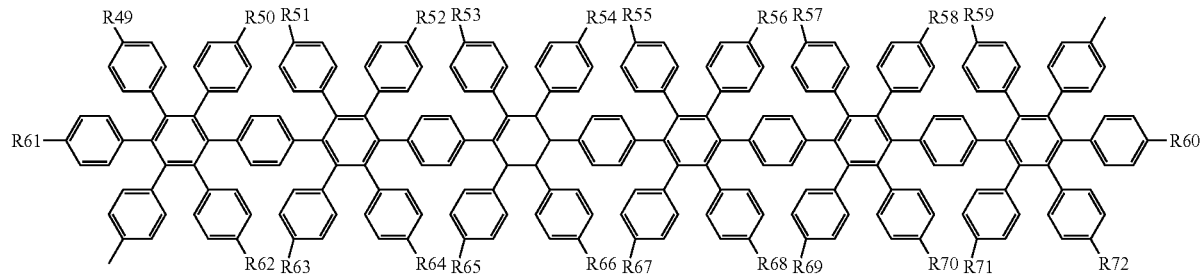

wherein R49 to R72 in the general formulae (15) to (17) independently represent a hydrogen atom or a solubilizing group, and the moiety represented by the general formulae (15) to (17) exhibits a higher solubility in an organic solvent with the solubilizing group than without the solubilizing group.

17. The method according to claim 11, wherein the condensed carbocyclic ring polymer has at least one structural unit selected from graphenes represented by the following general formulae (18) to (31):

(18)

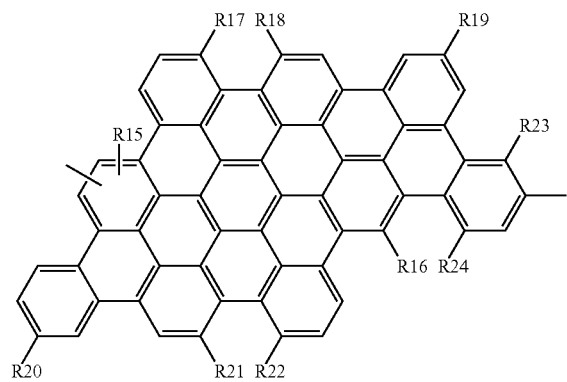

(19)

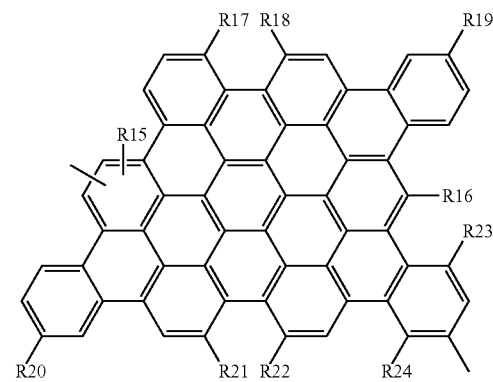

(20)

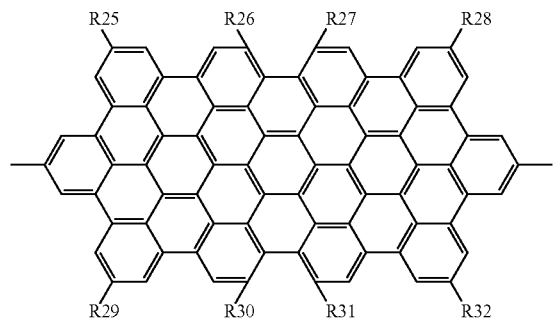

(21)

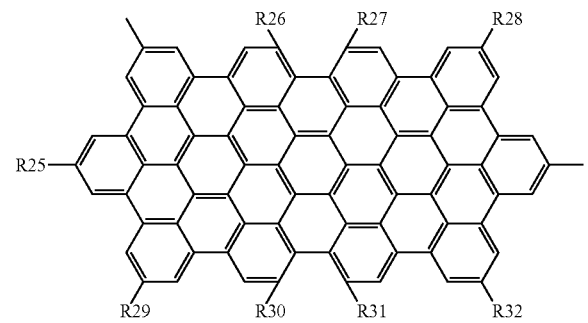

(22)

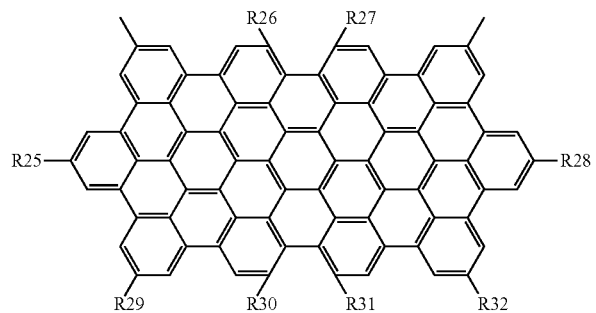

(23)

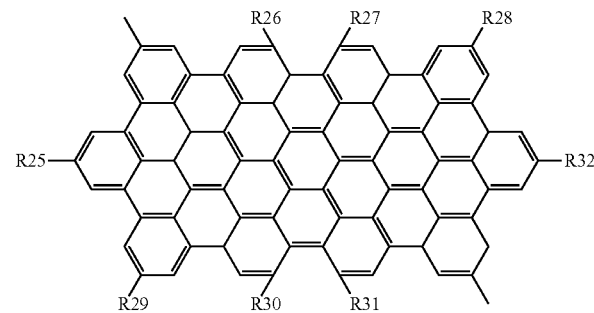

-continued
(24)
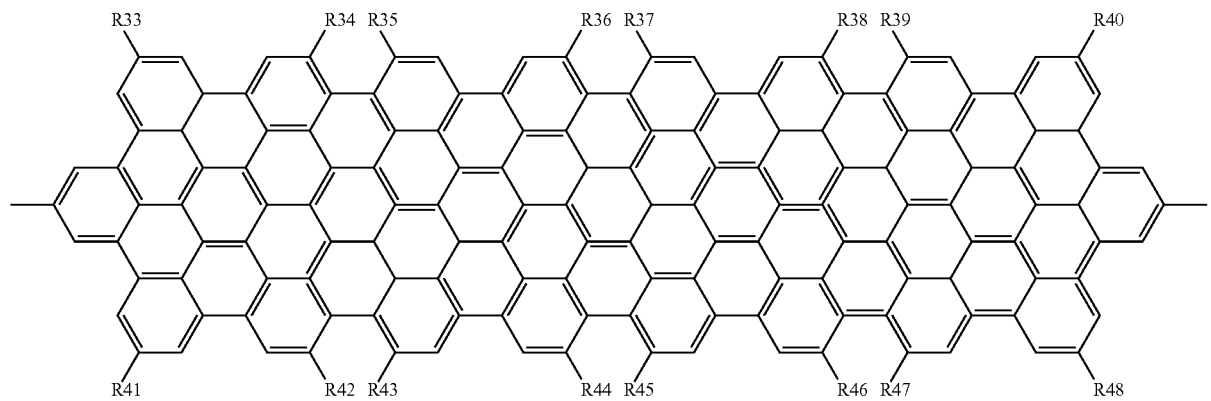
(25)
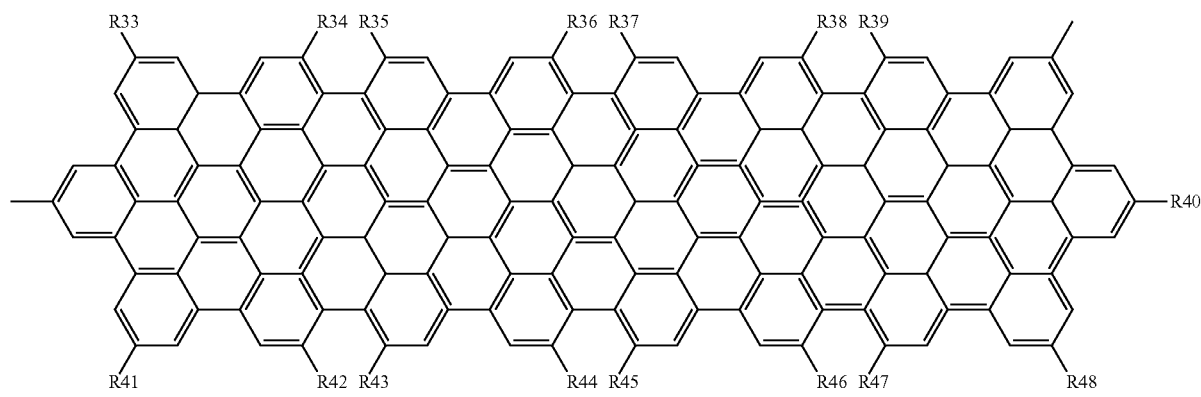
(26)
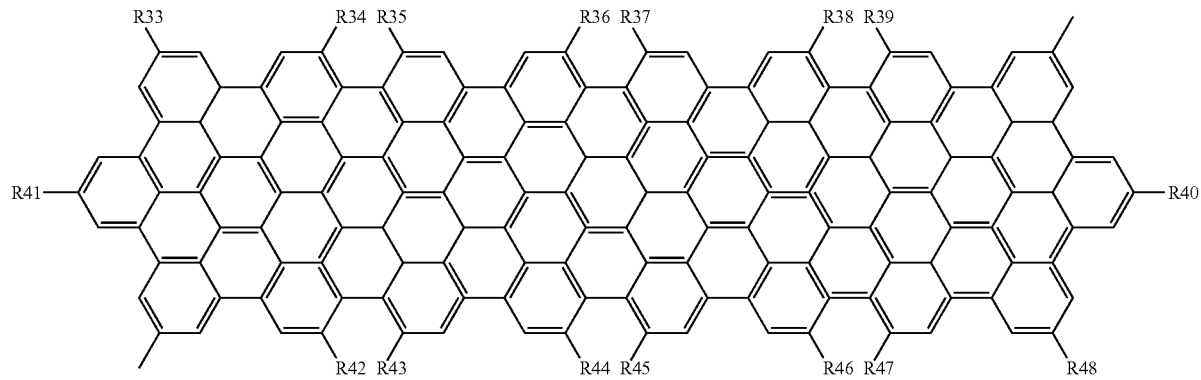
(27)
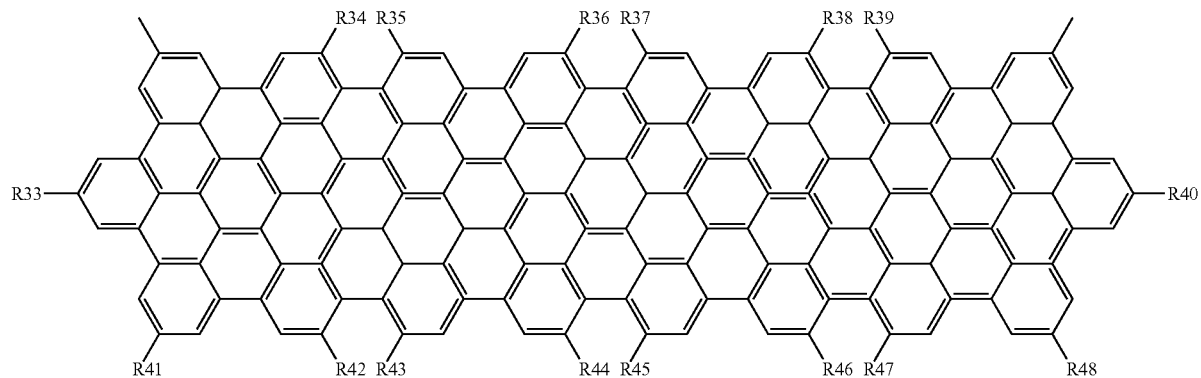

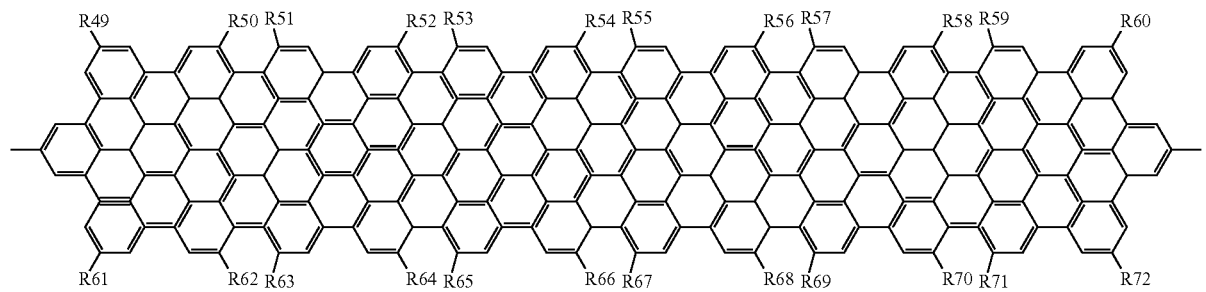

(28)

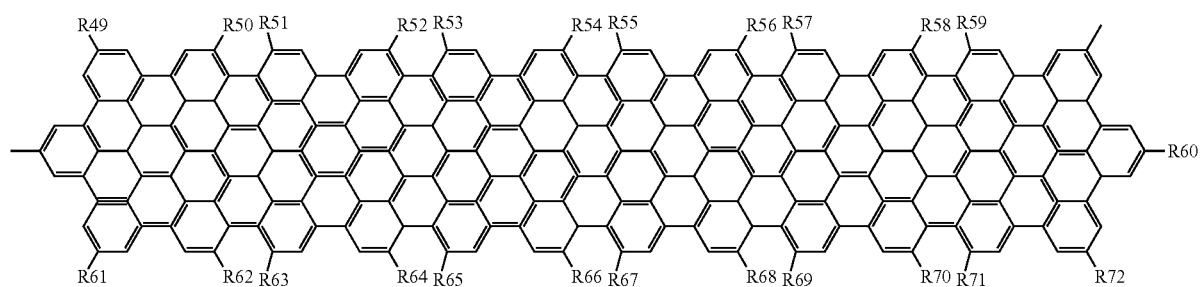

(29)

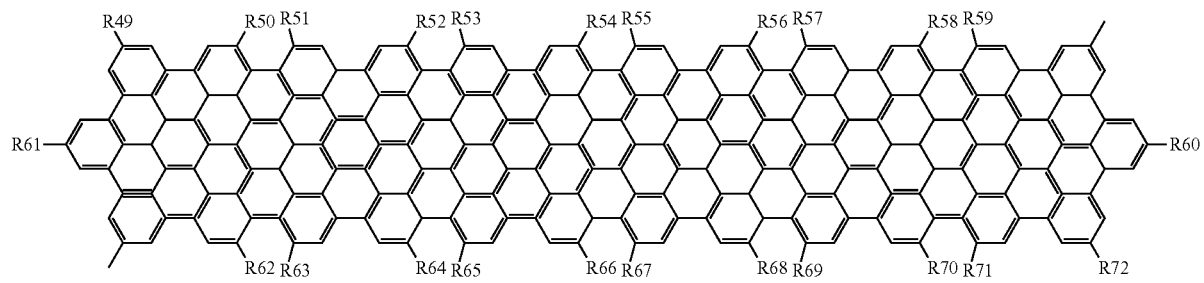

(30)

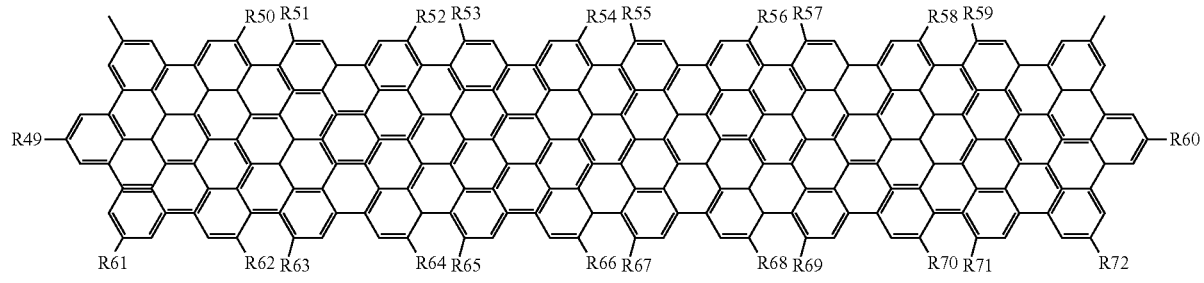

(31)

wherein R15 to R72 in the general formulae (18) to (31) independently represent a hydrogen atom or a solubilizing group, and the graphene represented by the general formulae (18) to (31) exhibits a higher solubility in an organic solvent with the solubilizing group than without the solubilizing group.

18. The method according to claim 11, wherein the solubilizing group is at least one of a straight chain alkyl group, a branched alkyl group, a straight chain alkoxy group, and a branched alkoxy group.

19. The method according to claim 18, wherein the solubilizing group has 3 to 20 carbon atoms.

20. An organic photovoltaic cell comprising a photoelectric conversion material that acts as an electron donor for donating an electron or an electron acceptor for accepting an electron, wherein the organic photovoltaic cell has a photoelectric conversion layer, and the photoelectric conversion layer contains, as an electron donor, the photoelectric conversion material containing a condensed carbocyclic ring polymer obtained by reaction of a polyphenylene prepared by polymerizing monomers represented by the following general formulae (1) and (2):

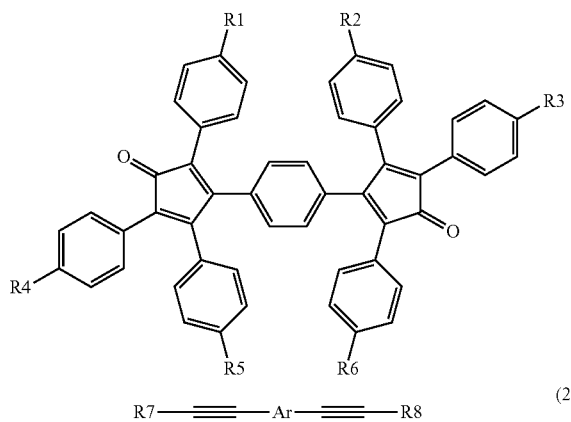

(1)

(2)

wherein R1 to R6 in the general formula (1) independently represent a hydrogen atom or a solubilizing group, the monomer represented by the general formula (1) exhibits a higher solubility in an organic solvent with the solubilizing group than without the solubilizing group, Ar in the general formula (2) represents an unsubstituted or substituted aromatic group, and R7 and R8 in the general formula (2) independently represent a hydrogen atom, an unsubstituted or substituted aromatic group, a methyl group, or a silyl group.

21. The organic photovoltaic cell according to claim 20, including a bulk heterojunction structure containing the photoelectric conversion layer wherein
  the photoelectric conversion layer contains a mixture of the electron donor and an electron acceptor for accepting an electron released from the electron donor.

* * * * *